(12) United States Patent
Miyairi et al.

(10) Patent No.: US 7,790,483 B2
(45) Date of Patent: Sep. 7, 2010

(54) THIN FILM TRANSISTOR AND MANUFACTURING METHOD THEREOF, AND DISPLAY DEVICE AND MANUFACTURING METHOD THEREOF

(75) Inventors: Hidekazu Miyairi, Kanagawa (JP); Ryu Komatsu, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/473,776

(22) Filed: May 28, 2009

(65) Prior Publication Data

US 2009/0311809 A1    Dec. 17, 2009

(30) Foreign Application Priority Data

Jun. 17, 2008  (JP) .............................. 2008-157765

(51) Int. Cl.
*H01L 21/00* (2006.01)
(52) U.S. Cl. .............................. 438/22; 438/29; 438/38; 438/5; 438/151; 438/158; 257/E21.411; 257/E21.414; 257/E33.053
(58) Field of Classification Search .................. 438/22, 438/29, 38, 45, 151, 158; 257/E21.411, E21.414, 257/E33.053
See application file for complete search history.

(56) References Cited

U.S. PATENT DOCUMENTS

| | | | |
|---|---|---|---|
| 4,409,134 A | 10/1983 | Yamazaki | |
| 6,008,065 A | 12/1999 | Lee et al. | |
| 6,485,997 B2 | 11/2002 | Lee et al. | |
| 6,493,048 B1 | 12/2002 | Baek et al. | |
| 6,635,581 B2 * | 10/2003 | Wong | ......................... 438/736 |
| 7,116,384 B2 * | 10/2006 | Chen | ........................... 349/47 |
| 7,223,643 B2 | 5/2007 | Ohnuma et al. | |
| 2001/0049064 A1 * | 12/2001 | Lee et al. | ........................ 430/5 |
| 2002/0125477 A1 * | 9/2002 | So et al. | ........................ 257/59 |

(Continued)

FOREIGN PATENT DOCUMENTS

JP          64-084669          3/1989

(Continued)

OTHER PUBLICATIONS

International Search Report (PCT Application No. PCT/JP2008/071746) dated Dec. 22, 2008, 2 Pages.

(Continued)

*Primary Examiner*—Alexander G Ghyka
*Assistant Examiner*—Leonard Chang
(74) *Attorney, Agent, or Firm*—Fish & Richardson P.C.

(57) ABSTRACT

To provide a manufacturing method of a thin film transistor and a display device with fewer masks than a conventional method. A thin film transistor is manufactured by including the steps of: forming a first conductive film, an insulating film, a semiconductor film, an impurity semiconductor film, and a second conductive film to be stacked; forming a resist mask including three regions with different thicknesses; performing first etching to form a thin-film stack body; performing second etching in which side-etching is performed on the thin-film stack body to form a gate electrode layer; and recessing the resist mask to form a semiconductor layer and a source and drain electrode layer. A resist mask including three regions with different thicknesses can be formed using a four-tone photomask, for example.

19 Claims, 53 Drawing Sheets

U.S. PATENT DOCUMENTS

| | | |
|---|---|---|
| 2006/0290867 A1 | 12/2006 | Ahn et al. |
| 2007/0002249 A1 | 1/2007 | Yoo et al. |
| 2007/0126969 A1* | 6/2007 | Kimura et al. .............. 349/141 |
| 2007/0139571 A1 | 6/2007 | Kimura |
| 2007/0146591 A1 | 6/2007 | Kimura et al. |
| 2007/0222936 A1 | 9/2007 | Shih |

FOREIGN PATENT DOCUMENTS

| | | |
|---|---|---|
| JP | 03-011744 | 1/1991 |
| JP | 03-161938 | 7/1991 |
| JP | 07-307477 | 11/1995 |
| JP | 2000-307118 | 11/2000 |
| JP | 2003-179069 | 6/2003 |
| JP | 2007-133371 | 5/2007 |
| JP | 2007-249198 | 9/2007 |
| WO | WO 2008/099528 A1 | 8/2008 |

OTHER PUBLICATIONS

Written Opinion (PCT Application No. PCT/JP2008/071746) dated Dec. 22, 2008, 4 Pages.

Kim et al., "A Novel Four-Mask-Count Process Architecture for TFT-LCDS,", *SID Digest '00 : SID International Symposium Digest of Technical Papers*, 2000, pp. 1006-1009; 2000.

* cited by examiner 171
 172
 173

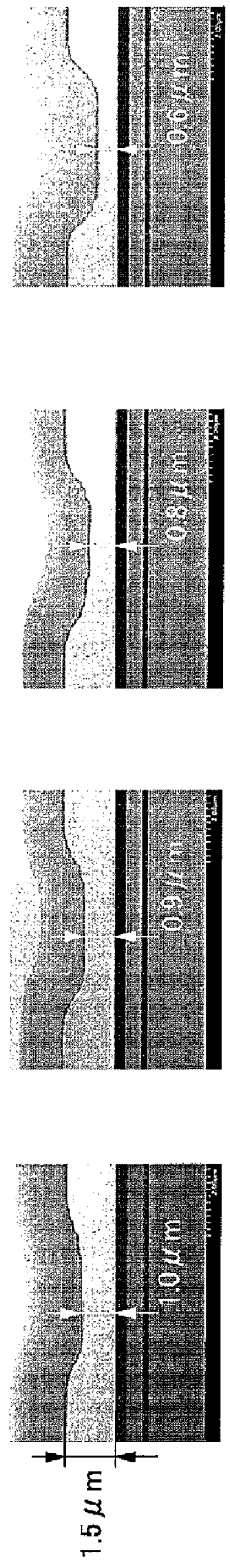

THIN FILM TRANSISTOR AND MANUFACTURING METHOD THEREOF, AND DISPLAY DEVICE AND MANUFACTURING METHOD THEREOF

BACKGROUND OF THE INVENTION

1. Field of the Invention

The present invention relates to a thin film transistor and a manufacturing method thereof, and a display device including the thin film transistor and a manufacturing method thereof.

2. Description of the Related Art

In recent years, thin film transistors that are formed using a semiconductor thin film having a thickness of several nanometers to several hundreds of nanometers over a substrate having an insulating surface such as a glass substrate have been attracting attentions. Thin film transistors are widely used for electronic devices such as ICs (integrated circuits) and electro-optical devices. In particular, thin film transistors are urgently developed as switching elements of image display devices typified by liquid crystal display devices, EL (electro luminescence) display devices, and the like. In an active matrix liquid crystal display device, specifically, voltage is applied to a pixel electrode connected to a selected switching element and an opposite electrode corresponding to the pixel electrode, and thus, a liquid crystal layer disposed between the pixel electrode and the opposite electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements. An active matrix EL display device here means an EL display device which employs a method in which a display pattern is formed on a screen by driving pixels arranged in matrix using switching elements.

The application range of the active matrix display devices is expanding, and demands for larger screen size, higher definition, and higher aperture ratio are increasing. In addition, it is demanded that the active matrix display device has high reliability and that a production method of the active matrix display device offers high yield and reduces production cost. As a method for increasing productivity and reducing production cost, simplification of the process can be given.

In an active matrix display device, thin film transistors are mainly used as switching elements. In manufacturing thin film transistors, reduction in the number of photomasks used in photolithography is important for simplification of the process. If one photomask is added, the following steps are further needed: resist application, prebaking, light exposure, development, postbaking, and the like, and moreover other steps before and after the aforementioned steps, such as film formation and etching and further resist removal, cleaning, drying, and the like. The number of steps is significantly increased only by adding one photomask in the manufacturing process. Therefore, many techniques for reducing the number of photomasks in a manufacturing process have been developed.

Thin film transistors are broadly classified into top gate thin film transistors in each of which a channel formation region is provided below a gate electrode and bottom gate thin film transistors in each of which a channel formation region is provided above a gate electrode. It is known that the number of photomasks used in a manufacturing process of a bottom gate thin film transistor is smaller than that in a manufacturing process of a top gate thin film transistor. A bottom gate thin film transistor is generally manufactured using three photomasks.

Many conventional techniques for reducing the number of photomasks use a complicated technique such as backside light exposure, resist reflow, or a lift-off method, which requires a special apparatus. Using such complicated techniques may cause various problems, which leads to reduction in yield. Moreover, there has often been no option but to sacrifice electric characteristics of thin film transistors.

As typical means for reducing the number of photomasks in a manufacturing process of a thin film transistor, a technique using a multi-tone mask (called a half-tone mask or a gray-tone mask) is widely known. As a technique for reducing the number of steps for manufacturing a thin film transistor by using a multi-tone mask, Patent Document 1 is, for example, disclosed.

As a multi-tone mask which is currently in practical use, a three-tone mask is generally used; however, a four-tone mask has also been developed (for example, see Patent Document 2). PS [Citation List]

[Patent Document]
[Patent Document 1] Japanese Published Patent Application No. 2003-179069.
[Patent Document 2] Japanese Published Patent Application No. 2007-249198.

SUMMARY OF THE INVENTION

However, even in the case where a bottom gate thin film transistor is manufactured using the above-described multi-tone mask, at least two photomasks are required and it is difficult to further reduce the number of photomasks. Among them, one photomask is used to pattern a gate electrode layer.

In view of the above problems, an embodiment of the present invention is to provide a novel manufacturing method of a thin film transistor which requires no additional photomask for patterning a gate electrode layer. That is, a manufacturing method is disclosed, which enables the manufacture of a thin film transistor without a complicated technique even if only one photomask is employed.

This method makes it possible to reduce the number of photomasks in manufacture of a thin film transistor compared with the conventional technique.

Further, an embodiment of the present invention can be particularly applied to a manufacturing method of a thin film transistor which is used in a pixel of a display device (also referred to as a pixel TFT). Therefore, an embodiment of the present invention is to provide a manufacturing method of a display device in which the number of photomasks used in photolithography is reduced than the conventional method without using a complicated technique. Further, an embodiment of the present invention is to provide a thin film transistor with favorable electric characteristics even in the case where the number of photomasks is reduced.

A manufacturing method of a thin film transistor which is an embodiment of the present invention is described. In the manufacturing method of a thin film transistor which is an embodiment of the present invention, first, a first conductive film is formed; a thin-film stack body in which an insulating film, a semiconductor film, an impurity semiconductor film, and a second conductive film are formed to be stacked in this order is formed over the first conductive film; a resist mask including three regions with different thicknesses (from a region with the smallest thickness, referred to as a first region, a second region, and a third region) is formed over the thin-film stack body; at least a surface of the first conductive film is exposed by first etching; the thin-film stack body is patterned; and the first conductive film is patterned by second etching. Then, the first region of the resist mask is made to recede (reduce) to remove the first region of the resist mask and to expose the second conductive film overlapping with the first region. Third etching is performed on the second conductive film which is exposed to remove the insulating film, the semiconductor film, the impurity semiconductor film, and the second conductive film which overlap with the first region. Then, after the third etching, the resist mask is made to recede (reduce) to remove the second region of the resist mask and to expose the second conductive film overlapping with the second region. Fourth etching is performed on the second conductive film which is exposed to remove a part of the semiconductor film, the impurity semiconductor film, and the second conductive film which overlap with the second region. Here, the second etching is performed under such conditions as to selectively side-etch the first conductive film.

Here, as the first etching, either dry etching or wet etching may be employed, and a highly anisotropic etching method (physical etching) is preferably employed. By employing a highly anisotropic etching method as the first etching, processing accuracy of a pattern can be improved. Note that the first etching can be performed by one step when dry etching is employed as the first etching, while the first etching is performed by plural steps when wet etching is employed as the first etching. Therefore, it is preferable to employ dry etching as the first etching.

As the second etching, either dry etching or wet etching may be employed and a highly isotropic etching method (chemical etching) is preferably employed. By employing a highly isotropic etching method (chemical etching) as the second etching, the first conductive film can be side-etched. Therefore, it is preferable to employ wet etching as the second etching.

Here, since the first conductive film is side-etched in the second etching, the first conductive film is receded (reduced) more on the inside than the thin-film stack body which is formed in the first etching by the second etching. Accordingly, a side surface of the first conductive film after the second etching exists more on the inside than a side surface of the thin-film stack body. Furthermore, since the side-etching is performed in the second etching, the distance between the side surface of the first conductive film having the formed pattern and the side surface of the thin-film stack body having the formed pattern is almost uniform.

Note that the "pattern of the first conductive film" means, for example, a top view layout of a metal wiring which forms a gate electrode, a gate wiring, a capacitor electrode, a capacitor wiring, and a power supply line.

As the third etching, a highly anisotropic etching method (physical etching) is preferably employed in a similar manner to the first etching. Further, the third etching may be performed in a similar manner to the first etching. This is because a layer to be etched in the third etching corresponds to the layer to be etched in the first etching. That is, as the third etching, either dry etching or wet etching may be employed. Note that the third etching can be performed by one step when dry etching is employed as the third etching, while the third etching is performed by plural steps when wet etching is employed as the third etching. Therefore, it is preferable to employ dry etching as the third etching.

The fourth etching may also be performed by a highly anisotropic etching method (physical etching) in a similar manner to the first etching or the third etching. The fourth etching may also be performed in a similar manner to the first etching or the third etching. This is because a layer to be etched in the fourth etching corresponds to a part of the layer to be etched in the first etching or the third etching. That is, as the fourth etching, either dry etching or wet etching may be employed. Note that the fourth etching can be performed by one step when dry etching is employed as the fourth etching, while the fourth etching is performed by plural steps when wet etching is employed as the fourth etching. Therefore, it is preferable to employ dry etching as the fourth etching.

An embodiment of the present invention is a manufacturing method of a thin film transistor including the steps of: forming a gate electrode layer using side-etching; and forming a semiconductor layer, an impurity semiconductor layer, and a source and drain electrode layer which are provided over the gate electrode layer using a resist mask which includes three regions with different thicknesses.

An embodiment of the present invention is a manufacturing method of a thin film transistor including the steps of: forming a first conductive film, an insulating film, a semiconductor film, an impurity semiconductor film, and a second conductive film to be stacked in this order; forming a first resist mask including a first region, a second region whose thickness is larger than the thickness of the first region, and a third region whose thickness is larger than the thickness of the second region over the second conductive film; performing first etching on the insulating film, the semiconductor film, the impurity semiconductor film, and the second conductive film using the first resist mask to expose at least a surface of the first conductive film; performing second etching in which side-etching is performed on a part of the first conductive film to form a gate electrode layer; recessing the first resist mask to form a second resist mask exposing the second conductive film which overlaps with the first region of the first resist mask; performing third etching on the insulating film, the semiconductor film, the impurity semiconductor film, and the second conductive film using the second resist mask to remove the insulating film, the semiconductor film, the impurity semiconductor film, and the second conductive film which overlap with the first region; recessing the second resist mask to form a third resist mask exposing the second conductive film which overlaps with the second region of the second resist mask; and performing fourth etching on a part of the semiconductor film, the impurity semiconductor film, and the second conductive film using the third resist mask to remove the part of the semiconductor film, the impurity semiconductor film, and the second conductive film which overlap with the second region, and to form a source and drain electrode layer, a source and drain region, and a semiconductor layer.

An embodiment of the present invention is a manufacturing method of a thin film transistor including the steps of: forming a first conductive film, an insulating film, a semiconductor film, an impurity semiconductor film, and a second conductive film to be stacked in this order; forming a first resist mask including a first region, a second region whose thickness is larger than the thickness of the first region, and a third region whose thickness is larger than the thickness of the second region over the second conductive film; performing first etching on the insulating film, the semiconductor film, the impurity semiconductor film, and the second conductive film using the first resist mask to expose at least a surface of the first conductive film; recessing the first resist mask to form a second resist mask exposing the second conductive film which overlaps with the first region of the first resist mask; performing second etching in which side-etching is performed on a part of the first conductive film to form a gate electrode layer; performing third etching on the insulating film, the semiconductor film, the impurity semiconductor film, and the second conductive film using the second resist mask to remove the insulating film, the semiconductor film, the impurity semiconductor film, and the second conductive film which overlap with the first region; recessing the second resist mask to form a third resist mask exposing the second conductive film which overlaps with the second region of the second resist mask; and performing fourth etching on a part of the semiconductor film, the impurity semiconductor film, and the second conductive film using the third resist mask to remove the part of the semiconductor film, the impurity semiconductor film, and the second conductive film which overlap with the second region, and to form a source and drain electrode layer, a source and drain region, and a semiconductor layer.

In the manufacturing method of a thin film transistor having any of the above-described structures, the first resist mask can be formed using a four-tone photomask. Alternatively, the first resist mask can be formed using a three-tone photomask and a laser.

In the manufacturing method of a thin film transistor having any of the above-described structures, it is preferable that dry etching be employed for the first etching, the third etching, and the fourth etching and wet etching be employed for the second etching.

By employing the manufacturing method of a thin film transistor having any of the above-described structures, an element region is formed by the first etching, and a side surface of the gate electrode layer is made more on the inside than a side surface of the element region by an almost uniform distance by the second etching.

A display device can be manufactured by selectively forming a pixel electrode so as to be connected to the source and drain electrode layer of the thin film transistor which is an embodiment of the present invention.

An embodiment of the present invention is a manufacturing method of a display device including the steps of: forming a first conductive film, a first insulating film, a semiconductor film, an impurity semiconductor film, and a second conductive film to be stacked in this order; forming a first resist mask including a first region, a second region whose thickness is larger than the thickness of the first region, and a third region whose thickness is larger than the thickness of the second region over the second conductive film; performing first etching on the first insulating film, the semiconductor film, the impurity semiconductor film, and the second conductive film using the first resist mask to expose at least a surface of the first conductive film; performing second etching in which side-etching is performed on a part of the first conductive film to form a gate electrode layer; recessing the first resist mask to form a second resist mask exposing the second conductive film which overlaps with the first region of the first resist mask; performing third etching on the first insulating film, the semiconductor film, the impurity semiconductor film, and the second conductive film using the second resist mask to remove the first insulating film, the semiconductor film, the impurity semiconductor film, and the second conductive film which overlap with the first region; recessing the second resist mask to form a third resist mask exposing the second conductive film which overlaps with the second region of the second resist mask; performing fourth etching on a part of the semiconductor film, the impurity semiconductor film, and the second conductive film using the third resist mask to remove the part of the semiconductor film, the impurity semiconductor film, and the second conductive film which overlap with the second region, and to form a source and drain electrode layer, a source and drain region, and a semiconductor layer, and to form a thin film transistor; removing the third resist mask; forming a second insulating film covering the thin film transistor; forming an opening portion in the second insulating film exposing a part of the source and drain electrode layer; and selectively forming a pixel electrode over the opening portion and the second insulating film.

An embodiment of the present invention is a manufacturing method of a display device including the steps of: forming a first conductive film, a first insulating film, a semiconductor film, an impurity semiconductor film, and a second conductive film to be stacked in this order; forming a first resist mask including a first region, a second region whose thickness is larger than the thickness of the first region, and a third region whose thickness is larger than the thickness of the second region over the second conductive film; performing first etching on the first insulating film, the semiconductor film, the impurity semiconductor film, and the second conductive film using the first resist mask to expose at least a surface of the first conductive film; recessing the first resist mask to form a second resist mask exposing the second conductive film which overlaps with the first region of the first resist mask; performing second etching in which side-etching is performed on a part of the first conductive film to form a gate electrode layer; performing third etching on the first insulating film, the semiconductor film, the impurity semiconductor film, and the second conductive film using the second resist mask to remove the first insulating film, the semiconductor film, the impurity semiconductor film, and the second conductive film which overlap with the first region; recessing the second resist mask to form a third resist mask exposing the second conductive film which overlaps with the second region of the second resist mask; performing fourth etching on a part of the semiconductor film, the impurity semiconductor film, and the second conductive film using the third resist mask to remove the part of the semiconductor film, the impurity semiconductor film, and the second conductive film which overlap with the second region, and to form a source and drain electrode layer, a source and drain region, and a semiconductor layer, and to form a thin film transistor; removing the third resist mask; forming a second insulating film covering the thin film transistor; forming an opening portion in the second insulating film exposing a part of the source and drain electrode layer; and selectively forming a pixel electrode over the opening portion and the second insulating film.

In the manufacturing method of a display device having any of the above-described structures, the first resist mask can be formed using a four-tone photomask. Alternatively, the first resist mask can be formed using a three-tone photomask and a laser.

In the manufacturing method of a display device having any of the above-described structures, it is preferable that dry etching be employed for the first etching, the third etching, and the fourth etching and wet etching be employed for the second etching.

According to the manufacturing method of a display device having any of the above-described structures, an element region is formed by the first etching, and a side surface of the gate electrode layer is made more on the inside than a side surface of the element region by an almost uniform distance by the second etching.

In the manufacturing method of a display device having any of the above-described structures, the second insulating film is preferably formed by stacking an insulating film formed by a CVD method or a sputtering method and an insulating film formed by a spin coating method. More preferably, the second insulating film is formed by stacking a silicon nitride film formed by a CVD method or a sputtering method and an organic resin film formed by a spin coating method. By formation of the second insulating film in this manner, the thin film transistor can be protected from an impurity element or the like which may adversely affect electric characteristics of the thin film transistor, and planarity of a surface over which a pixel electrode is formed can be improved; accordingly, reduction in yield can be prevented.

In the manufacturing method of a display device having any of the above-described structures, the pixel electrode is preferably formed by photolithography.

Note that etching is preferably performed under such conditions as to cause unintended etching as little as possible.

Note that a "gate wiring" means a wiring connected to a gate electrode of a thin film transistor. The gate wiring is formed using a gate electrode layer. Further, the gate wiring is sometimes called a scanning line.

Note that a "source wiring" means a wiring connected to one of a source electrode and a drain electrode of a thin film transistor. The source wiring is formed using a source and drain electrode layer. Further, the source wiring is sometimes called a signal line.

In addition, a "power supply line" means a wiring which is connected to a power supply and is held at a constant potential.

Note that a "film having heat resistance" means a film which maintains a form of a film at a temperature in a later step and can maintain required functions and characteristics.

A pattern of a gate electrode can be formed without using an additional photomask, and the number of steps for manufacturing a thin film transistor can be significantly reduced. The thin film transistor can be applied to a display device. Accordingly, the number of steps for manufacturing a display device can be significantly reduced as well.

More specifically, the number of photomasks can be reduced. It is also possible to manufacture a thin film transistor using one photomask (multi-tone mask). Accordingly, the number of steps for manufacturing a thin film transistor or a display device can be significantly reduced. Further, a thin film transistor can be manufactured using one photomask, whereby misalignment can be prevented in aligning a photomask.

In addition, a complicated step using backside light exposure, resist reflow, a lift-off method, or the like is not needed unlike the conventional technique which is aimed at reducing the number of photomasks. Therefore, the number of steps for manufacturing a display device can be significantly reduced without reducing yield.

Moreover, the number of steps for manufacturing a thin film transistor can be significantly reduced while electric characteristics of the thin film transistor are maintained. Therefore, the number of steps for manufacturing a display device can be significantly reduced without sacrificing display quality of the display device or the like.

Furthermore, by the aforementioned effects, manufacturing cost of a thin film transistor and a display device can be significantly reduced.

In a thin film transistor which is an embodiment of the present invention, a large area of a semiconductor layer is light-shielded by a gate electrode layer. In particular, a semiconductor layer included in a thin film transistor is light-shielded by a gate electrode layer. Therefore, a thin film transistor with a small amount of light leakage current can be formed. Accordingly, a display device with favorable display quality can be manufactured.

BRIEF DESCRIPTION OF THE DRAWINGS

FIGS. 53A to 53D each illustrate an example of a formation method of a resist mask.

DETAILED DESCRIPTION OF THE INVENTION

Figure 1A:
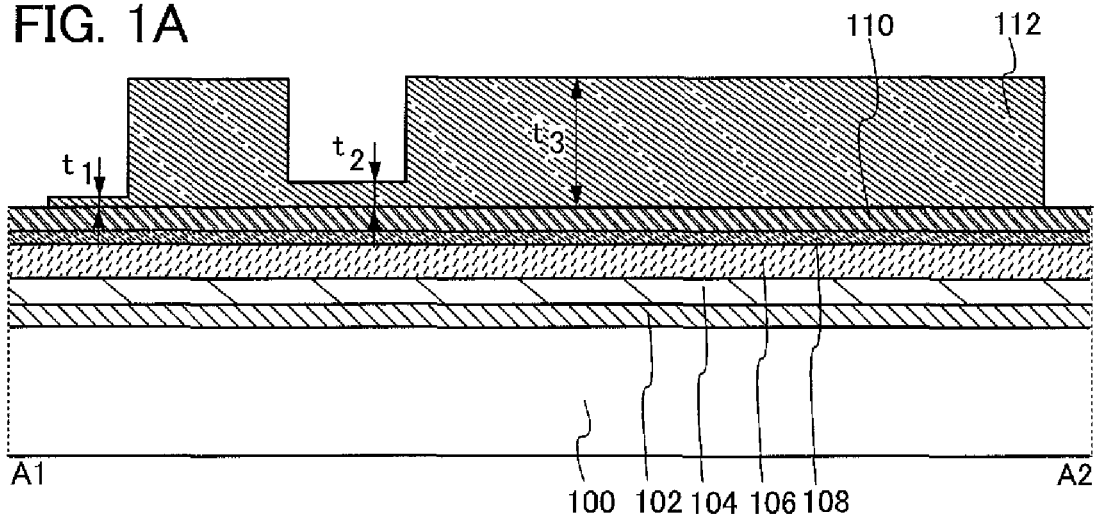
FIGS. 1A to 1C illustrate an example of a manufacturing method of a thin film transistor and a display device.
Figure 1B:
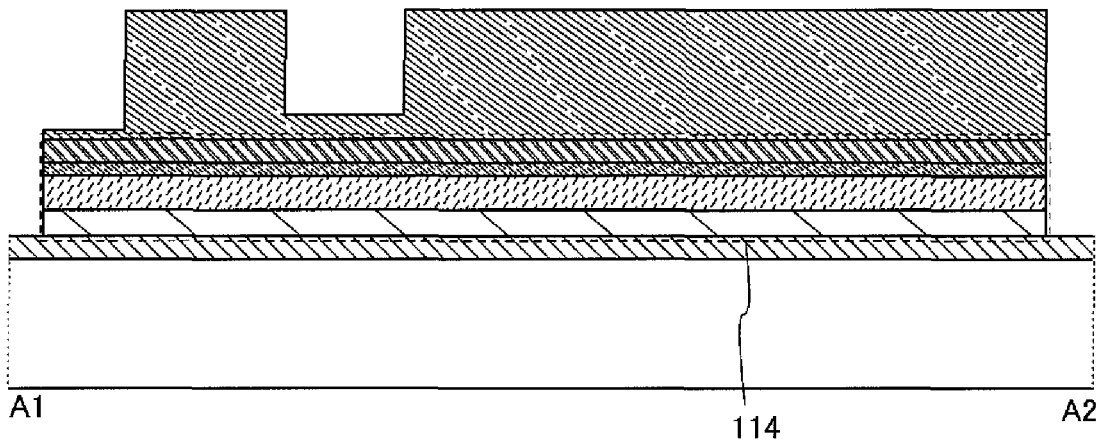

Hereinafter, embodiments of the present invention will be described in detail with reference to the accompanying drawings. Note that the present invention is not limited to the following description. It is easily understood by those skilled in the art that various changes may be made in forms and details without departing from the spirit and the scope of the present invention. Therefore, the present invention should not be interpreted as being limited to the description of embodiments to be given below. In describing structures of the present invention with reference to the drawings, the same reference numerals are used in common for the same portions in different drawings. The same hatching pattern is applied to similar parts, and the similar parts are not especially denoted by reference numerals in some cases. Note that a first insulating film and a second insulating film are not illustrated in top views.

Embodiment 1

In this embodiment, an example of a manufacturing method of a thin film transistor and a manufacturing method of a display device in which the thin film transistors are arranged in matrix will be described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14C, FIGS. 15A to 15C, FIGS. 16A to 16C, FIGS. 17A to 17C, FIGS. 18A to 18C, FIGS. 19A to 19C, FIGS. 20A to 20C, FIG. 21, FIG. 22, FIG. 23, FIG. 24, FIG. 25, FIG. 26, FIG. 27, FIG. 28, FIG. 29, FIGS. 30A and 30B, FIG. 31, FIG. 32, and FIGS. 33A to 33C.

Figure 29:
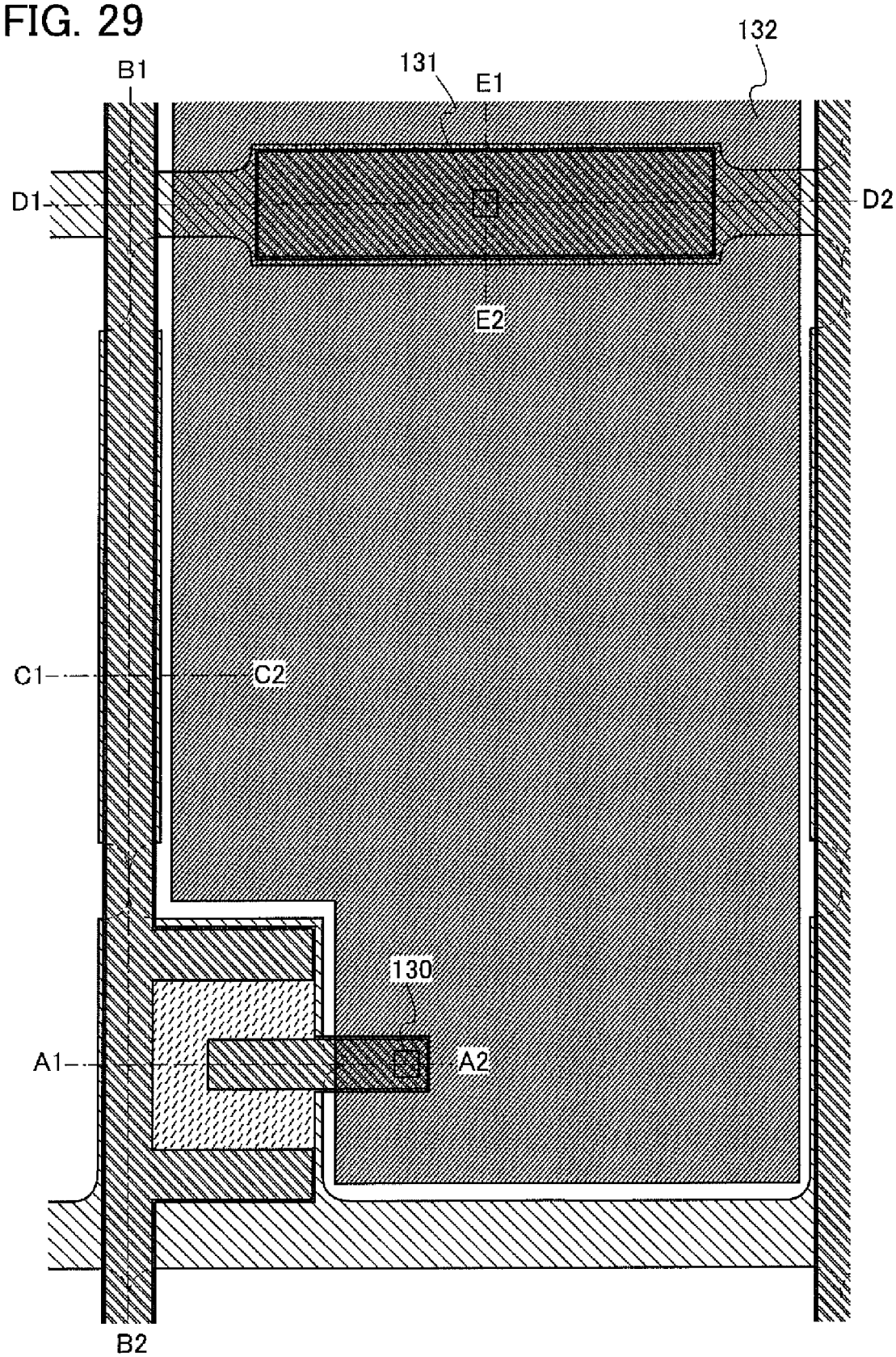
FIG. 29 illustrates an example of a manufacturing method of a thin film transistor and a display device.

Note that FIG. 21, FIG. 22, FIG. 23, FIG. 24, FIG. 25, FIG. 26, FIG. 27, FIG. 28, and FIG. 29 illustrate top views of thin film transistors according to this embodiment, and FIG. 29 is a completion view in the situation that formation of a pixel electrode is finished. FIGS. 1A to 1C, FIGS. 2A to 2C, FIGS. 3A to 3C, and FIGS. 4A to 4C are cross-sectional views taken along a line A1-A2 in FIG. 21, FIG. 22, FIG. 23, FIG. 24, FIG. 25, FIG. 26, FIG. 27, FIG. 28, and FIG. 29. FIGS. 5A to 5C, FIGS. 6A to 6C, FIGS. 7A to 7C, and FIGS. 8A to 8C are cross-sectional views taken along a line B1-B2 in FIG. 21, FIG. 22, FIG. 23, FIG. 24, FIG. 25, FIG. 26, FIG. 27, FIG. 28, and FIG. 29. FIGS. 9A to 9C, FIGS. 10A to 10C, FIGS. 11A to 11C, and FIGS. 12A to 12C are cross-sectional views taken along a line C1-C2 in FIG. 21, FIG. 22, FIG. 23, FIG. 24, FIG. 25, FIG. 26, FIG. 27, FIG. 28, and FIG. 29. FIGS. 13A to 13C, FIGS. 14A to 14C, FIGS. 15A to 15C, and FIGS. 16A to 16C are cross-sectional views taken along a line D1-D2 in FIG. 21, FIG. 22, FIG. 23, FIG. 24, FIG. 25, FIG. 26, FIG. 27, FIG. 28, and FIG. 29. FIGS. 17A to 17C, FIGS. 18A to 18C, FIGS. 19A to 19C, and FIGS. 20A to 20C are cross-sectional views taken along a line E1-E2 in FIG. 21, FIG. 22, FIG. 23, FIG. 24, FIG. 25, FIG. 26, FIG. 27, FIG. 28, and FIG. 29.

First, a first conductive film 102, a first insulating film 104, a semiconductor film 106, an impurity semiconductor film 108, and a second conductive film 110 are formed over a substrate 100. These films may be a single-layer film or a stacked-layer film including a plurality of films.

The substrate 100 is an insulating substrate. In the case where an embodiment of the present invention is applied to a display device, a glass substrate or a quartz substrate can be used as the substrate 100. In this embodiment, a glass substrate is used.

The first conductive film 102 is formed using a conductive material. The first conductive film 102 can be formed using a conductive material such as metal, e.g., titanium, molybdenum, chromium, tantalum, tungsten, aluminum, copper, neodymium, niobium, or scandium, or an alloy containing any of these metal as a main component. Note that the material of the first conductive film 102 should be a material which has such heat resistance as to withstand heat in a later step (such as formation of the first insulating film 104) and be not unintentionally etched or eroded in a later step (such as etching of the second conductive film 110). As long as these conditions are satisfied, the material of the first conductive film 102 is not limited to a particular material.

In addition, the first conductive film 102 can be formed by, for example, a sputtering method, a CVD method (including a thermal CVD method, a plasma CVD method, and the like), or the like. However, the formation method of the first conductive film 102 is not limited to a particular method.

Further, the first insulating film 104 serves as a gate insulating film.

The first insulating film 104 is formed using an insulating material. The first insulating film 104 can be formed using, for example, a silicon oxide film, a silicon nitride film, a silicon oxynitride film, a silicon nitride oxide film, or the like. Note that as in the case of the first conductive film 102, the material of the first insulating film 104 should have such heat resistance as to withstand heat in a later step (such as formation of the semiconductor film 106) and be not unintentionally etched or eroded in a later step. As long as these conditions are satisfied, the material of the first insulating film 104 is not limited to a particular material.

In addition, the first insulating film 104 can be formed by, for example, a CVD method (including a thermal CVD method, a plasma CVD method, and the like), a sputtering method, or the like. However, the formation method of the first insulating film 104 is not limited to a particular method.

The semiconductor film 106 is formed using a semiconductor material. The semiconductor film 106 can be formed using, for example, amorphous silicon formed using a silane gas or the like. Note that as in the case of the first conductive film 102, the material of the semiconductor film 106 should have such heat resistance as to withstand heat in a later step (such as formation of the second conductive film 110) and be not unintentionally etched or eroded in a later step. As long as these conditions are satisfied, the material of the semiconductor film 106 is not limited to a particular material. Therefore, germanium or the like may be used. Note that the crystallinity of the semiconductor film 106 is not particularly limited as well.

In addition, the semiconductor film 106 can be formed by, for example, a CVD method (including a thermal CVD method, a plasma CVD method, and the like), a sputtering method, or the like. However, the formation method of the semiconductor film 106 is not limited to a particular method.

The impurity semiconductor film 108 is a semiconductor film containing an impurity element imparting one conductivity type, and is formed using a source gas for formation of a semiconductor, to which the impurity element imparting one conductivity type is added, or the like. For example, the impurity semiconductor film 108 can be formed using a silicon film containing phosphorus or boron, which is formed using a silane gas containing phosphine (chemical formula: $PH_3$) or diborane (chemical formula: $B_2H_6$). Note that as in the case of the first conductive film 102, the material of the impurity semiconductor film 108 should have such heat resistance as to withstand heat in a later step (such as formation of the second conductive film 110) and be not unintentionally etched or eroded in a later step. As long as these conditions are satisfied, the material of the impurity semiconductor film 108 is not limited to a particular material. Note that the crystallinity of the impurity semiconductor film 108 is not particularly limited as well.

In the case of manufacturing an n-channel thin film transistor, phosphorus, arsenic, or the like may be used as the impurity element imparting one conductivity type to be added. That is, a silane gas used for formation of the impurity semiconductor film 108 may contain phosphine, arsine (chemical formula: $AsH_3$), or the like at a desired concentration. On the contrary, in the case of manufacturing a p-channel thin film transistor, boron or the like may be added as the impurity element imparting one conductivity type. That is, a silane gas used for formation of the impurity semiconductor film 108 may contain diborane or the like at a desired concentration. In the case where a region capable of an ohmic contact with a source and drain electrode layer is provided in a part of the semiconductor layer, which is formed using the semiconductor film 106, by doping or the like, the impurity semiconductor film 108 does not have to be provided.

In addition, the impurity semiconductor film 108 can be formed by, for example, a CVD method (including a thermal CVD method, a plasma CVD method, and the like), or the like. However, the formation method of the impurity semiconductor film 108 is not limited to a particular method.

The second conductive film 110 is formed using a material which is a conductive material (e.g., the materials mentioned as the material of the first conductive film 102) but is different from the material used for the first conductive film 102. Here, the "different material" means a material having a different main component. Specifically, a material which is not easily etched by second etching which is described later is preferably selected. Note that as in the case of the first conductive film 102, the material of the second conductive film 110 should have such heat resistance as to withstand heat in a later step (such as formation of a first protective film 126) and be not unintentionally etched or eroded in a later step. Accordingly, as long as these conditions are satisfied, the material of the second conductive film 110 is not limited to a particular material.

In addition, the second conductive film 110 can be formed by, for example, a sputtering method, a CVD method (including a thermal CVD method, a plasma CVD method, and the like), or the like. However, the formation method of the second conductive film 110 is not limited to a particular method.

Note that as for heat resistance required for the first conductive film 102, the first insulating film 104, the semiconductor film 106, the impurity semiconductor film 108, and the second conductive film 110, which are described above, the first conductive film 102 requires the highest heat resistance, the heat resistance required for the films becomes lower in order of the above description, and the second conductive film 110 requires the lowest heat resistance. For example, in the case where the semiconductor film 106 is an amorphous semiconductor film containing hydrogen, hydrogen in the semiconductor film 106 is desorbed at about 300° C. or more and electric characteristics are changed. Accordingly, for example, the temperature may be set so as not to exceed 300° C. in steps after formation of the semiconductor film 106.

Next, a first resist mask 112 is formed over the second conductive film 110 (see FIG. 1A, FIG. 5A, FIG. 9A, FIG. 13A, FIG. 17A, and FIG. 21). The first resist mask 112 includes three regions with different thicknesses. In the first resist mask 112, a region with the smallest thickness is referred to as a first region, a region with the largest thickness is referred to as a third region, and a region whose thickness is larger than that of the first region and smaller than that of the third region is referred to as a second region. Note that, in FIG. 1A, FIG. 5A, FIG. 9A, FIG. 13A, and FIG. 17A, the thickness of the first region is referred to as a $t_1$, the thickness of the second region is referred to as a $t_2$, and the thickness of the third region is referred to as a $t_3$.

In the first resist mask 112, the third region is formed in a region where a source and drain electrode layer 120 is formed, and the second region is formed in a region where a semiconductor layer 124 is exposed without existence of the source and drain electrode layer 120. The first region is provided to pattern a gate electrode layer.

The first resist mask 112 can be formed using a four-tone mask. Here, multi-tone masks will be described below with reference to FIGS. 30A and 30B.

A multi-tone mask is a photomask capable of light exposure with multi-level light intensity, and generally, light exposure is performed with three levels of light intensity (three-tone) using a light-exposed region, a semi-light-exposed region, and a light-unexposed region. With the use of a multi-tone mask, one-time light exposure and development process allows a resist mask with plural thicknesses to be formed. Therefore, by the usage of a multi-tone mask, the number of photomasks can be reduced.

In this embodiment, the first resist mask 112 including three regions with different thicknesses can be formed using a four-tone mask. Note that a four-tone mask is disclosed in Patent Document 2, for example. Hereinafter, a multi-tone mask used in this embodiment is described.

Figure 30A:
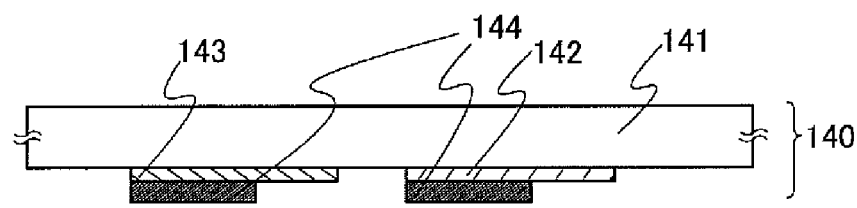
FIGS. 30A and 30B each illustrate a four-tone photomask.
Figure 30A:
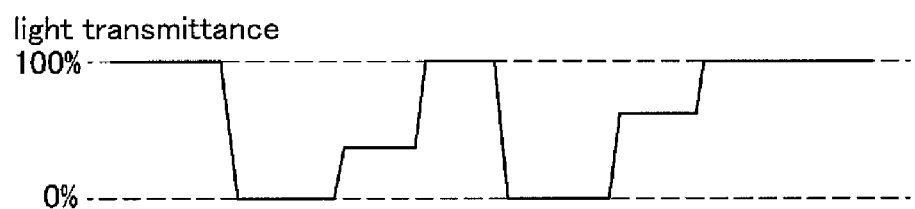
Figure 30B:
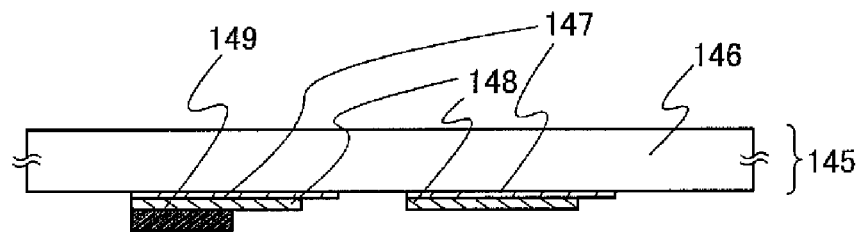
Figure 30B:
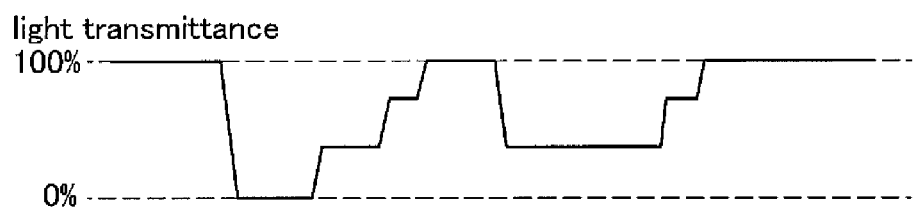

FIGS. 30A and 30B are cross-sectional views of four-tone masks.

A multi-tone mask 140 in FIG. 30A is formed with a first semi-light-transmitting portion 142 formed with a semi-light-transmitting film, a second semi-light-transmitting portion 143 whose light transmittance is lower than that of the first semi-light-transmitting portion 142, and light-shielding portions 144 formed with a light-shielding film over a substrate 141 having a light-transmitting property.

As the substrate 141 having a light-transmitting property, quartz or the like can be used.

A multi-tone mask 145 in FIG. 30B is formed with first semi-light-transmitting portions 147 formed with a semi-light-transmitting film, second semi-light-transmitting portions 148 whose light transmittance is lower than that of the first semi-light-transmitting portions 147, and a light-shielding portion 149 formed with a light-shielding film over a substrate 146 having a light-transmitting property.

The first semi-light-transmitting portion 142 and the first semi-light-transmitting portions 147 can be formed using a film of MoSiN, MoSi, MoSiO, MoSiON, CrSi, or the like.

The light-shielding portions 144 and the light-shielding portion 149 may be formed using a metal film, and preferably formed using chromium, chromium oxide, chromium nitride, or the like.

The second semi-light-transmitting portion 143 and the second semi-light-transmitting portions 148 may be formed with films having a lower light transmittance than the first semi-light-transmitting portion 142 or the first semi-light-transmitting portions 147 and a higher light transmittance than the light-shielding portions 144. Therefore, the second semi-light-transmitting portion 143 and the second semi-light-transmitting portions 148 may be formed with a semi-light-transmitting film in a similar manner to the first semi-light-transmitting portion 142 or the like, or may be formed with a metal film in a similar manner to the light-shielding portions 144. The light transmittance can be adjusted by adjustment of the film thickness, appropriate adjustment of composition ratios of materials which form the films, control of degrees of crystallinity of materials which form the films, or the like.

In the case where the multi-tone mask 140 and the multi-tone mask 145 are irradiated with light for light exposure, as illustrated in FIGS. 30A and 30B, regions overlapping with the light-shielding portions have a light transmittance of about 0% and regions not provided with either the light-shielding portions or the semi-light-transmitting portions (the first semi-light-shielding portions and the second semi-light-transmitting portions) have a light transmittance of about 100%. On the other hand, the semi-light-transmitting portions have a light transmittance of about 10 to 70%, and the light transmittance can be adjusted by the kind, the thickness, or the like of materials to be formed.

Note that the first semi-light-transmitting portions and the second semi-light-transmitting portions have light transmittances which are in the above range and are preferably significantly different from each other. This is because, by making the difference large in the thickness of resists to be formed between regions, a sufficient margin in a manufacturing process can be obtained. Therefore, the first semi-light-transmitting portions preferably have a light transmittance of about 10 to 20%, and the second semi-light-transmitting portions have a light transmittance of about 60 to 70%. Note that, in FIG. 30B, since there are regions where the first semi-light-transmitting portions 147 and the second semi-light-transmitting portions 148 overlap with each other, the regions preferably have a light transmittance of about 60 to 70%.

As described above, by light exposure using the four-tone mask and development, the first resist mask 112 which includes three regions with different thicknesses can be formed.

Note that, the four-tone mask used in this embodiment is not limited to the above description, and the four-tone mask may be any photomask with which a resist mask including three regions with different thicknesses can be formed.

Next, first etching is performed using the first resist mask 112. That is, the first insulating film 104, the semiconductor film 106, the impurity semiconductor film 108, and the second conductive film 110 are etched to be patterned, whereby a first thin-film stack body 114 is formed (see FIG. 1B, FIG. 5B, FIG. 9B, FIG. 13B, FIG. 17B, and FIG. 22). Through this step, at least a surface of the first conductive film 102 is preferably exposed. This etching is called first etching. Here, as the first etching, either dry etching or wet etching may be employed and a highly anisotropic etching method (physical etching) is preferably employed. By employing a highly anisotropic etching method as the first etching, processing accuracy of a pattern can be improved. Note that the first etching can also be performed by one step when dry etching is employed as the first etching, while the first etching is preferably performed by plural steps when wet etching is employed as the first etching. This is because in the wet etching, the etching rate varies depending on the kind of etched film and it is difficult to perform the etching by one step. Therefore, it is preferable to employ dry etching as the first etching.

As the first etching, dry etching may be performed in three stages, for example. First, etching may be performed using a mixed gas of a $Cl_2$ gas, a $CF_4$ gas, and an $O_2$ gas. Then, etching may be performed using only a $Cl_2$ gas, and lastly, etching may be performed using only a $CHF_3$ gas.

Note that the first conductive film 102 may be etched by the first etching. At this time, it is preferable that a base film be formed over the substrate 100 in advance so as not to etch the substrate 100.

Next, second etching is performed using the first resist mask 112. That is, the first conductive film 102 is etched to be patterned, whereby a gate electrode layer 116 is formed (see FIG. 1C, FIG. 5C, FIG. 9C, FIG. 13C, FIG. 17C, and FIG. 23). This etching step is called second etching.

Note that the gate electrode layer 116 forms a gate electrode of a thin film transistor, a gate wiring, one electrode of a capacitor, a capacitor wiring, and a supporting portion. When a gate electrode layer is referred to as a gate electrode layer 116A, the gate electrode layer forms a gate wiring and a gate electrode of a thin film transistor. When a gate electrode layer is referred to as a gate electrode layer 116B or a gate electrode layer 116D, the gate electrode layer forms a supporting portion. When a gate electrode layer is referred to as a gate electrode layer 116C, the gate electrode layer forms a capacitor wiring and one electrode of a capacitor. Then, these gate electrode layers are collectively referred to as the gate electrode layer 116.

The second etching is performed under such etching conditions that a side surface of the gate electrode layer 116 formed using the first conductive film 102 is provided more on the inside than a side surface of the first thin-film stack body 114. In other words, the second etching is performed so that the side surface of the gate electrode layer 116 is in contact with a bottom surface of the first thin-film stack body 114 (so that the width of the gate electrode layer 116 is narrower than that of the first thin-film stack body 114 in the cross section along the line A1-A2 in FIG. 23 and FIG. 24). In particular, the second etching is performed under such conditions that the etching rate with respect to the second conductive film 110 is low and the etching rate with respect to the first conductive film 102 is high. In other words, the second etching is performed under the conditions that the etching selectivity of the first conductive film 102 with respect to the second conductive film 110 is high. By performing the second etching under such conditions, the gate electrode layer 116 can be formed.

Note that the shape of the side surface of the gate electrode layer 116 is not particularly limited. For example, the shape may be a tapered shape. The shape of the side surface of the gate electrode layer 116 is determined depending on the conditions such as a chemical solution used in the second etching.

Here, the phrase "the conditions that the etching rate with respect to the second conductive film 110 is low and the etching rate with respect to the first conductive film 102 is high" or "the conditions that the etching selectivity of the first conductive film 102 with respect to the second conductive film 110 is high" means conditions satisfying the following first requirement and second requirement.

Figure 1C:
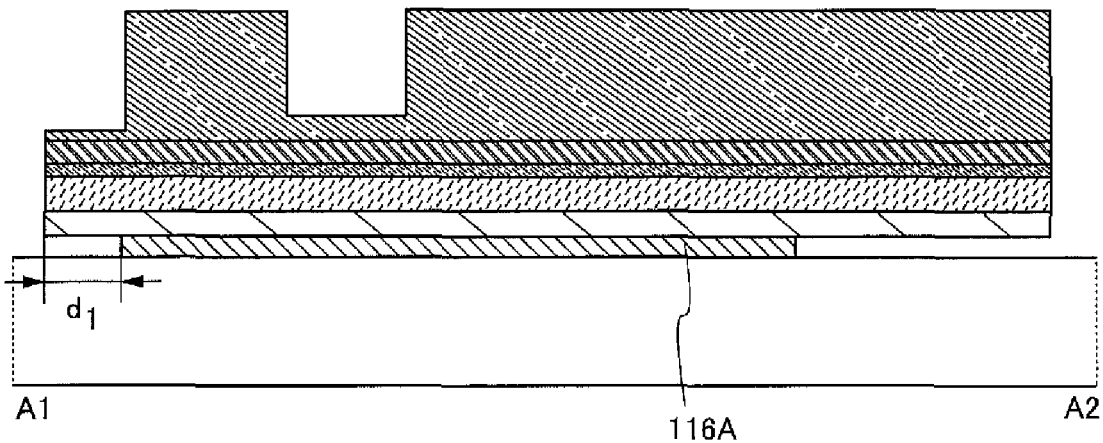
Figure 2A:
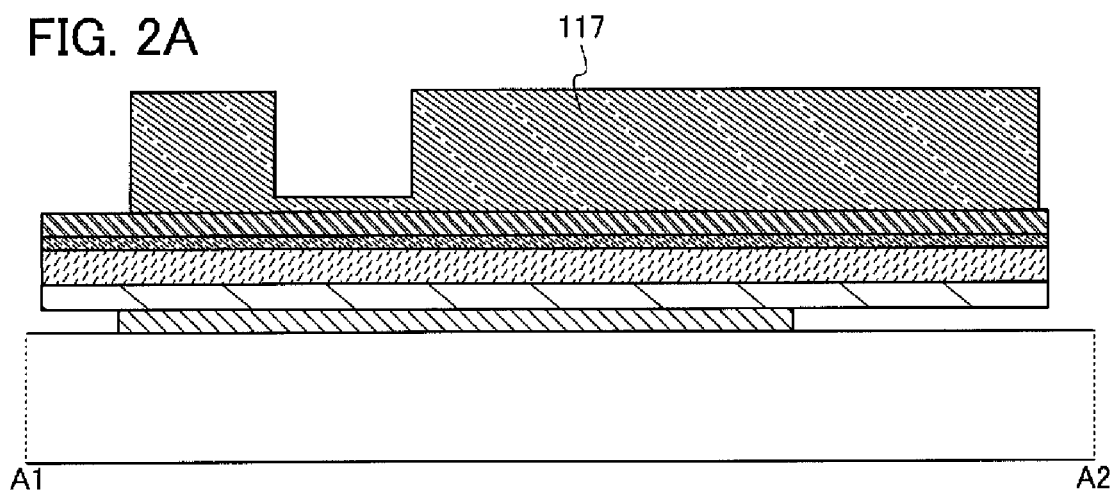
FIGS. 2A to 2C illustrate an example of a manufacturing method of a thin film transistor and a display device.
Figure 2B:
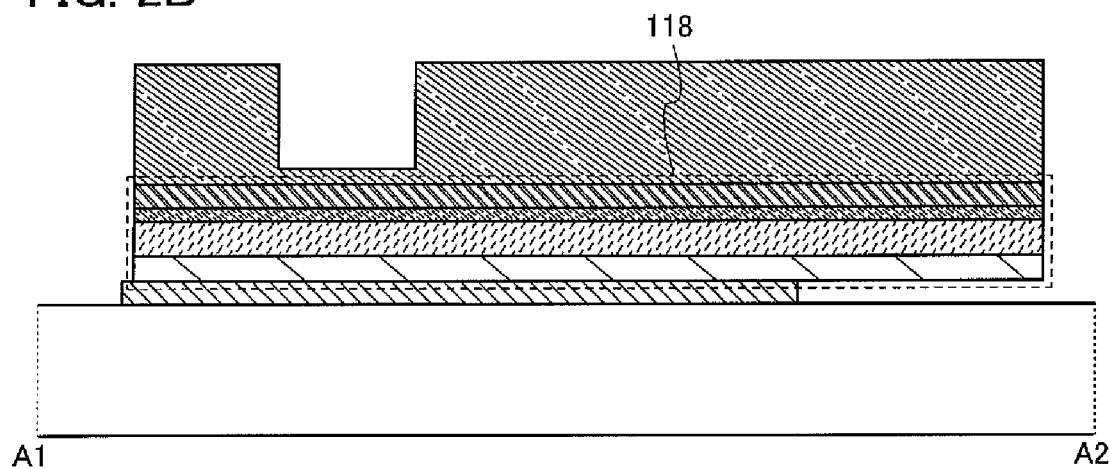
Figure 2C:
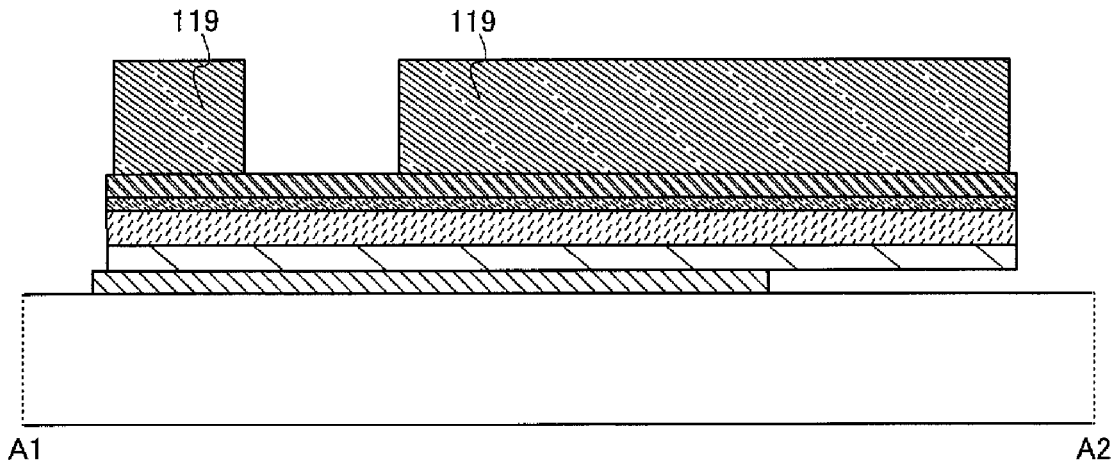
Figure 3A:
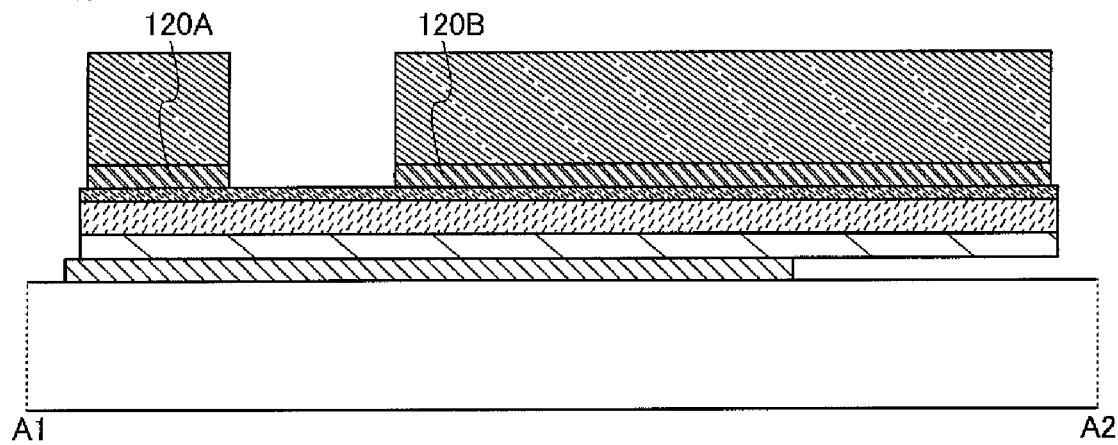
FIGS. 3A to 3C illustrate an example of a manufacturing method of a thin film transistor and a display device.
Figure 3B:
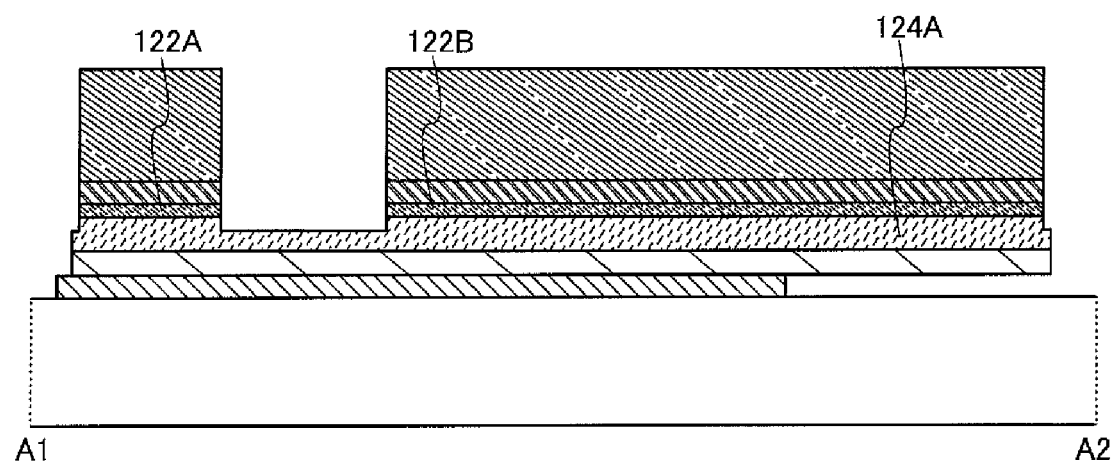
Figure 3C:
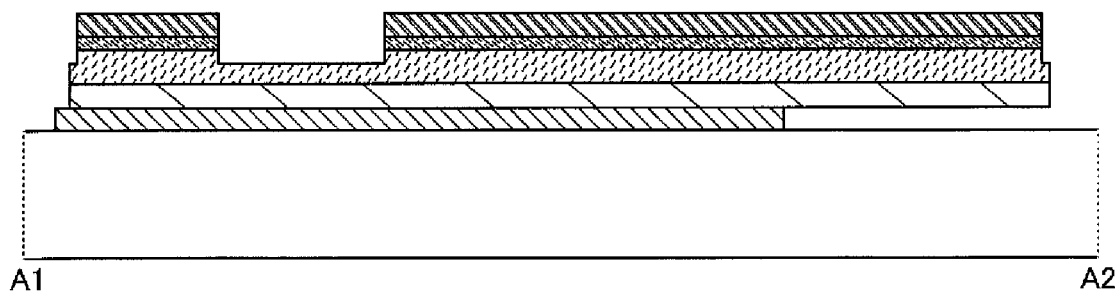
Figure 4A:
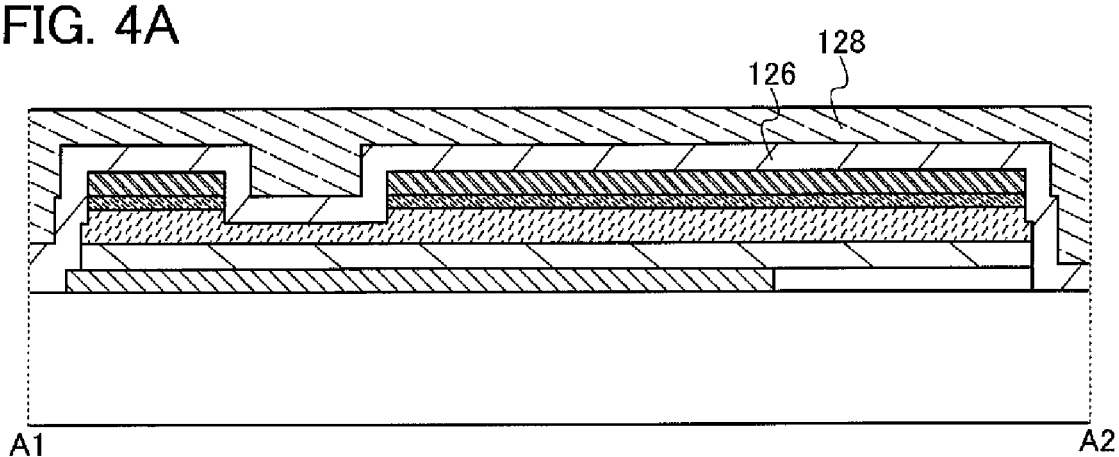
FIGS. 4A to 4C illustrate an example of a manufacturing method of a thin film transistor and a display device.
Figure 4B:
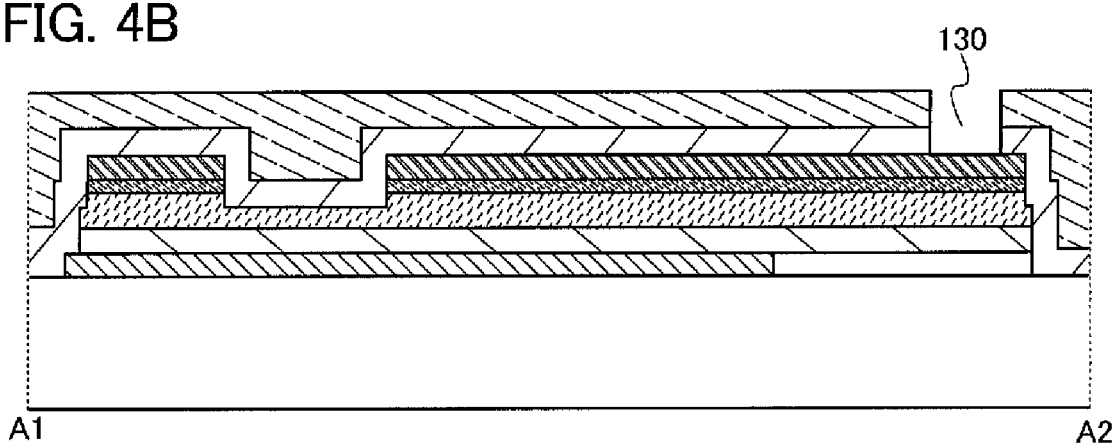
Figure 4C:
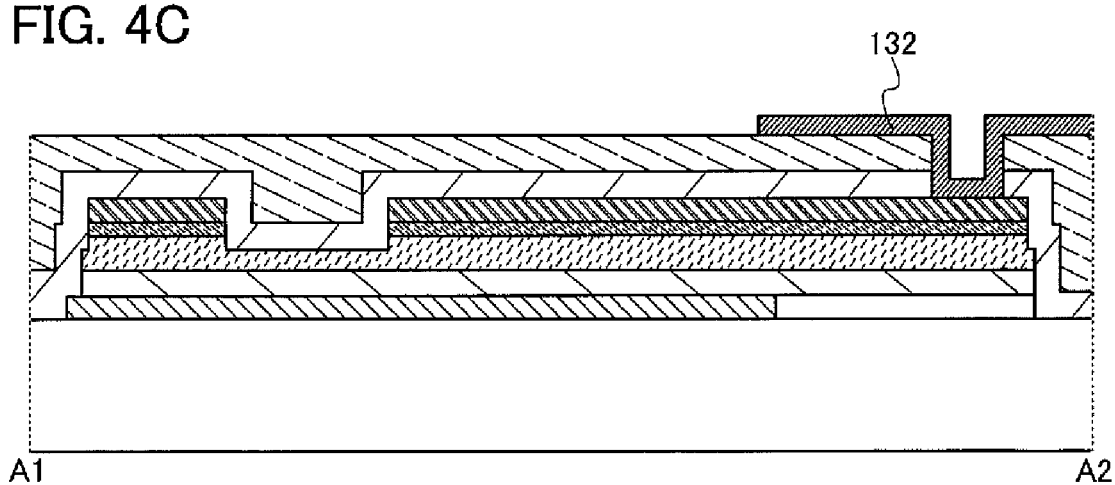
Figure 5A:
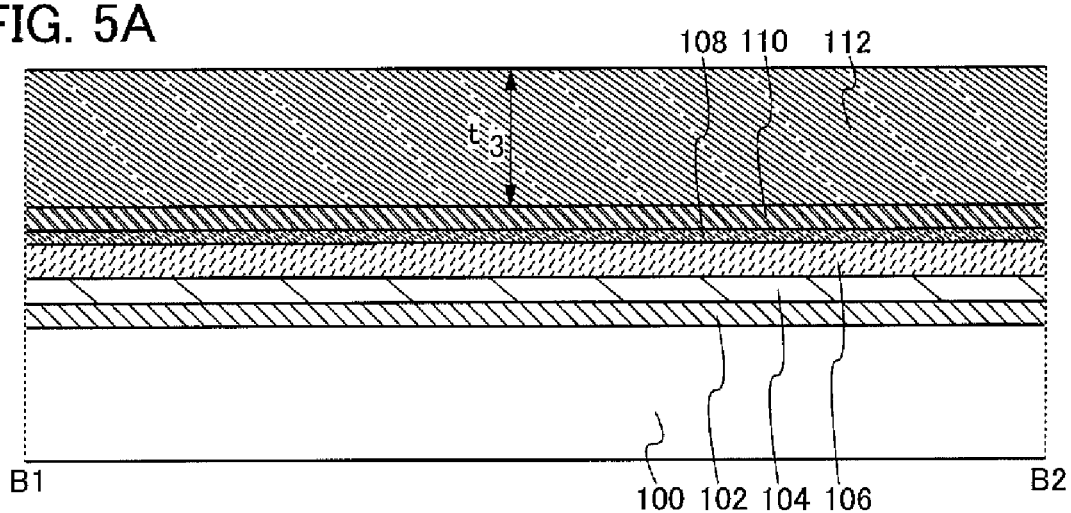
FIGS. 5A to 5C illustrate an example of a manufacturing method of a thin film transistor and a display device.
Figure 5B:
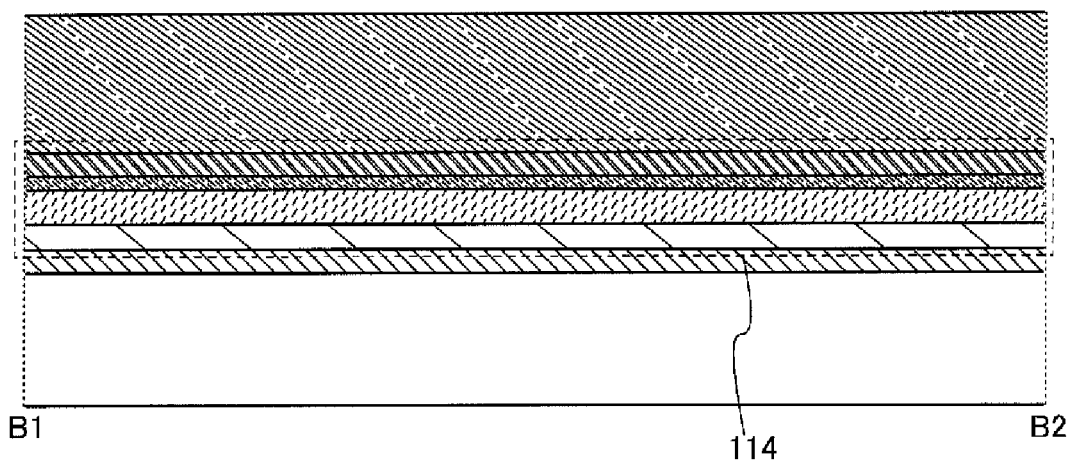
Figure 5C:
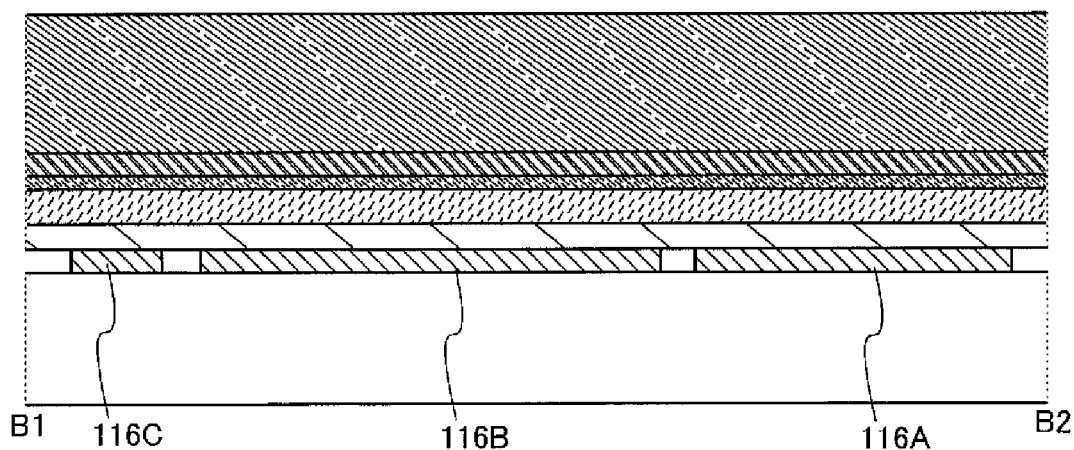
Figure 6A:
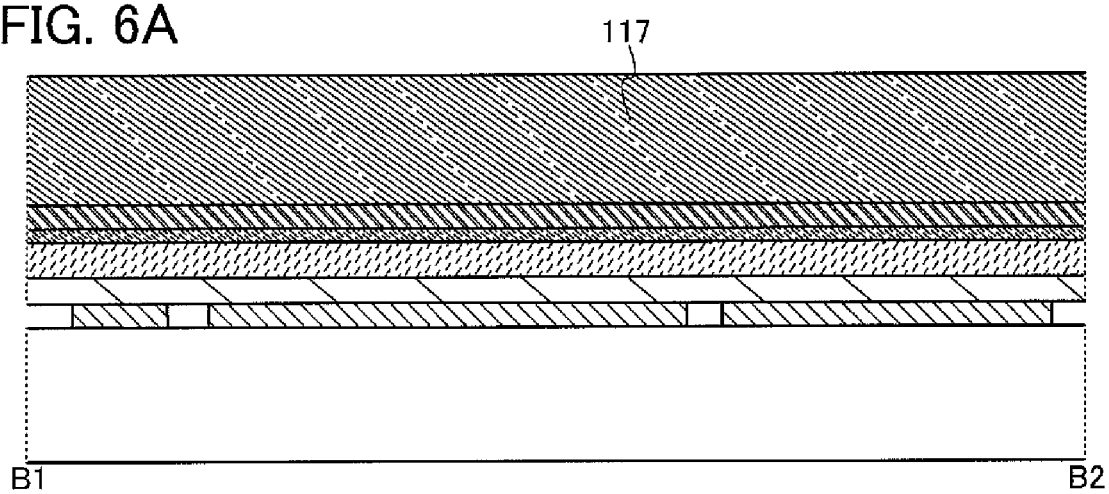
FIGS. 6A to 6C illustrate an example of a manufacturing method of a thin film transistor and a display device.
Figure 6B:
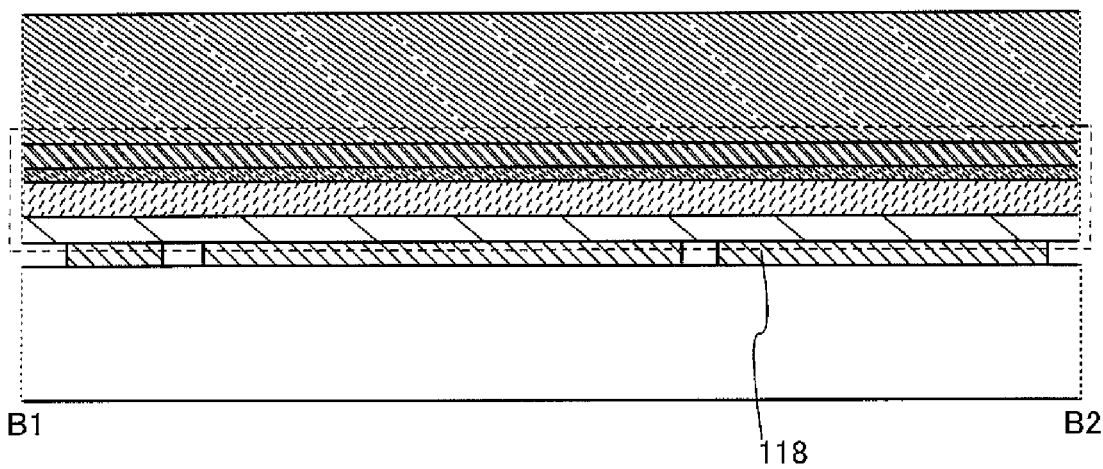
Figure 6C:
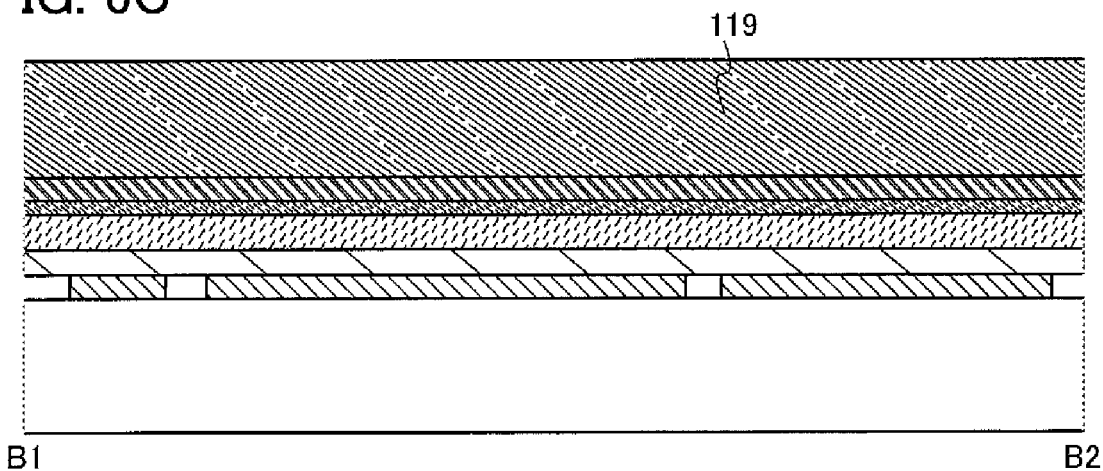
Figure 7A:
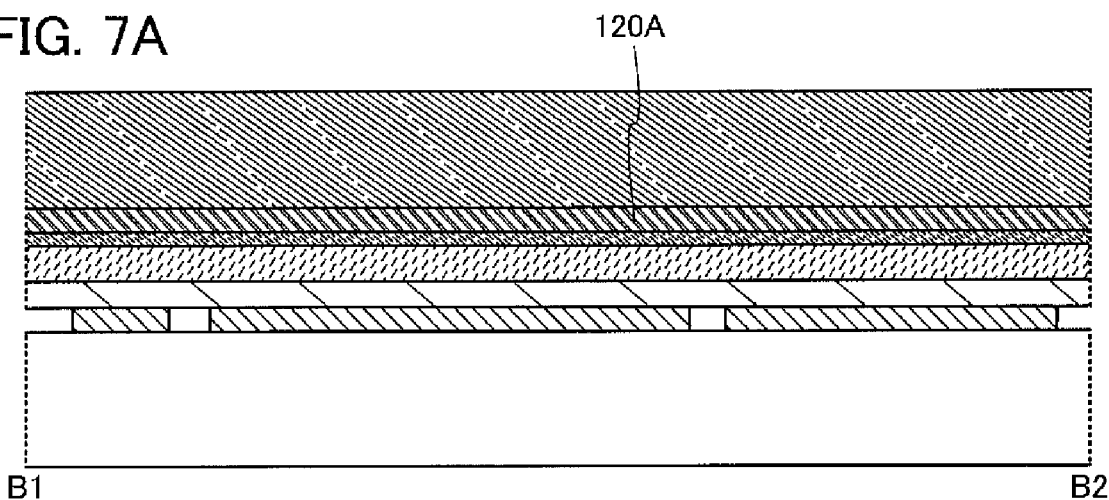
FIGS. 7A to 7C illustrate an example of a manufacturing method of a thin film transistor and a display device.
Figure 7B:
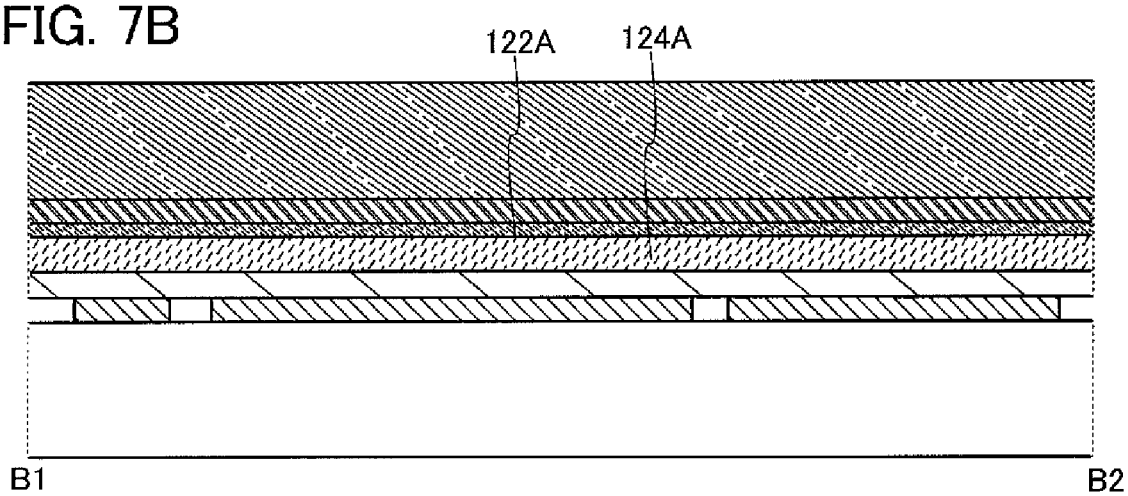
Figure 7C:
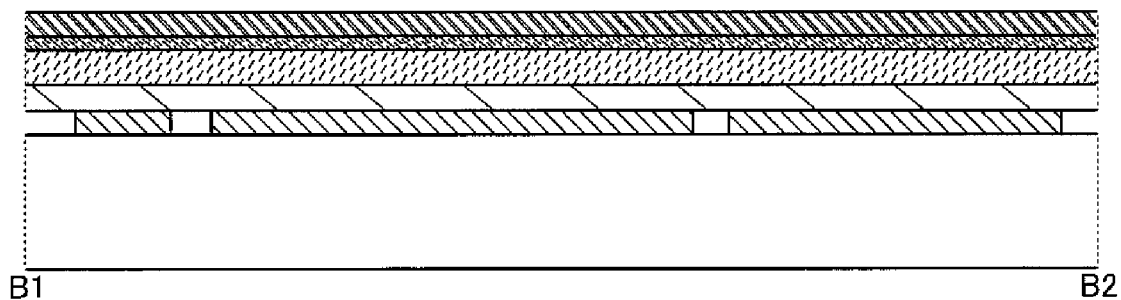
Figure 8A:
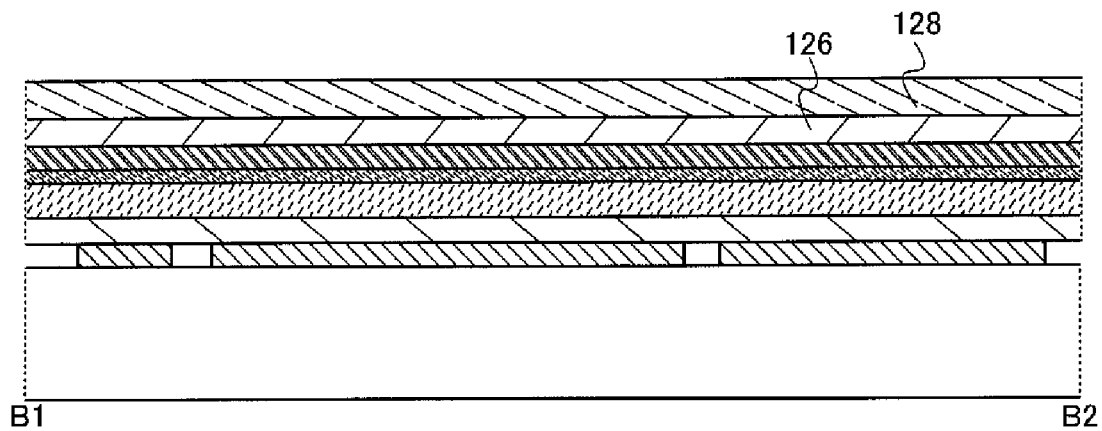
FIGS. 8A to 8C illustrate an example of a manufacturing method of a thin film transistor and a display device.
Figure 8B:
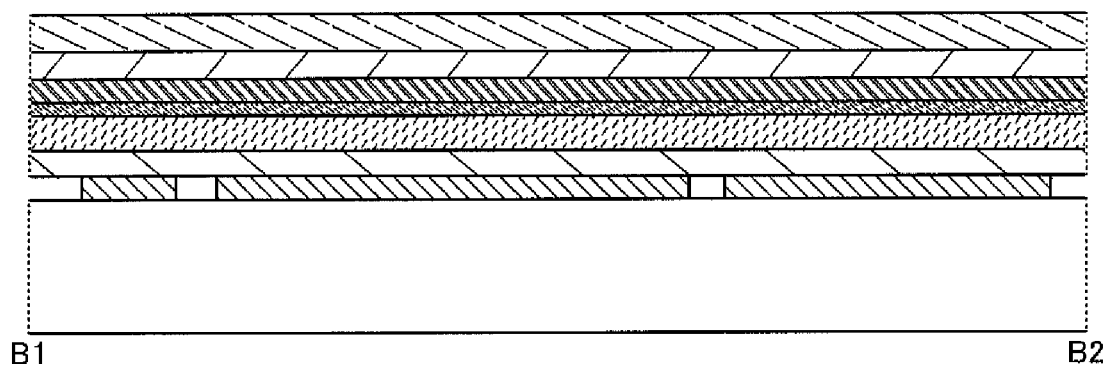
Figure 8C:
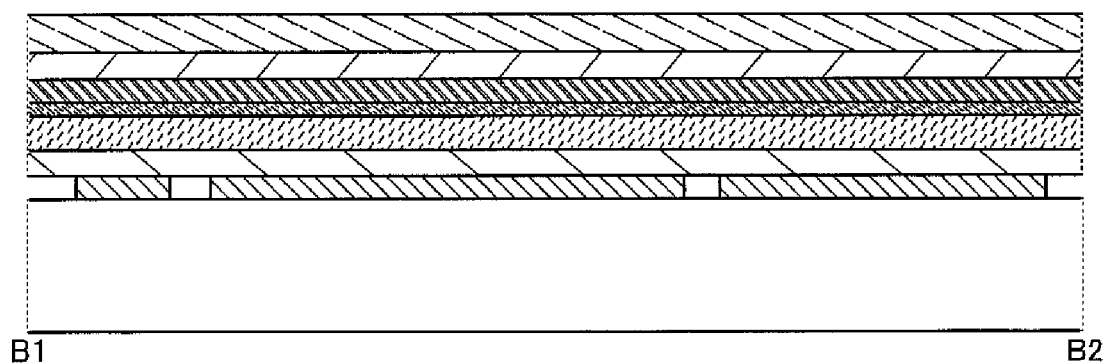
Figure 9A:
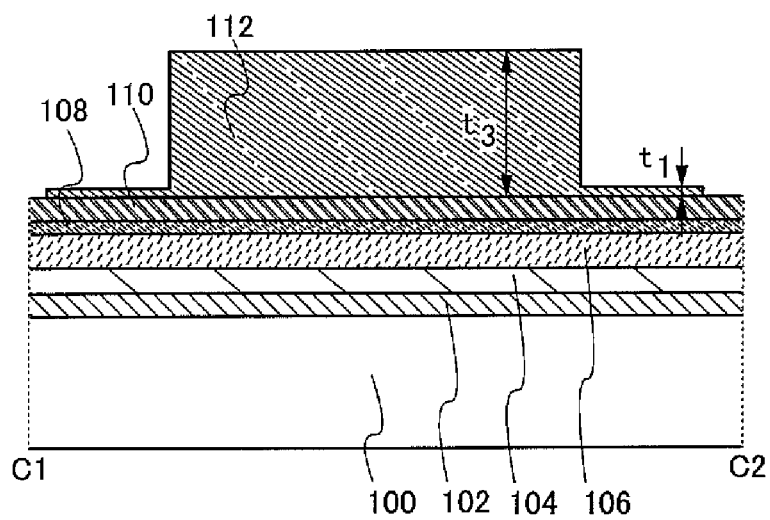
FIGS. 9A to 9C illustrate an example of a manufacturing method of a thin film transistor and a display device.
Figure 9B:
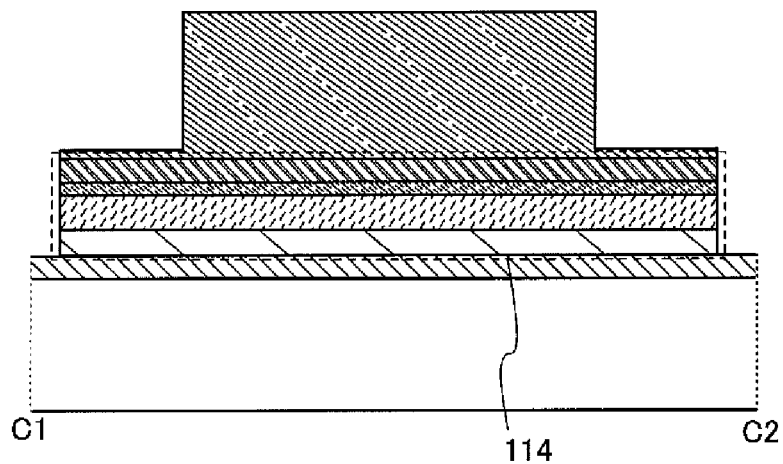
Figure 9C:
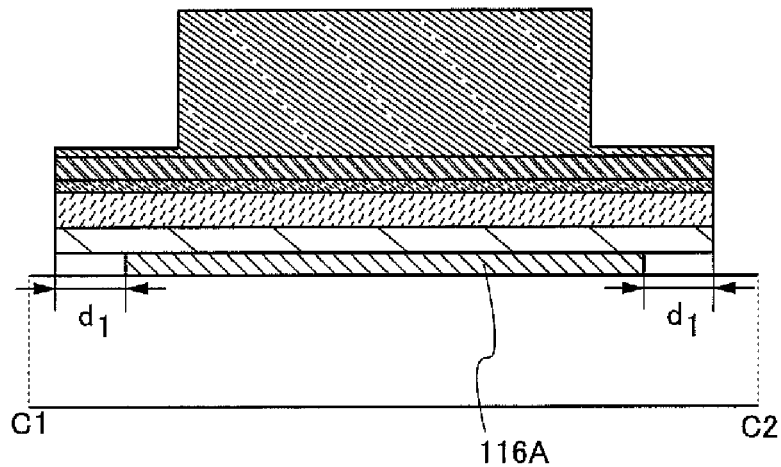
Figure 10A:
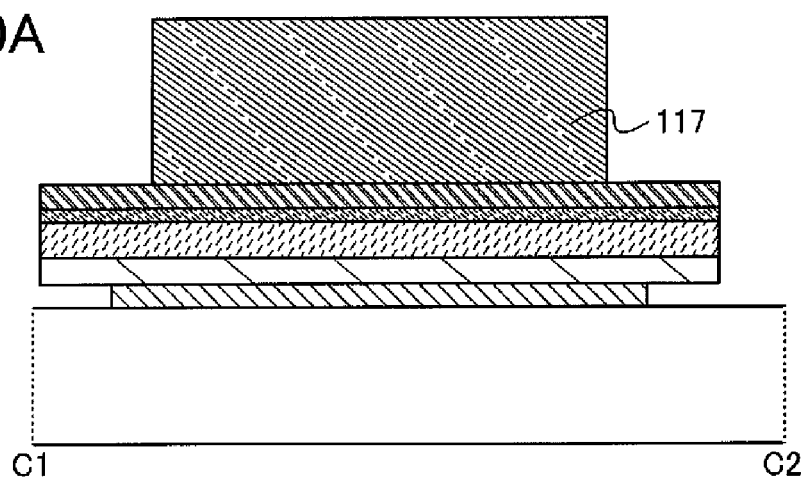
FIGS. 10A to 10C illustrate an example of a manufacturing method of a thin film transistor and a display device.
Figure 10B:
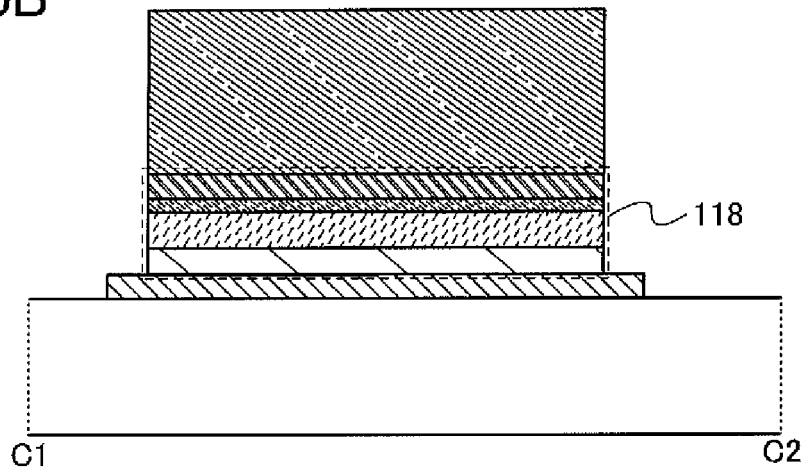
Figure 10C:
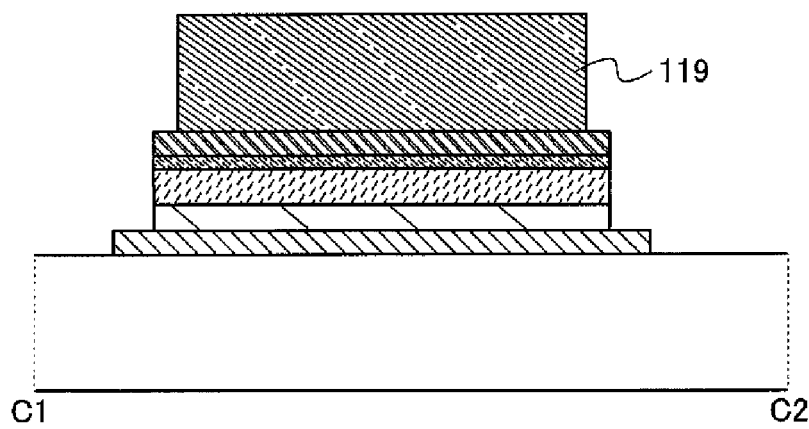
Figure 11A:
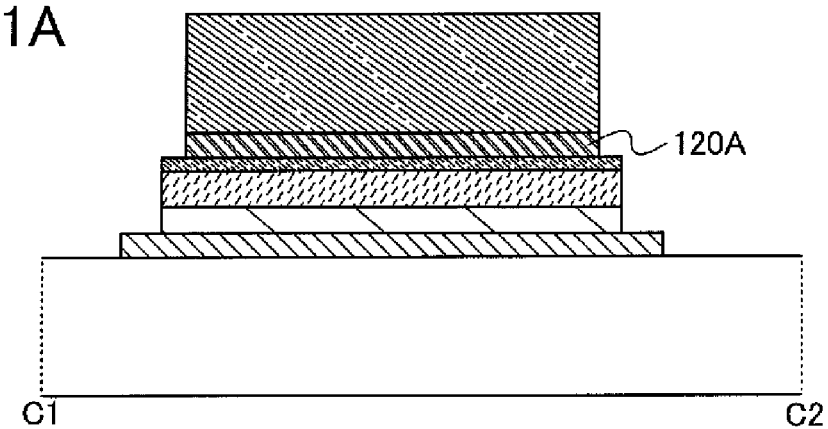
FIGS. 11A to 11C illustrate an example of a manufacturing method of a thin film transistor and a display device.
Figure 11B:
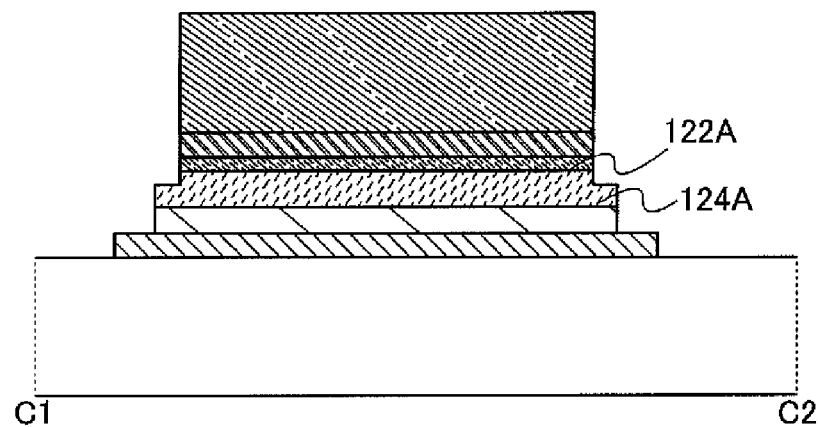
Figure 11C:
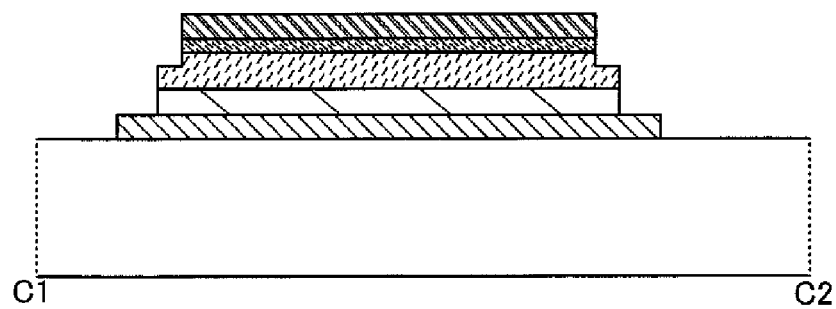
Figure 12A:
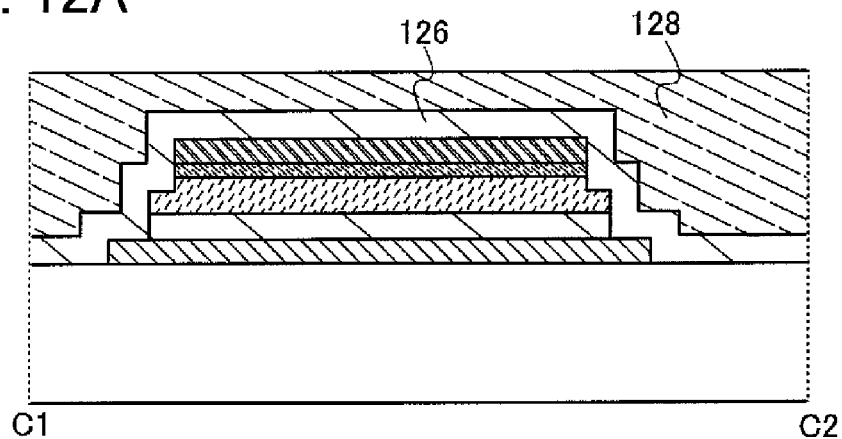
FIGS. 12A to 12C illustrate an example of a manufacturing method of a thin film transistor and a display device.
Figure 12B:
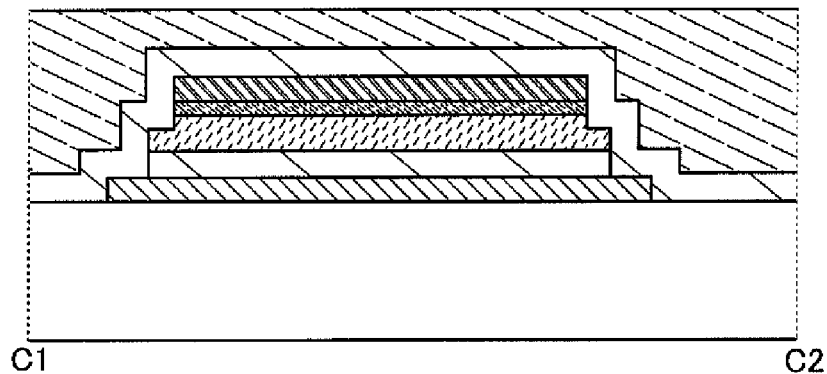
Figure 12C:
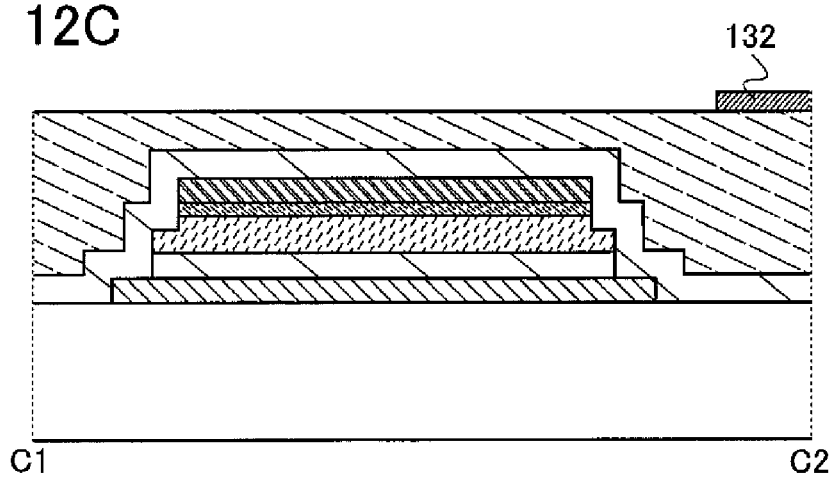
Figure 13A:
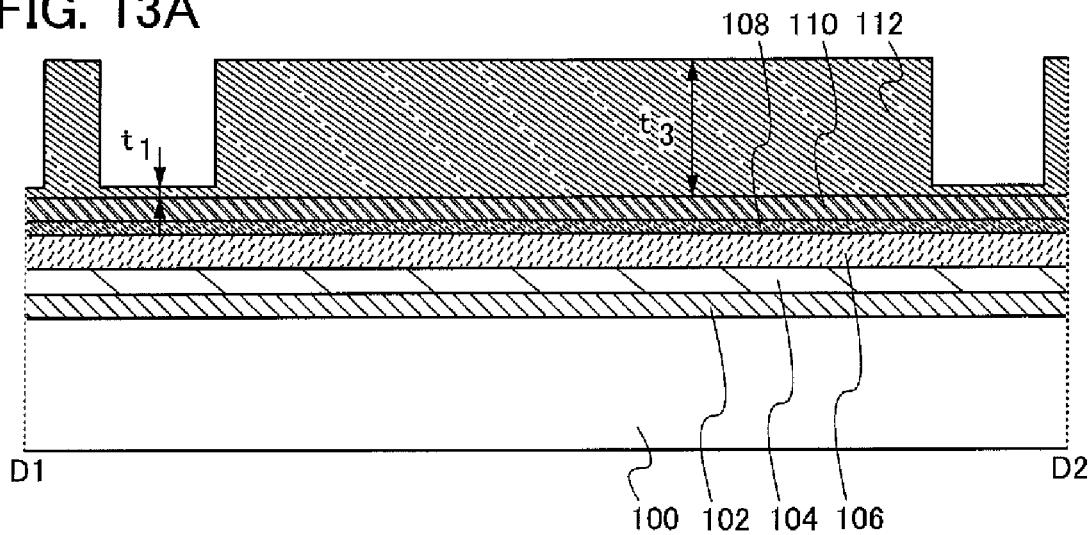
FIGS. 13A to 13C illustrate an example of a manufacturing method of a thin film transistor and a display device.
Figure 13B:
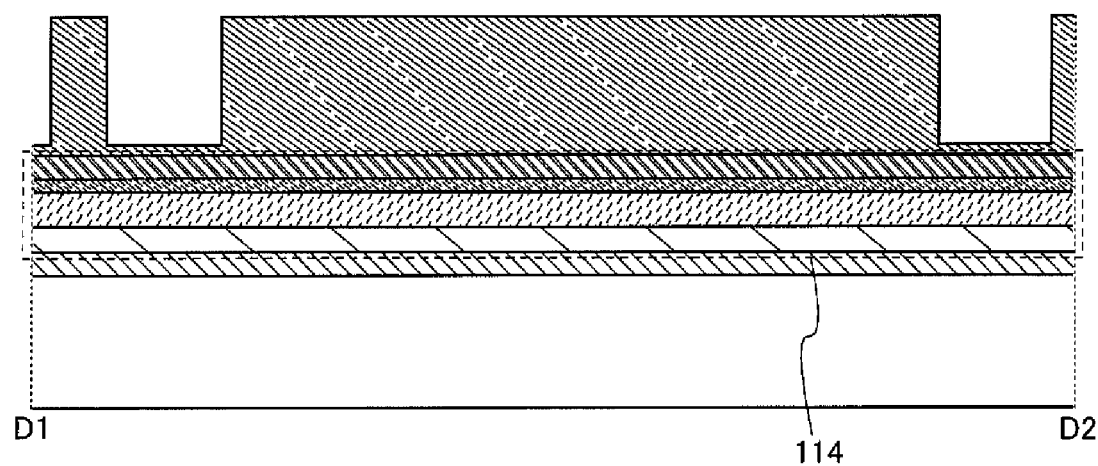
Figure 13C:
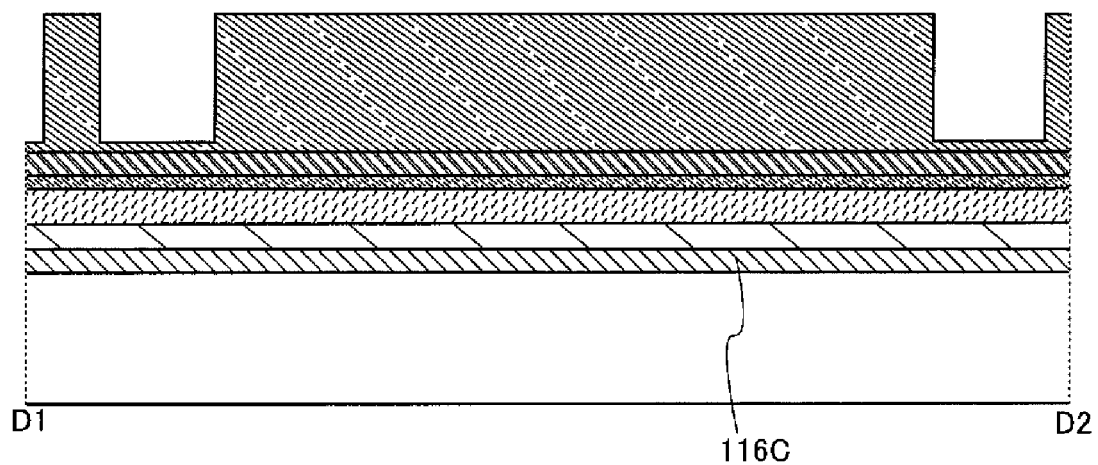
Figure 14A:
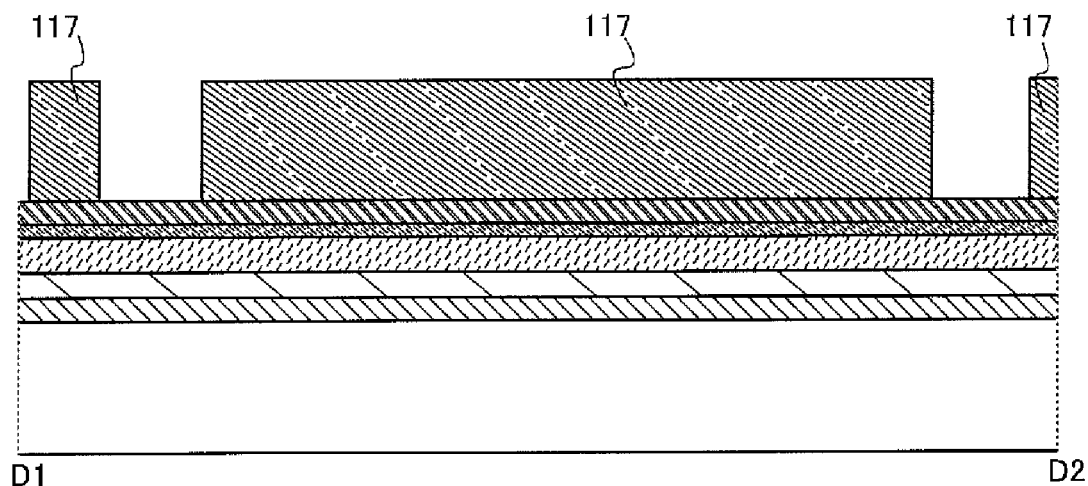
FIGS. 14A to 14C illustrate an example of a manufacturing method of a thin film transistor and a display device.
Figure 14B:
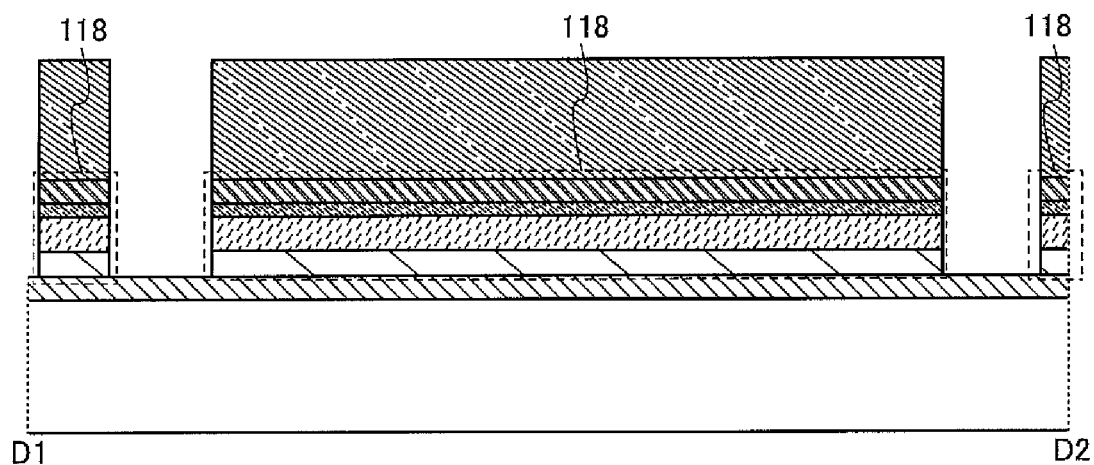
Figure 14C:
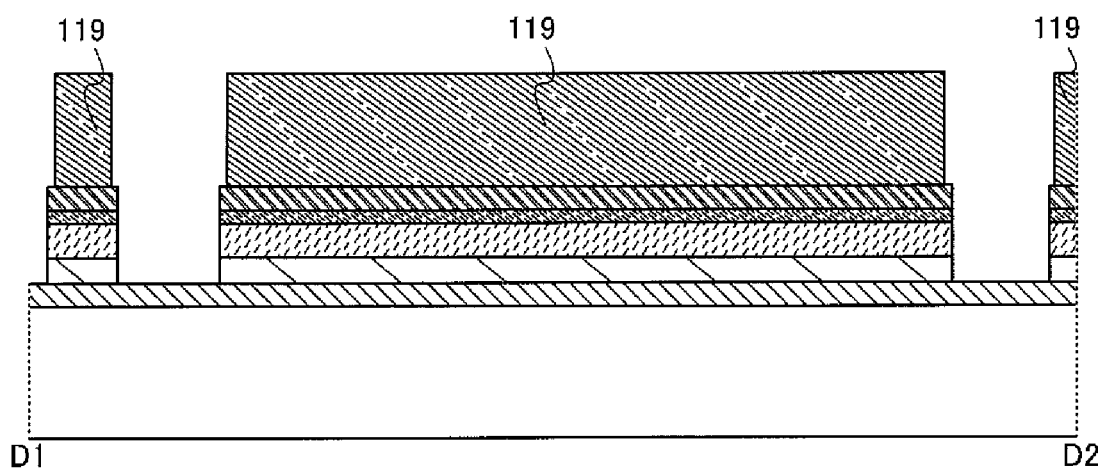
Figure 15A:
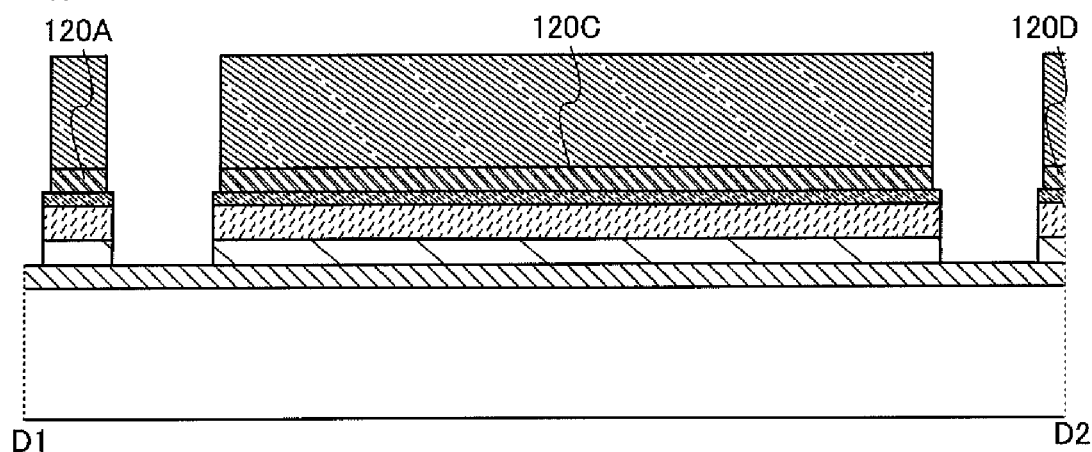
FIGS. 15A to 15C illustrate an example of a manufacturing method of a thin film transistor and a display device.
Figure 15B:
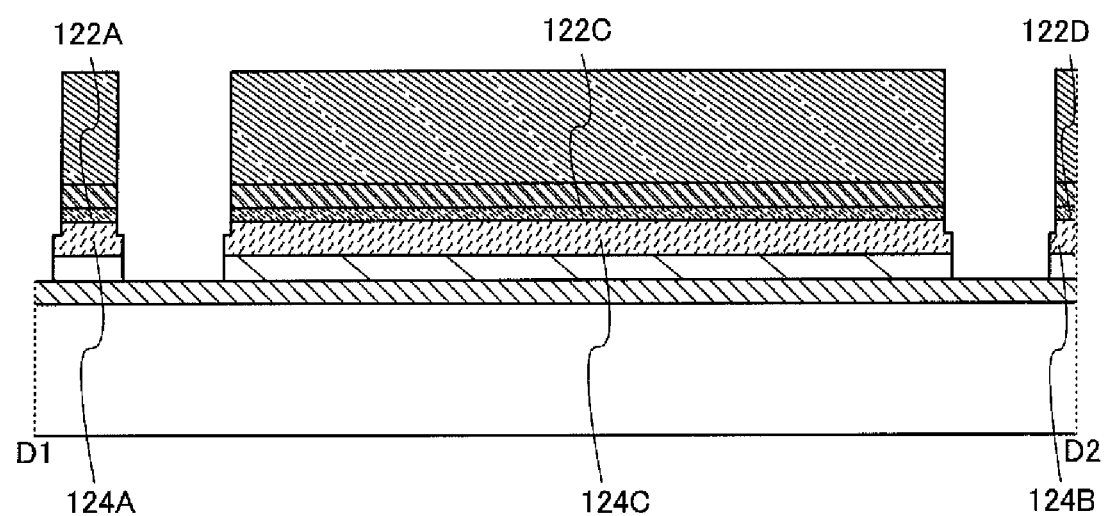
Figure 15C:
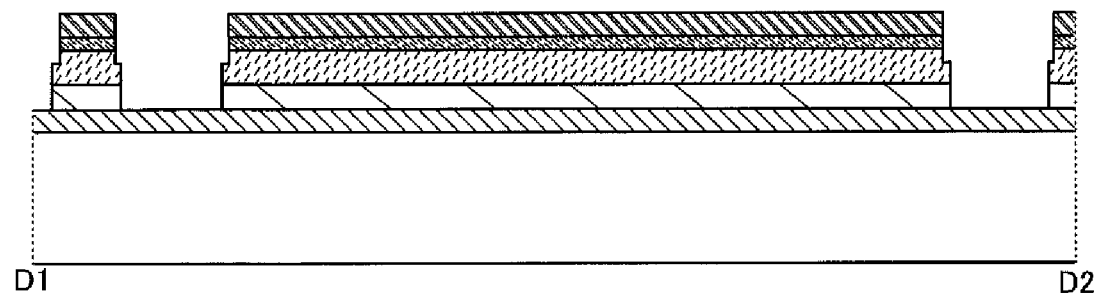
Figure 16A:
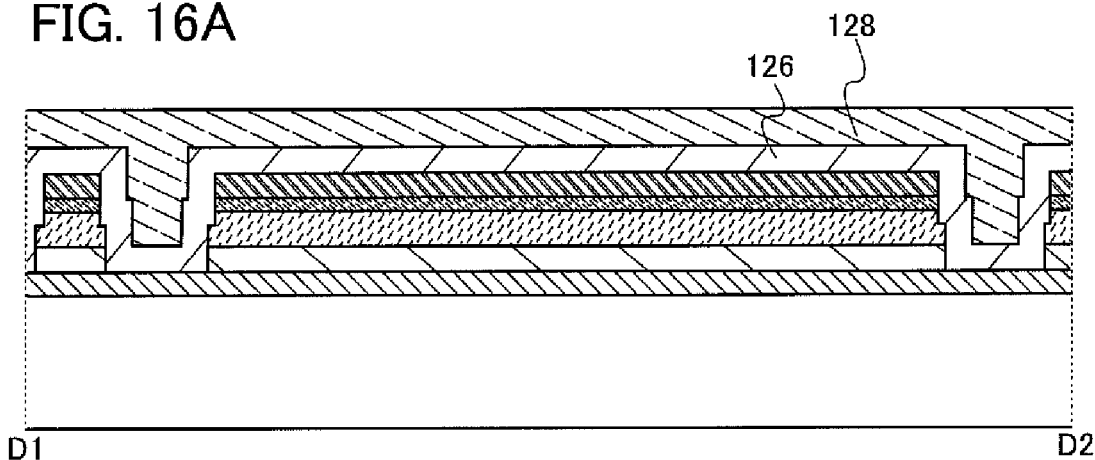
FIGS. 16A to 16C illustrate an example of a manufacturing method of a thin film transistor and a display device.
Figure 16B:
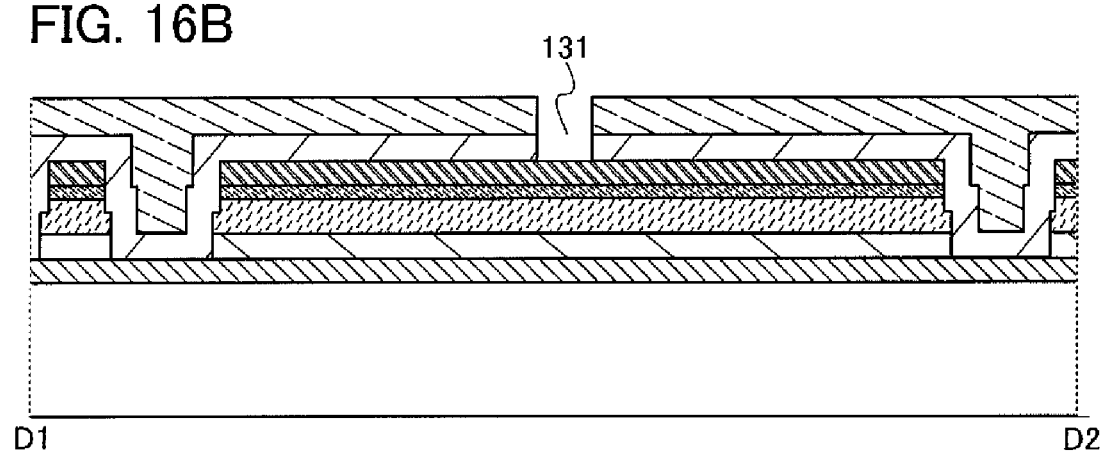
Figure 16C:
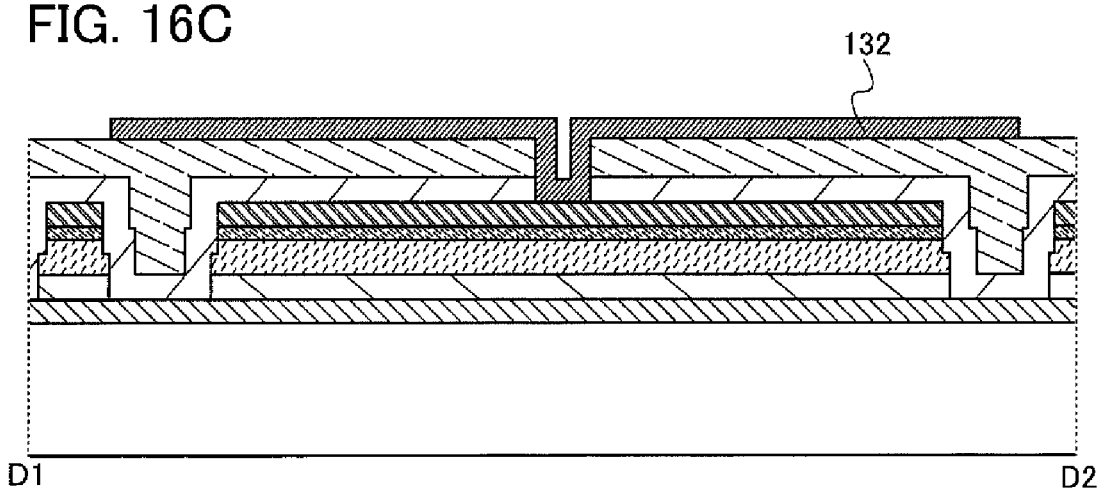
Figure 17A:
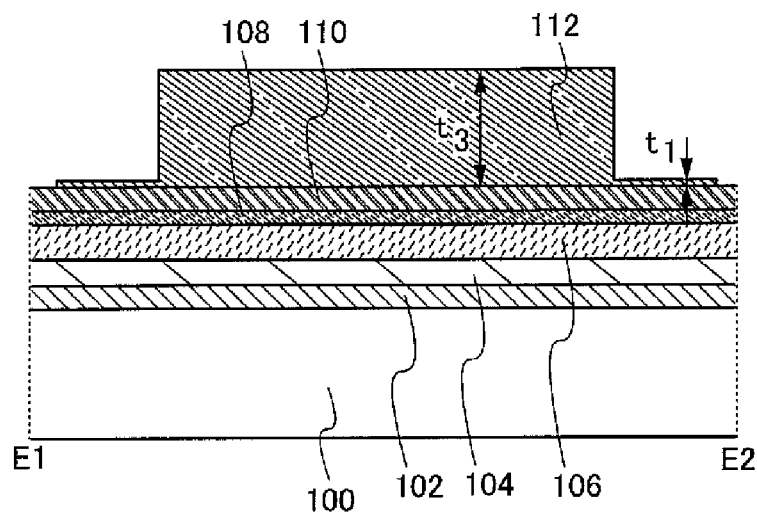
FIGS. 17A to 17C illustrate an example of a manufacturing method of a thin film transistor and a display device.
Figure 17B:
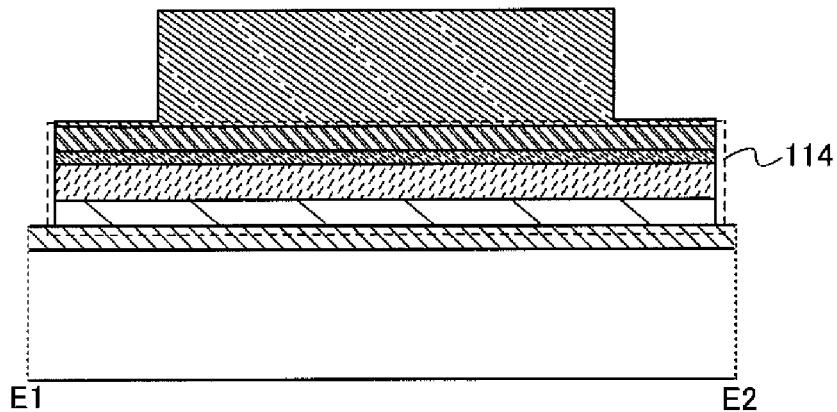
Figure 17C:
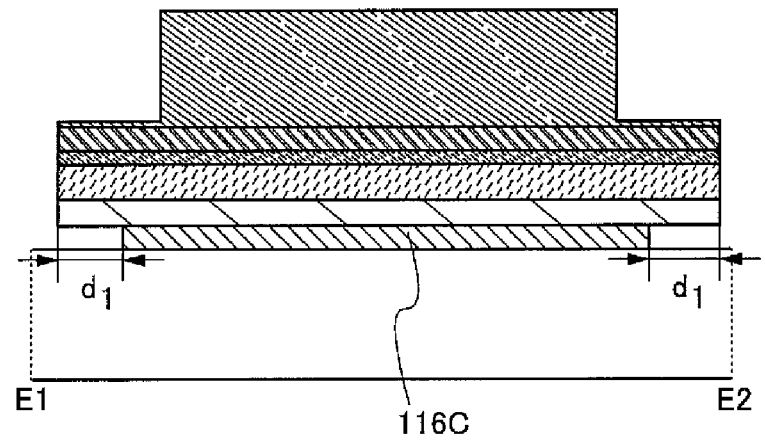
Figure 18A:
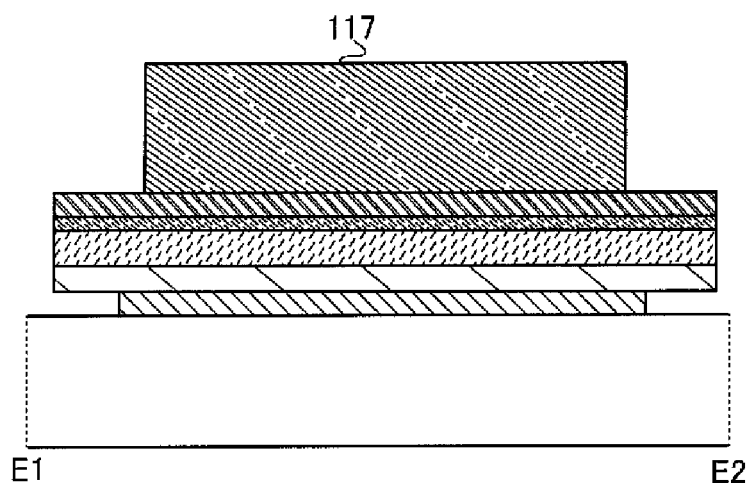
FIGS. 18A to 18C illustrate an example of a manufacturing method of a thin film transistor and a display device.
Figure 18B:
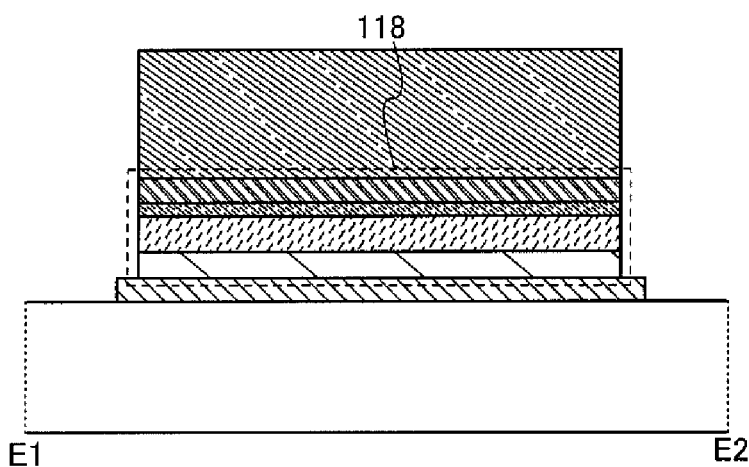
Figure 18C:
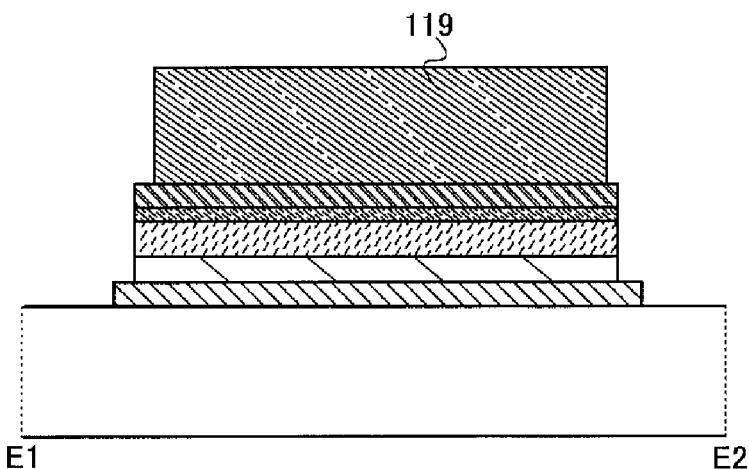
Figure 19A:
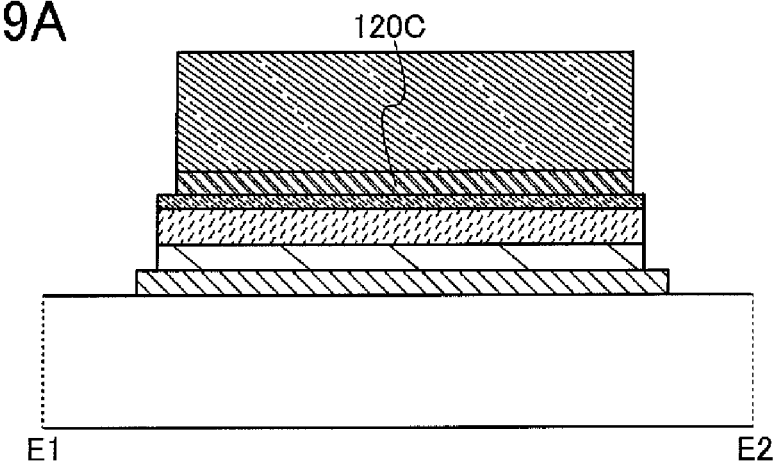
FIGS. 19A to 19C illustrate an example of a manufacturing method of a thin film transistor and a display device.
Figure 19B:
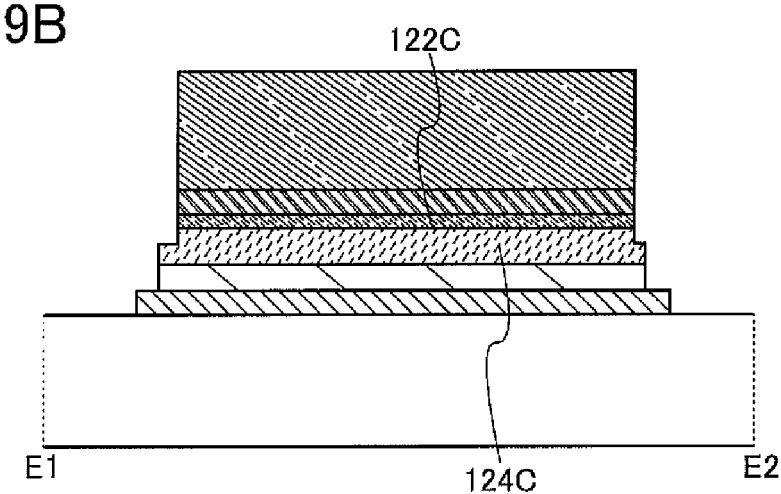
Figure 19C:
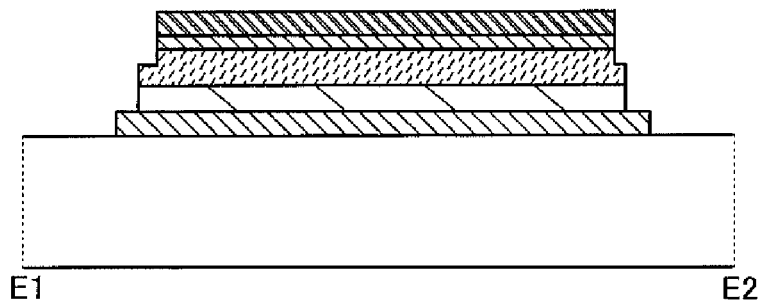
Figure 20A:
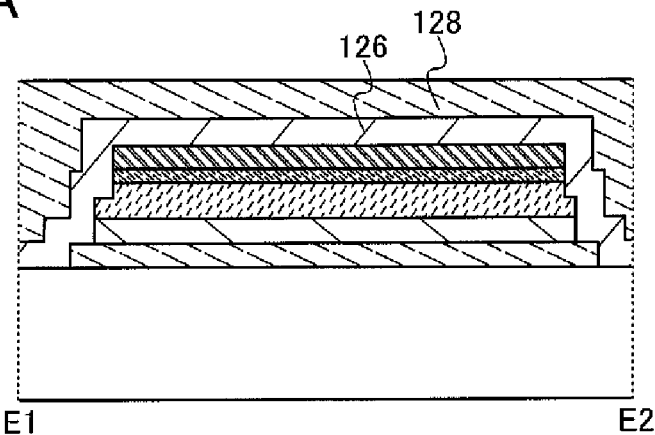
FIGS. 20A to 20C illustrate an example of a manufacturing method of a thin film transistor and a display device.
Figure 20B:
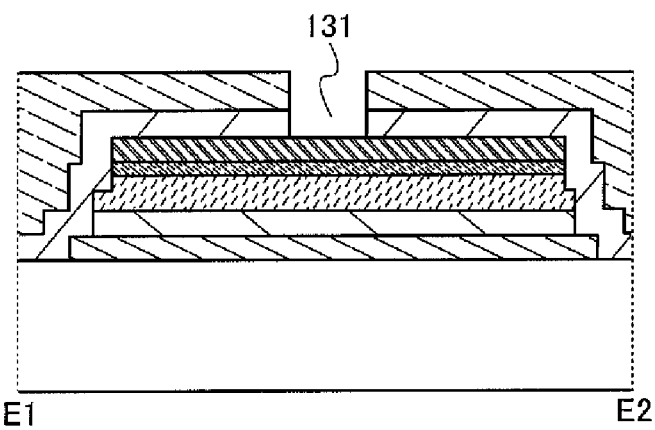
Figure 20C:
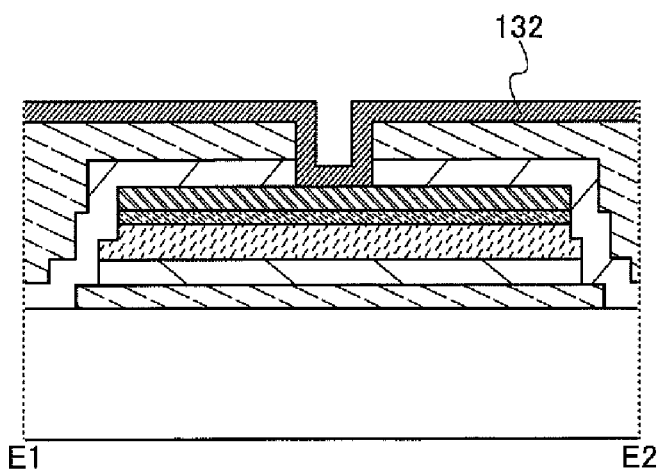
Figure 21:
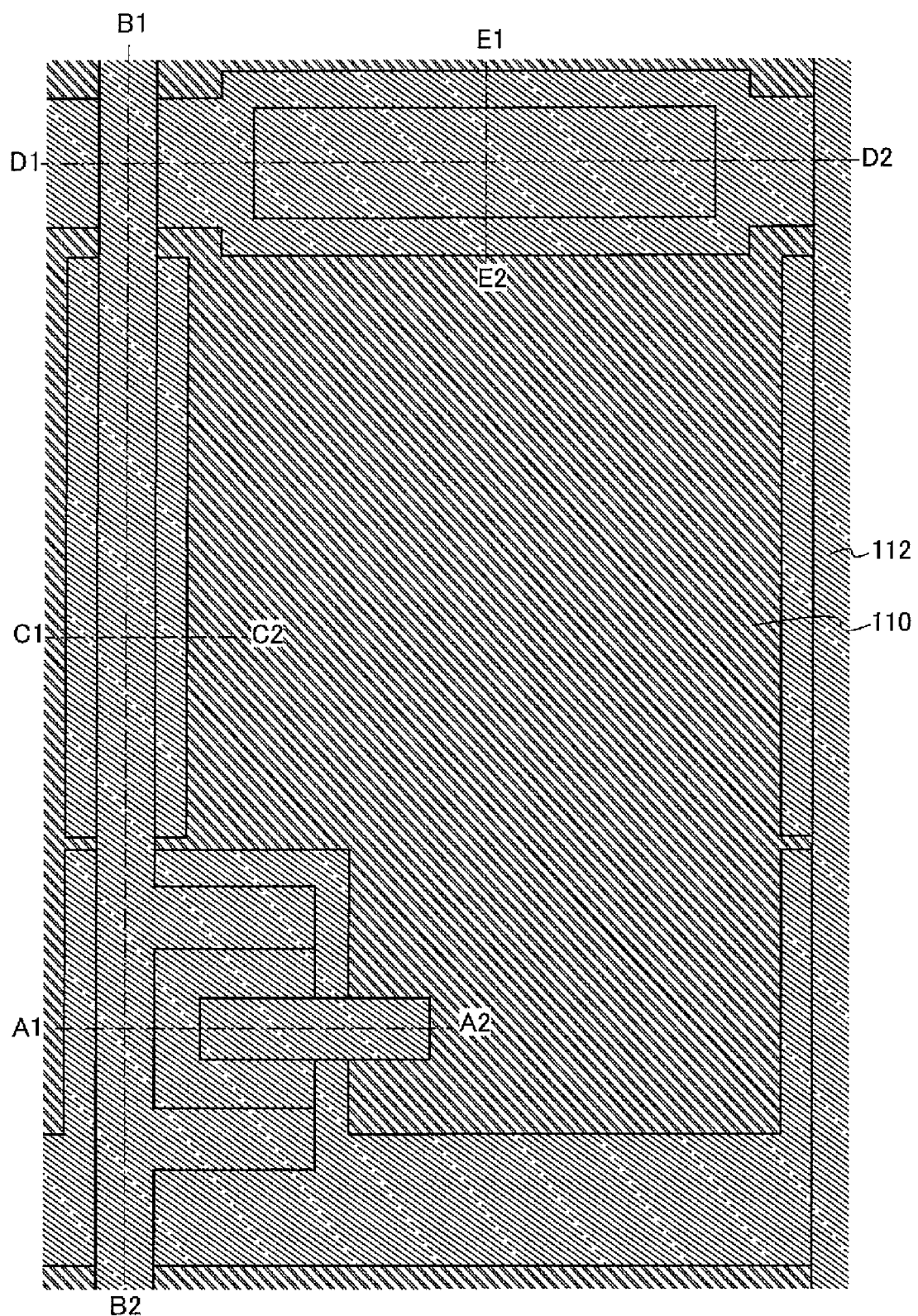
FIG. 21 illustrates an example of a manufacturing method of a thin film transistor and a display device.
Figure 22:
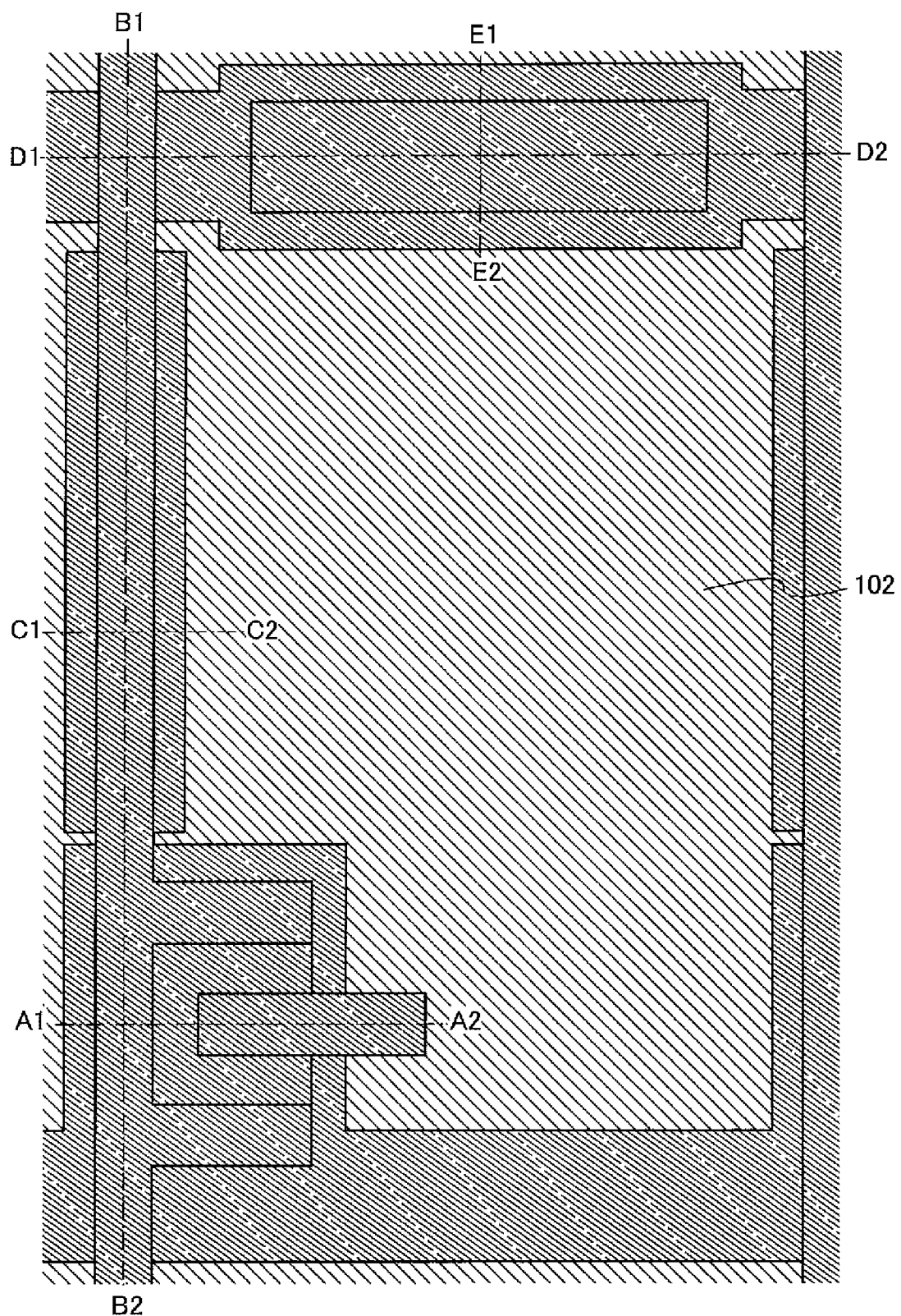
FIG. 22 illustrates an example of a manufacturing method of a thin film transistor and a display device.
Figure 23:
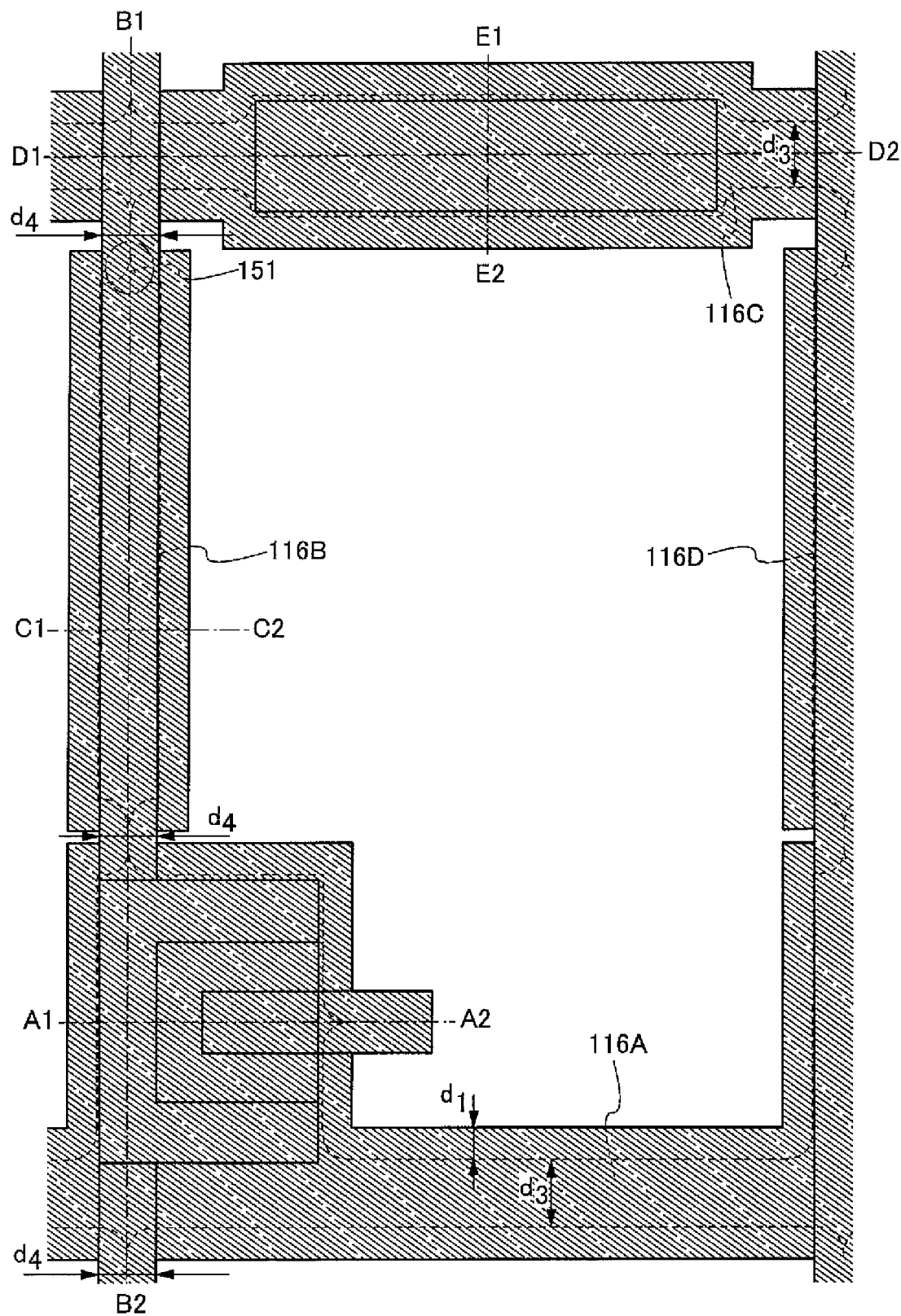
FIG. 23 illustrates an example of a manufacturing method of a thin film transistor and a display device.
Figure 24:
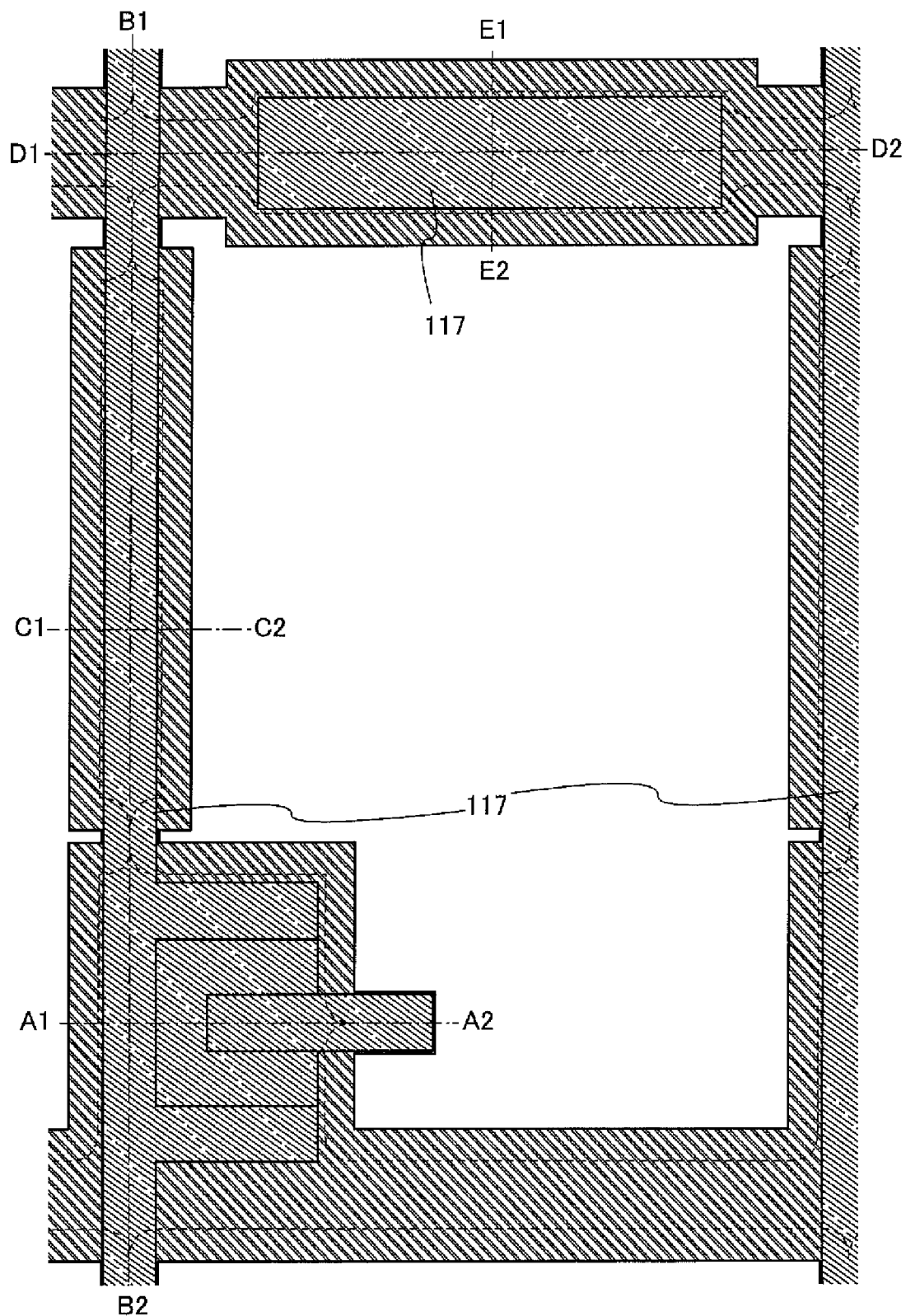
FIG. 24 illustrates an example of a manufacturing method of a thin film transistor and a display device.
Figure 25:
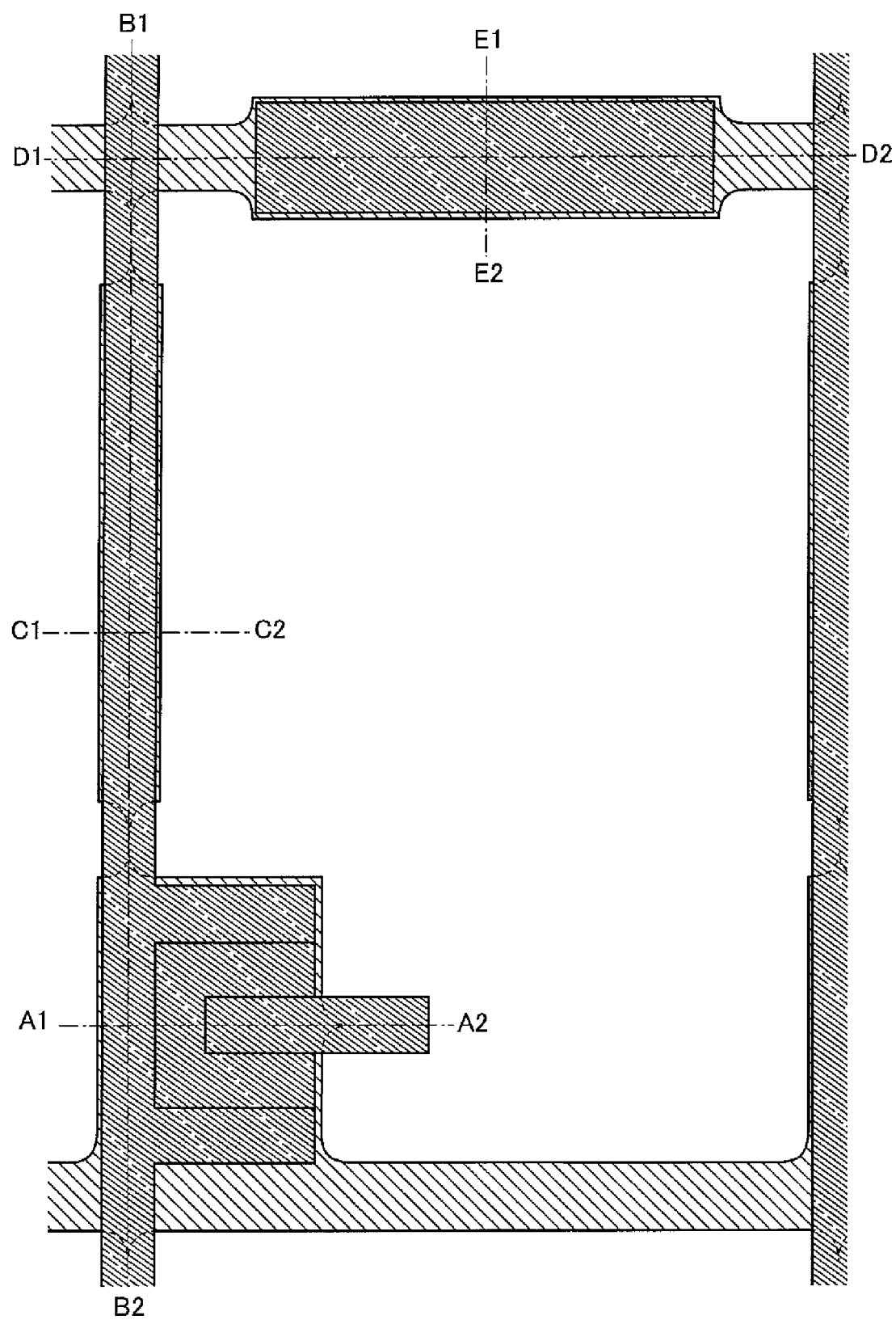
FIG. 25 illustrates an example of a manufacturing method of a thin film transistor and a display device.
Figure 26:
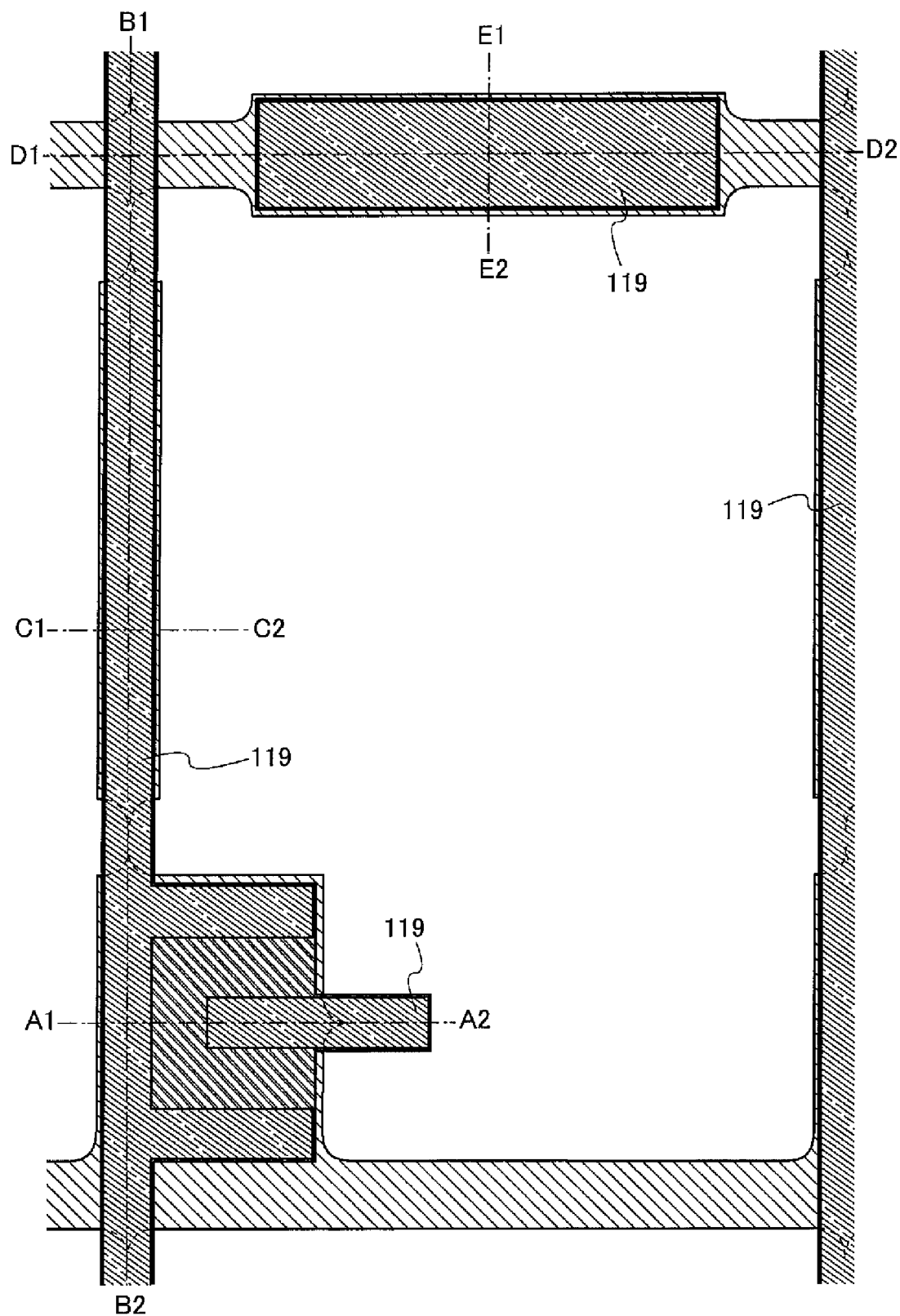
FIG. 26 illustrates an example of a manufacturing method of a thin film transistor and a display device.
Figure 27:
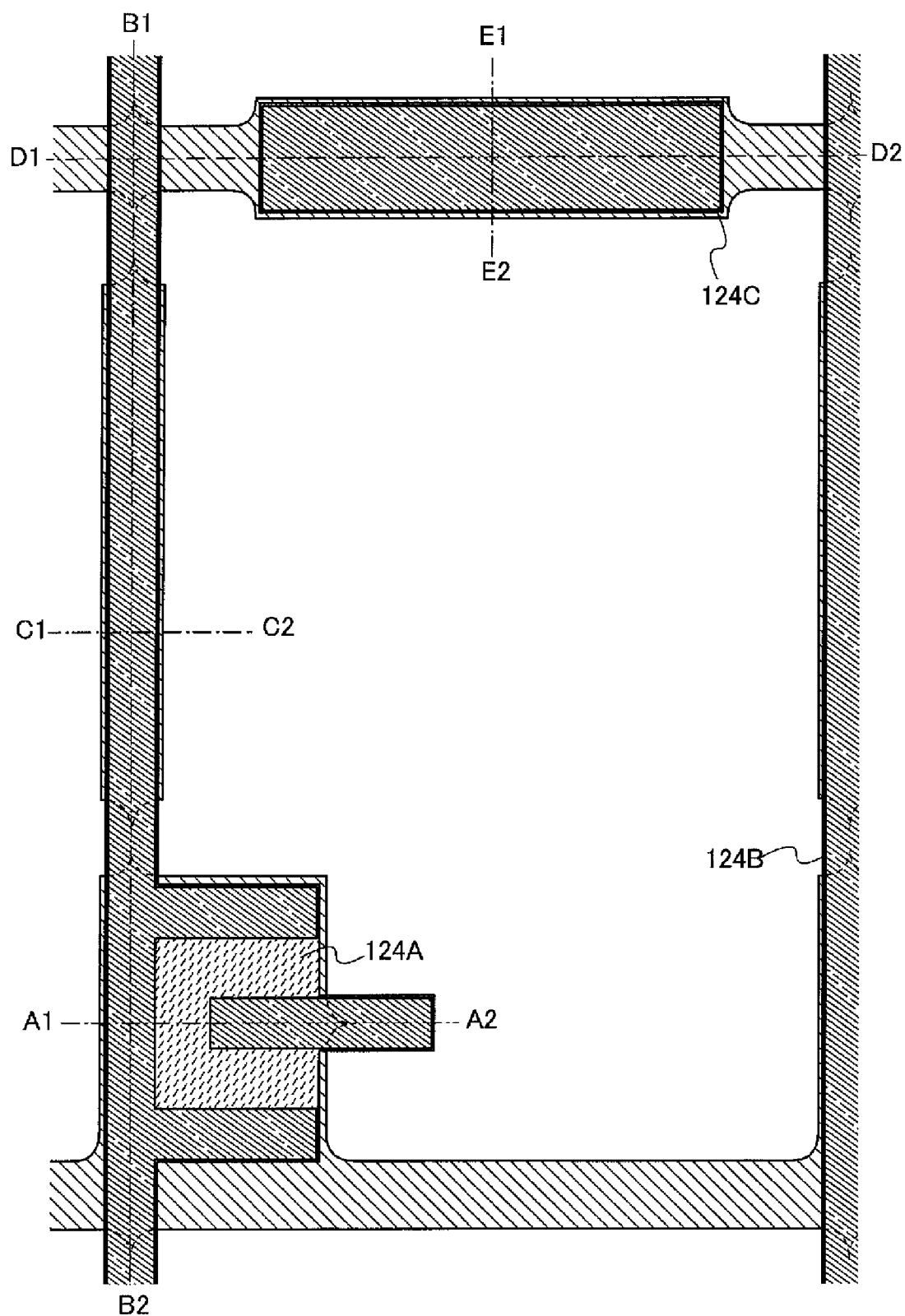
FIG. 27 illustrates an example of a manufacturing method of a thin film transistor and a display device.
Figure 28:
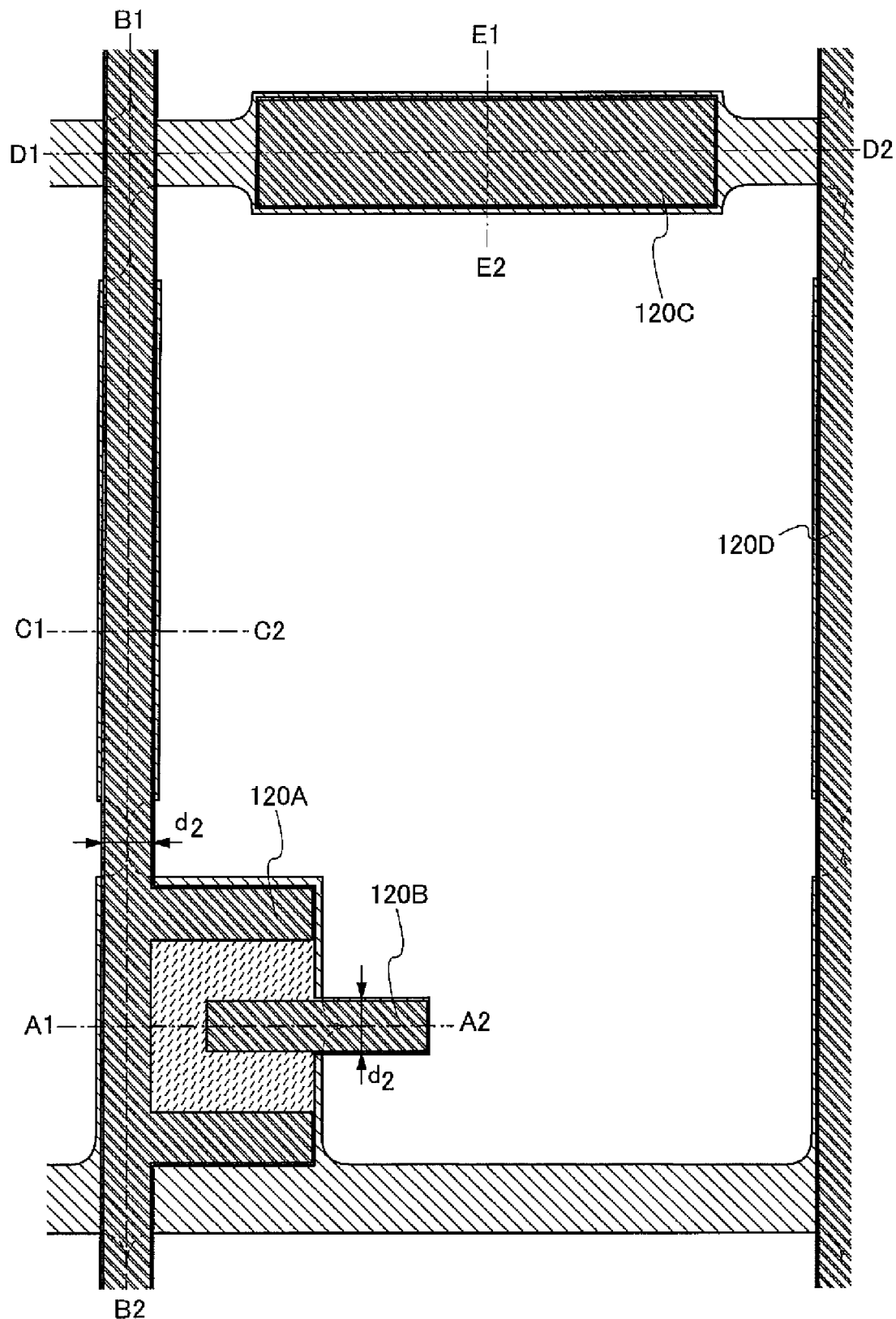
FIG. 28 illustrates an example of a manufacturing method of a thin film transistor and a display device.

The first requirement is that the gate electrode layer 116 is left at places necessarily provided with the gate electrode layer 116. The places necessarily provided with the gate electrode layer 116 are regions indicated by dotted lines in FIG. 23 or the like. That is, it is necessary that the gate electrode layer 116 is left so as to form a gate wiring, a capacitor wiring, and a supporting portion after the second etching. In order that the gate electrode layer forms the gate wiring and the capacitor wiring, the second etching should be performed so as not to disconnect these wirings. For example, as illustrated in FIG. 1C and FIG. 23, the side surface of the gate electrode layer 116 may be more on the inside than the side surface of the first thin-film stack body 114 by a distance $d_1$ by the second etching, and the distance $d_1$ may be set as appropriate by a practitioner according to the layout.

The second requirement is that a minimum width $d_3$ of the gate wiring or the capacitor wiring which is formed by the gate electrode layer 116 and a minimum width $d_2$ of a source wiring formed by a source and drain electrode layer 120A have appropriate values. This is because as the second conductive film 110 is etched more by the second etching, the minimum width $d_2$ of the source wiring is reduced; accordingly, the current density of the source wiring becomes excessive and electric characteristics are degraded. Therefore, the second etching is performed under the conditions that the etching rate of the first conductive film 102 is not too high and the etching rate of the second conductive film 110 is as low as possible.

It is acceptable as long as there is at least one portion where the width of the semiconductor layer overlapping with the source wiring is a minimum width $d_4$ between the gate wiring and the capacitor wiring which is adjacent to the gate wiring. It is preferable that the width of the semiconductor layer between the gate wiring and the supporting portion and between the capacitor wiring and the supporting portion be the minimum width $d_4$ as illustrated in FIG. 23. Note that the minimum width $d_4$ of the semiconductor layer is set smaller than about twice the distance $d_1$. In other words, the distance $d_1$ is set larger than about half the minimum width $d_4$ of the semiconductor layer.

In addition, the width of the electrode in a portion connected to a pixel electrode layer, which is formed of the source and drain electrode layer, be equal to the minimum width $d_2$ of the source wiring.

As described above, the second etching under the condition in which side-etching is performed is very important. This is because by the second etching in which the first conductive film 102 is side-etched, the gate wiring and capacitor wiring, which are adjacent to each other and are formed with the gate electrode layer 116, can be formed to be insulated from each other (see FIG. 23). Here, since the second etching is etching in which side-etching is performed, the second etching proceeds in a substantially isotropic manner.

Here, "side-etching" means etching in which a film is etched in not only a thickness direction of the film to be etched (a direction perpendicular to a substrate surface or a direction perpendicular to a base surface of the film to be etched) but also in a direction perpendicular to the thickness direction (a direction parallel to the substrate surface or a direction parallel to the base surface of the film to be etched). An end portion of the film subjected to side-etching can have various shapes depending on the etching rate of an etching gas or a chemical solution used for the etching with respect to the film to be etched. The end portion of the film is, in many cases, formed with a curved surface.

By forming the gate electrode layer 116 using side-etching, an additional photomask does not have to be used for formation of the gate electrode layer 116.

As illustrated in FIG. 23, the first thin-film stack body 114 formed by the first etching is designed to be thin in a portion adjacent to a supporting portion which is formed by the gate electrode layer 116B or the gate electrode layer 116D. With this structure, the gate electrode layer 116A and the gate electrode layer 116B or the gate electrode layer 116D can be disconnected to be insulated from each other by the second etching.

The gate electrode layer 116B and the gate electrode layer 116D which are illustrated in FIG. 23 each serve as a supporting portion which supports the first thin-film stack body 114. By the existence of the supporting portion, peeling of a film such as a gate insulating film formed over the gate electrode layer can be prevented. In addition, by providing the supporting portion, the semiconductor layer in a region overlapping with the supporting portion can be light-shielded. However, an embodiment of the present invention is not limited thereto, and the supporting portion is not necessarily provided.

As the second etching, either dry etching or wet etching may be employed and a highly isotropic etching method (chemical etching) is preferably employed as described above. By employing a highly isotropic etching method (chemical etching) as the second etching, the first conductive film can be selectively side-etched. In the second etching, the first conductive film should be side-etched. Therefore, it is preferable to employ wet etching as the second etching.

In the case where the second etching is performed by wet etching, aluminum or molybdenum may be deposited as the first conductive film 102, titanium or tungsten may be deposited as the second conductive film 110, and a chemical solution containing nitric acid, acetic acid, and phosphoric acid may be used for an etchant. Alternatively, molybdenum may be deposited as the first conductive film 102, titanium, aluminum, or tungsten may be deposited as the second conductive film 110, and a chemical solution containing hydrogen peroxide water may be used for an etchant.

In the case where the second etching is performed by wet etching, it is most preferable that a stacked film in which molybdenum is deposited over aluminum to which neodymium is added be formed as the first conductive film 102, tungsten be deposited as the second conductive film 110, and a chemical solution containing nitric acid at 2%, acetic acid at 10%, and phosphoric acid at 72% be used for an etchant. By usage of a chemical solution having such a composition ratio, the first conductive film 102 can be etched without the second conductive film 110 being etched. Note that neodymium is added to the first conductive film 102 for the purpose of reducing resistance of aluminum and preventing hillocks.

As illustrated in FIG. 23, the gate electrode layer 116 has a horn (e.g., a horn 151) when seen from the above. This is because since the second etching for forming the gate electrode layer 116 is almost isotropic, etching is performed so that the distance $d_1$ between the side surface of the gate electrode layer 116 and the side surface of the first thin-film stack body 114 is almost uniform.

Next, the first resist mask 112 is made to recede (reduce); accordingly, the second conductive film 110 in a region overlapping with the first region of the first resist mask 112 is exposed and a second resist mask 117 is formed (see FIG. 2A, FIG. 6A, FIG. 10A, FIG. 14A, FIG. 18A, and FIG. 24). As means for forming the second resist mask 117 by recession (reduction) of the first resist mask 112, for example, ashing using oxygen plasma can be given. However, the means for forming the second resist mask 117 by recession (reduction) of the first resist mask 112 is not limited to this. Note that the case where the second resist mask 117 is formed after the second etching has been described here; however, an embodiment of the present invention is not limited to this and the second etching may be performed after formation of the second resist mask 117.

Next, the first insulating film 104, the semiconductor film 106, the impurity semiconductor film 108, and the second conductive film 110, in a region overlapping with the first region of the first resist mask 112, are etched using the second resist mask 117. This etching step is called third etching. The third etching may be performed in a similar manner to the first etching. A second thin-film stack body 118 can be formed by the third etching (see FIG. 2B, FIG. 6B, FIG. 10B, FIG. 14B, FIG. 18B, and FIG. 25). Here, as the etching conditions, the conditions by which films other than the first insulating film 104, the semiconductor film 106, the impurity semiconductor film 108, and the second conductive film 110 are not unintentionally etched or eroded or are not easily unintentionally etched or eroded are selected. In particular, it is important that etching is performed under the conditions that the gate electrode layer 116 is not unintentionally etched or eroded or is not easily unintentionally etched or eroded.

Next, the second resist mask 117 is made to recede (reduce); accordingly, the second conductive film 110 in a region overlapping with the second region is exposed and a third resist mask 119 is formed (see FIG. 2C, FIG. 6C, FIG. 10C, FIG. 14C, FIG. 18C, and FIG. 26).

Next, the second conductive film 110 in the second thin-film stack body 118 is etched using the third resist mask 119, so that the source and drain electrode layer 120 is formed (see FIG. 3A, FIG. 7A, FIG. 11A, FIG. 15A, and FIG. 19A). Here, as the etching conditions, the conditions by which films other than the second conductive film 110 are not unintentionally etched or eroded or are not easily unintentionally etched or eroded are selected. In particular, it is important that etching is performed under the conditions that the gate electrode layer 116 is not unintentionally etched or eroded or is not easily unintentionally etched or eroded.

Note that the source and drain electrode layer 120 forms the source electrode and the drain electrode of a thin film transistor, the source wiring, the electrode which connects the thin film transistor and the pixel electrode to each other, and the other electrode of the capacitor functioning as a storage capacitor. When a source and drain electrode layer is referred to as the source and drain electrode layer 120A or a source and drain electrode layer 120D, the source and drain electrode layer forms one of a source electrode and a drain electrode of a thin film transistor or a source wiring. When a source and drain electrode layer is referred to as a source and drain electrode layer 120B, the source and drain electrode layer forms the other of the source electrode and the drain electrode of the thin film transistor and an electrode which connects the thin film transistor and the pixel electrode to each other. When a source and drain electrode layer is referred to as a source and drain electrode layer 120C, the source and drain electrode layer forms the other electrode of the capacitor. Then, these source and drain electrode layers are collectively referred to as the source and drain electrode layer 120.

Note that, for etching the second conductive film 110 in the second thin-film stack body 118, either wet etching or dry etching may be performed.

Then, the impurity semiconductor film 108 and an upper portion (back channel portion) of the semiconductor film 106 in the second thin-film stack body 118 are etched to form a source and drain region 122 using the third resist mask 119 (see FIG. 3B, FIG. 7B, FIG. 11B, FIG. 15B, FIG. 19B, and FIG. 27). At the same time, the semiconductor layer 124 is formed. The semiconductor layer 124 is provided with a semiconductor layer 124A and a semiconductor layer 124B, and the semiconductor layer 124A and the semiconductor layer 124B are separated from each other.

The etching step in which the source and drain electrode layer 120 and the source and drain region 122 are formed is called fourth etching. The fourth etching may be performed in a similar manner to the first etching or the third etching. This is because a layer to be etched in the fourth etching corresponds to a part of the layer to be etched in the first etching and the third etching. Here, as the etching conditions, the conditions by which films other than the impurity semiconductor film 108 and the semiconductor film 106 are not unintentionally etched or eroded or are not easily unintentionally etched or eroded are selected. In particular, it is important that etching is performed under the conditions that the gate electrode layer 116 is not unintentionally etched or eroded or is not easily unintentionally etched or eroded.

Then, the third resist mask 119 is removed to complete a thin film transistor (see FIG. 3C, FIG. 7C, FIG. 11C, FIG. 15C, FIG. 19C, and FIG. 28). As described above, the thin film transistor can be manufactured using one photomask (multi-tone mask).

A second insulating film is formed to cover the thin film transistor which is manufactured in the above-described manner. Although the second insulating film may be formed of only the first protective film 126, the second insulating film is formed of the first protective film 126 and a second protective film 128 here (see FIG. 4A, FIG. 8A, FIG. 12A, FIG. 16A, and FIG. 20A). The first protective film 126 may be formed in a similar manner to the first insulating film 104.

The second protective film 128 is formed by a method by which the surface thereof becomes almost planar. This is because when the surface of the second protective film 128 is almost planar, disconnection or the like of a pixel electrode layer 132 formed over the second protective film 128 can be prevented. Accordingly, the phrase "almost planar" means planar in such an extent that the aforementioned aim can be achieved, and does not mean that high planarity is required.

The second protective film 128 can be formed, for example, by a spin coating method or the like using photosensitive polyimide, acrylic, epoxy resin, or the like. Note that an embodiment of the present invention is not limited to these materials and the formation method.

Next, a first opening portion 130 and a second opening portion 131 are formed in the second insulating film (see FIG. 4B, FIG. 8B, FIG. 12B, FIG. 16B, and FIG. 20B). The first opening portion 130 and the second opening portion 131 are formed so as to reach at least a surface of the source and drain electrode layer 120. The formation method of the first opening portion 130 and the second opening portion 131 is not limited to a particular method and may be determined as appropriate by a practitioner in accordance with the diameter of the first opening portion 130 or the like. For example, the first opening portion 130 and the second opening portion 131 can be formed by dry etching using photolithography.

Note that in the case of forming the opening portions by photolithography, one photomask is used.

Next, the pixel electrode layer 132 is formed over the second insulating film (see FIG. 4C, FIG. 8C, FIG. 12C, FIG. 16C, FIG. 20C, and FIG. 29). The pixel electrode layer 132 is formed so as to be connected to the source and drain electrode layer 120 through the opening portions. Specifically, the pixel electrode layer 132 is formed so as to be connected to the source and drain electrode layer 120B through the first opening portion 130 and connected to the source and drain electrode layer 120C through the second opening portion 131. The pixel electrode layer 132 is preferably formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like may be given. The film of the conductive material having a light-transmitting property may be formed by a sputtering method, a CVD method, or the like; however, an embodiment of the present invention is not limited to a particular method. In addition, the pixel electrode layer 132 may be a single-layer film or a stacked-layer film including a plurality of films.

In this embodiment, only the pixel electrode layer 132 is formed using the conductive material having a light-transmitting property; however, an embodiment of the present invention is not limited to this. As materials of the first conductive film 102 and the second conductive film 110, conductive materials having a light-transmitting property can also be used.

Note that in the case of forming the pixel electrode layer 132 by photolithography, one photomask is used.

In the above-described manner, manufacture of an active matrix substrate (so-called array process) according to this embodiment is completed. As described in this embodiment, the thin film transistor can be manufactured using one photomask in such a manner that the gate electrode layer is formed utilizing side-etching and, further, the source and drain electrode layer is formed using a multi-tone mask.

A large part of the semiconductor layer 124 included in the thin film transistor to which the above-described manufacturing method is applied overlaps with the gate electrode layer 116. Therefore, a large part of the semiconductor layer 124 is light-shielded by the gate electrode layer 116 and generation of light leakage current can be prevented.

Here, a terminal connection portion of the active matrix substrate manufactured in the above-described steps will be described with reference to FIG. 31, FIG. 32, and FIGS. 33A to 33C.

Figure 31:
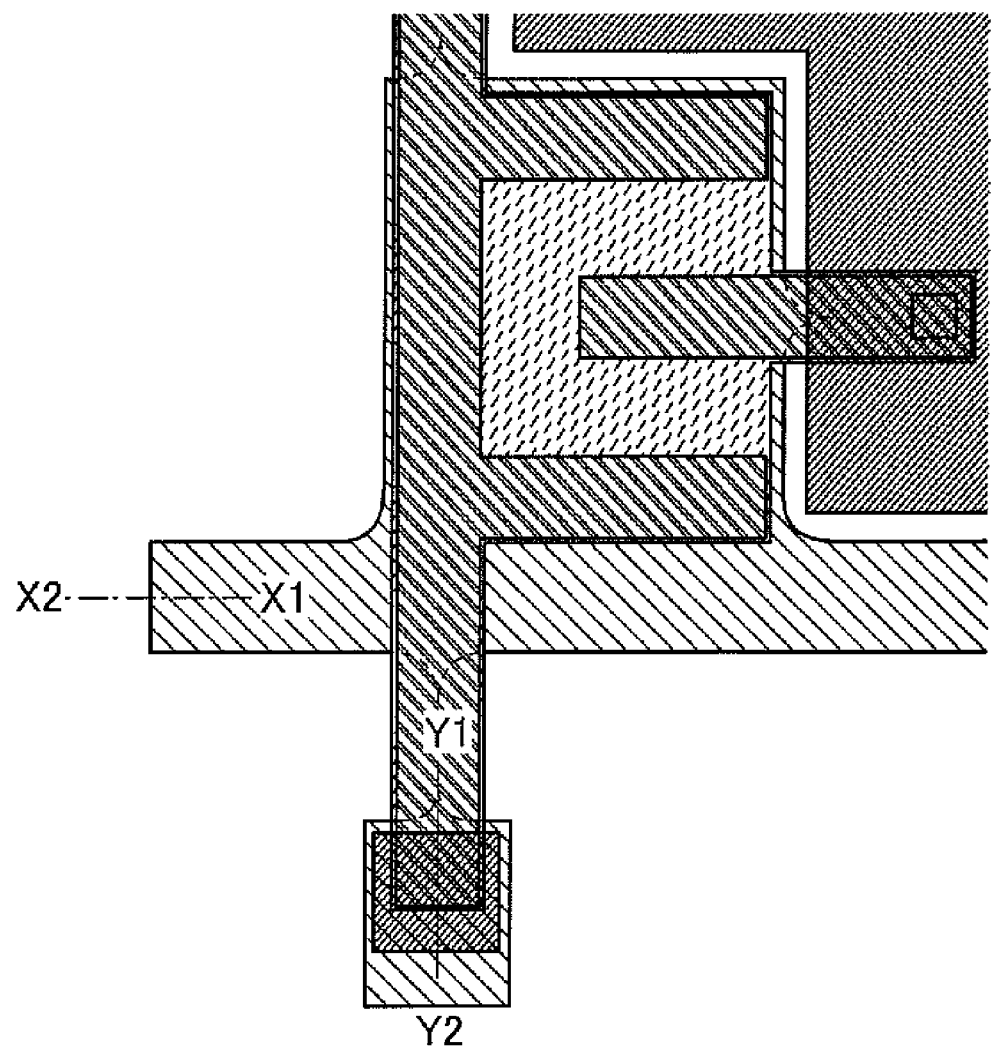
FIG. 31 illustrates a connection portion of an active matrix substrate.

FIG. 31 is a top view and FIG. 32 and FIGS. 33A to 33C are cross-sectional views of a terminal connection portion on the gate wiring side and a terminal connection portion on the source wiring side of the active matrix substrate manufactured in the above-described steps.

FIG. 31 is a top view of the gate wiring and the source wiring extended from the pixel portion, in the terminal connection portion on the gate wiring side and the terminal connection portion on the source wiring side.

Figure 32:
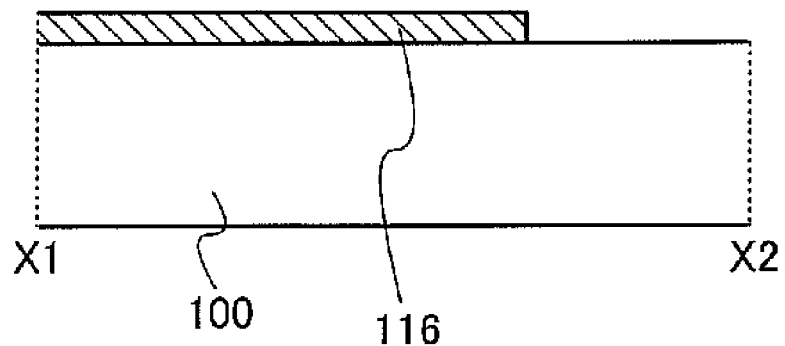
FIG. 32 illustrates a connection portion of an active matrix substrate.

FIG. 32 is a cross-sectional view taken along a line X1-X2 in FIG. 31. That is, FIG. 32 is a cross-sectional view of the terminal connection portion on the gate wiring side. In FIG. 32, only the gate electrode layer 116 is exposed. A terminal portion of an external input terminal is connected to the region in which the gate electrode layer 116 is exposed.

Figure 33A:
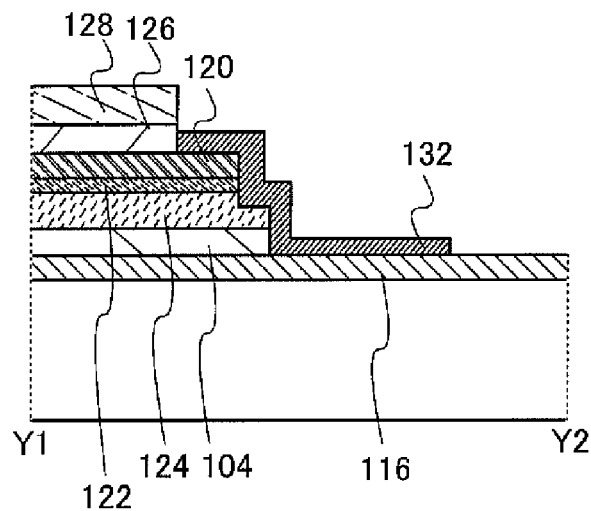
FIGS. 33A to 33C each illustrate a connection portion of an active matrix substrate.
Figure 33B:
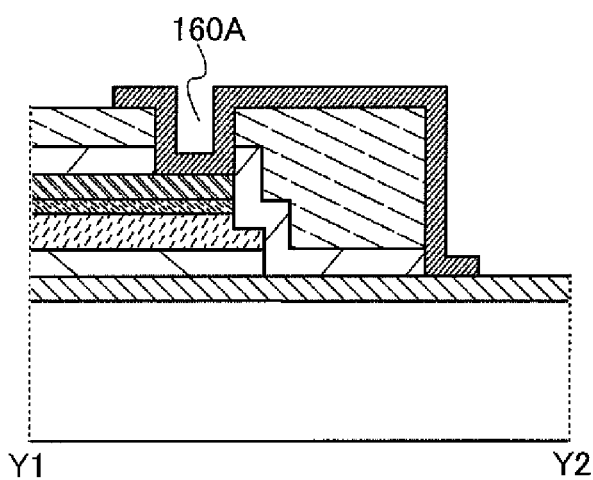
Figure 33C:
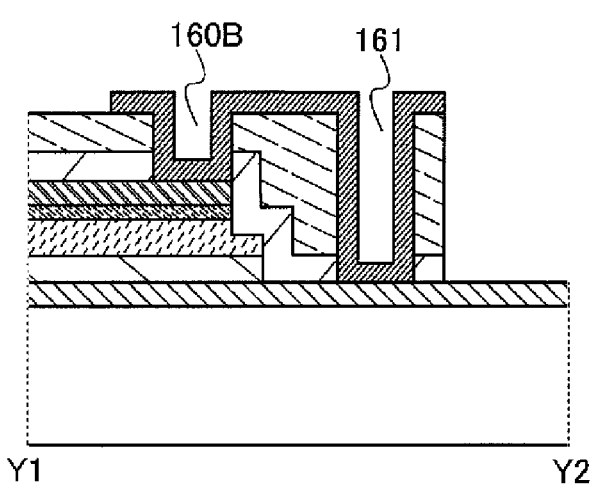

FIGS. 33A to 33C are cross-sectional views taken along a line Y1-Y2 in FIG. 31. That is, FIGS. 33A to 33C are cross-sectional views of the terminal connection portion on the source wiring side. In the cross section along the line Y1-Y2 in FIG. 31, the gate electrode layer 116 and the source and drain electrode layer 120 are connected to each other through the pixel electrode layer 132. FIGS. 33A to 33C illustrate various connection modes between the gate electrode layer 116 and the source and drain electrode layer 120. Any of these modes or modes other than those illustrated in FIGS. 33A to 33C may be used for the terminal connection portion in a display device according to an embodiment of the present invention. By the structure in which the source and drain electrode layer 120 is connected to the gate electrode layer 116, the height of the terminal connection portion can be made almost uniform.

Note that the number of opening portions is not limited to those in FIGS. 33A to 33C. Not only one opening portion but also a plurality of opening portions may be provided for one terminal. In the case where a plurality of opening portions are provided for one terminal, even when any of the opening portions is not formed favorably due to insufficient etching for forming the opening portion, electric connection can be realized at the other opening portion. Further, even in the case where all the opening portions are formed without any problems, the contact area can be made larger and contact resistance can be reduced, which is preferable.

In FIG. 33A, electric connection can be realized in such a manner that end portions of the first protective film 126 and the second protective film 128 are removed by etching or the like to expose the gate electrode layer 116 and the source and drain electrode layer 120, and the pixel electrode layer 132 is formed over the exposed region. FIG. 33A corresponds to a cross-sectional view taken along the line Y1-Y2 in FIG. 31.

Note that the formation of the region in which the gate electrode layer 116 and the source and drain electrode layer 120 are exposed can be performed at the same time as the formation of the first opening portion 130 and the second opening portion 131.

In FIG. 33B, electric connection is realized in such a manner that a third opening portion 160A is provided in the first protective film 126 and the second protective film 128, end portions of the first protective film 126 and the second protective film 128 are removed by etching or the like to expose the gate electrode layer 116 and the source and drain electrode layer 120, and the pixel electrode layer 132 is formed over the exposed region.

Note that the formation of the third opening portion 160A and the formation of the region in which the gate electrode layer 116 is exposed can be performed at the same time as the formation of the first opening portion 130 and the second opening portion 131.

In FIG. 33C, electric connection is realized in such a manner that a third opening portion 160B and a fourth opening portion 161 are provided in the first protective film 126 and the second protective film 128 to expose the gate electrode layer 116 and the source and drain electrode layer 120, and the pixel electrode layer 132 is formed over the exposed region. Here, end portions of the first protective film 126 and the second protective film 128 are removed by etching or the like similarly to FIGS. 33A and 33B, and this etched region is used as a terminal connection portion.

Note that the formation of the third opening portion 160B and the fourth opening portion 161 and the formation of the region in which the gate electrode layer 116 is exposed can be performed at the same time as the formation of the first opening portion 130 and the second opening portion 131.

Next, a manufacturing method of a liquid crystal display device using the active matrix substrate for a display device, which is manufactured in the above-described steps, will be described. That is, a cell process and a module process will be described. Note that the cell process and the module process are not limited to the following description in the manufacturing method of a display device according to this embodiment.

In the cell process, the active matrix substrate manufactured in the above-described steps and a substrate opposite to the active matrix substrate (hereinafter referred to as an opposite substrate) are attached to each other and liquid crystal is injected. First, a manufacturing method of the opposite substrate will be briefly described below. Note that a film formed on the opposite substrate may be a single-layer film or a stacked-layer film even if not mentioned.

First, a light-shielding layer is formed over a substrate; a color filter layer of any of red, green, and blue is formed over the light-shielding layer; a pixel electrode layer is selectively formed over the color filter layer; and then, a rib is formed over the pixel electrode layer.

As the light-shielding layer, a film of a material having a light-shielding property is selectively formed. As the material having a light-shielding property, for example, an organic resin containing a black resin (carbon black) can be used. Alternatively, a stacked film which includes a film of a material containing chromium as its main component may be used. The film of a material containing chromium as its main component means a film containing chromium, chromium oxide, or chromium nitride. The material used for the light-shielding layer is not particularly limited as long as it has a light-shielding property. In order to selectively form the film of a material having a light-shielding property, photolithography or the like is employed.

The color filter layer may be selectively formed using an organic resin film which transmits only light with any of red, green, and blue when irradiated with white light from a backlight. The color filter layer can be selectively formed by selective formation of color materials. The arrangement of the color filter may be a stripe arrangement, a delta arrangement, or a square arrangement.

The pixel electrode layer on the opposite substrate can be formed in a similar manner to the pixel electrode layer 132 included in the active matrix substrate. Note that, since selective formation is not necessary, the pixel electrode layer may be formed over the entire surface of the opposite substrate.

The rib formed over the pixel electrode layer is an organic resin film formed with a pattern for the purpose of widening the viewing angle. Note that the rib does not have to be formed if not particularly necessary.

As the manufacturing method of the opposite substrate, there are other various modes. For example, after formation of the color filter layer and before formation of the pixel electrode layer, an overcoat layer may be formed. By formation of the overcoat layer, planarity of a surface on which the pixel electrode layer is formed can be improved, thereby increasing yield. In addition, part of a material included in the color filter layer can be prevented from entering a liquid crystal material. For the overcoat layer, a thermosetting material containing acrylic resin or epoxy resin as a base is used.

Further, before or after formation of the rib, a post spacer (columnar spacer) may be formed as a spacer. The post spacer means a structural object formed at a constant interval on the opposite substrate in order to keep the gap between the active matrix substrate and the opposite substrate constant. In the case of using a bead spacer (spherical spacer), the post spacer does not have to be formed.

Next, an alignment film is formed on the active matrix substrate and the opposite substrate. Formation of the alignment film is performed, for example, in such a manner that polyimide resin or the like is melted in an organic solvent; this solution is applied by a printing method, a spin coating method, or the like; and then the substrate is baked after the organic solvent is removed. The thickness of the formed alignment film is generally approximately 50 nm to 100 nm. Rubbing treatment is performed on the alignment film to align liquid crystal molecules with a certain pretilt angle. The rubbing treatment is performed, for example, by rubbing an alignment film with a shaggy cloth such as a velvet.

Then, the active matrix substrate and the opposite substrate are attached with a sealant. In the case where a post spacer is not provided on the opposite substrate, a bead spacer may be dispersed in a desired region and attachment may be performed.

Next, a liquid crystal material is injected by dropping or the like in a space between the active matrix substrate and the opposite substrate, which are attached to each other. After injection of the liquid crystal material, an inlet for injection is sealed with an ultraviolet curing resin or the like. Alternatively, after dropping a liquid crystal material, the active matrix substrate and the opposite substrate may be attached to each other.

Next, a polarizing plate is attached to both surfaces of a liquid crystal cell, which is formed by attachment of the active matrix substrate and the opposite substrate. Then, the cell process is finished.

Next, as the module process, a flexible printed circuit (FPC) is connected as an external input terminal to an input terminal (in FIGS. 33A to 33C, the exposed region of the gate electrode layer 116) of the terminal portion. The FPC has a wiring formed of a conductive film over an organic resin film of polyimide or the like, and is connected to the input terminal through an anisotropic conductive paste (hereinafter referred to as an ACP). The ACP includes a paste functioning as an adhesive and particles plated with gold or the like to have a conductive surface, which have a diameter of several tens of micrometers to several hundreds of micrometers. When the particles mixed in the paste are in contact with the conductive layer over the input terminal and the conductive layer over the terminal connected to the wiring formed in the FPC, electric connection therebetween is realized. Alternatively, after connection of the FPC, a polarizing plate may be attached to the active matrix substrate and the opposite substrate. In the above-described manner, a liquid crystal panel used for a display device can be manufactured.

As described above, the active matrix substrate including a pixel transistor, which is used for a display device, can be manufactured using three photomasks.

As described above, an additional photomask does not have to be used in patterning the gate electrode layer, the number of steps for manufacturing a thin film transistor can be significantly reduced, and the thin film transistor can be applied to a display device; therefore, the number of steps for manufacturing a display device can be significantly reduced.

It is also possible to manufacture a thin film transistor using one photomask (multi-tone mask). Accordingly, the number of steps for manufacturing a thin film transistor or a display device can be significantly reduced. Further, since a thin film transistor can be manufactured using one photomask, misalignment can be prevented in alignment of a photomask.

In addition, a complicated step using backside light exposure, resist reflow, a lift-off method, or the like is not needed unlike the conventional technique which is aimed at reducing the number of photomasks. Therefore, the number of steps for manufacturing a display device can be significantly reduced without reducing yield.

Moreover, the number of steps for manufacturing a thin film transistor can be significantly reduced while electric characteristics of the thin film transistor are maintained. Therefore, the number of steps for manufacturing a display device can be significantly reduced without sacrificing display quality of the display device or the like.

Furthermore, by the aforementioned effects, manufacturing cost of a thin film transistor and a display device can be significantly reduced.

In a thin film transistor which is an embodiment of the present invention, a large part of a semiconductor layer is light-shielded by a gate electrode layer. In particular, the semiconductor layer included in the thin film transistor is light-shielded by the gate electrode layer. Therefore, a thin film transistor with a small amount of light leakage current can be provided. Accordingly, a display device with favorable display quality can be manufactured.

Embodiment 2

In this embodiment, a manufacturing method of a thin film transistor and a display device, which are different from those of Embodiment 1, will be described.

Although the case where a resist mask which includes three regions with different thicknesses is formed using a four-tone mask is described in Embodiment 1, a method for forming a resist mask which includes three regions with different thicknesses without using a four-tone mask is described in this embodiment.

Figure 52:
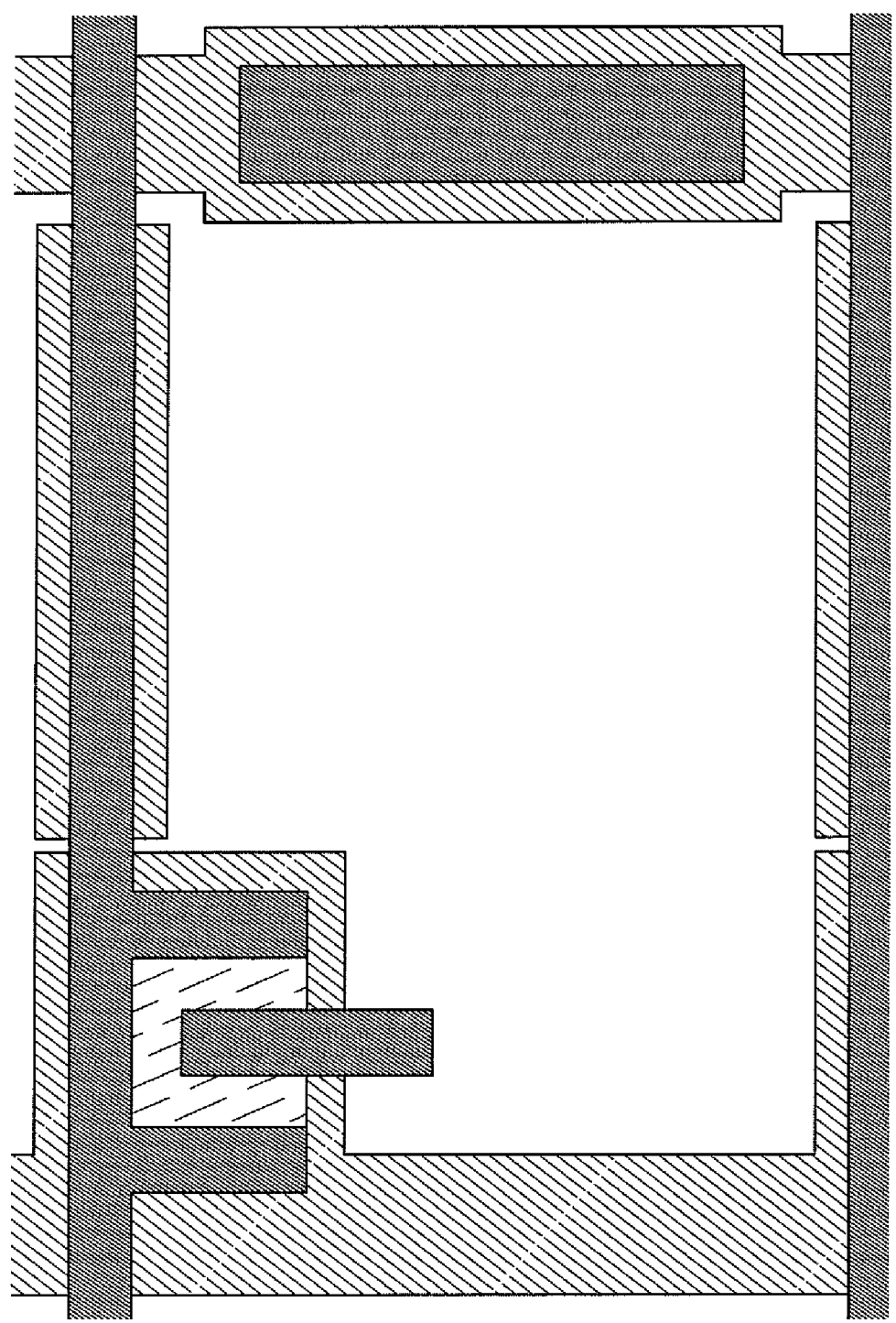
FIG. 52 illustrates an example of a formation method of a resist mask.
Figure 52:
Figure 52:
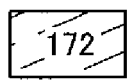
Figure 52:

In FIG. 52, the first resist mask 112 (see FIG. 21) in which different hatching patterns are used depending on the thickness is illustrated. The first resist mask 112 includes a first region 171 with the smallest thickness, a third region 173 with the largest thickness, and a second region 172 whose thickness is larger than that of the first region 171 and smaller than that of the third region 173. Note that, here, a molybdenum film, a silicon nitride film, a semiconductor film, an impurity semiconductor film, a tungsten film are formed to be stacked over the substrate, and the first resist mask 112 is formed over the tungsten film. Note that, as the first resist mask 112, a positive resist is used.

First, light exposure and development are performed using a three-tone mask on a resist which is formed over an entire surface of the substrate to form a light-exposed region, a semi-light-exposed region, and a light-shielding region. Here, the light-exposed region is to be a region where the resist is completely removed (the region not corresponding to any of the first region 171, the second region 172, and the third region 173). The semi-light-exposed region forms the first region 171. The light-shielding region forms the second region 172 and the third region 173. At this stage, the second region 172 and the third region 173 have almost the same thickness.

Next, laser irradiation is performed on only a portion which is in the above-described light-shielding region and which is to be the second region 172, whereby light exposure is performed on the resist in the portion which is to be the second region 172. Here, as a laser, a HeCd laser can be used, for example. Laser output used for irradiation may be set depending on the thickness of the portion to be formed as appropriate. Then, a resist mask having the second region 172 can be formed by performing development.

Note that, although development is performed twice in the above description, laser irradiation may be performed and then development may be performed without performing development immediately after light exposure using the three-tone mask to form a resist mask having the second region 172.

Here, the thickness of the second region 172, which is formed by changing laser output used for irradiation, in the case where the thickness of the third region 173 is about 1.5 μm for example, is described with reference to FIGS. 53A to 53D.

Here, TFR-H (manufactured by Tokyo Ohka Kogyo Co., Ltd.) which is a highly sensitive resist is used as a resist, and a developing solution NMD3 (manufactured by Tokyo Ohka Kogyo Co., Ltd.) is used for development. Laser irradiation is performed on the resist which is uniformly formed so as to have a thickness of 1.5 μm, using a HeCd laser whose maximum output is 70 mW. FIG. 53A is a STEM (scanning transmission electron microscopy) image of a resist which is developed after performing laser irradiation on a laser-irradiated region at an output of 20% of the maximum output (that is, 14 mW); FIG. 53B is a STEM image of a resist which is developed after performing laser irradiation on a laser-irradiated region at an output of 25% of the maximum output (that is, 17.5 mW); FIG. 53C is a STEM image of a resist which is developed after performing laser irradiation on a laser-irradiated region at an output of 30% of the maximum output (that is, 21 mW); and FIG. 53D is a STEM image of a resist which is developed after performing laser irradiation on a laser-irradiated region at an output of 35% of the maximum output (that is, 24.5 mW).

In FIG. 53A, the thickness of the laser-irradiated region (the second region 172) is 1.0 μm; in FIG. 53B, the thickness of the laser-irradiated region is 0.9 μm; in FIG. 53C, the thickness of the laser-irradiated region is 0.8 μm; and in FIG. 53D, the thickness of the laser-irradiated region is 0.6 μm. Thus, by adjusting the output of the laser, the thickness of the resist can be adjusted.

As described above, a resist mask which includes three regions with different thicknesses can be formed without using a four-tone mask. That is, the manufacturing method of a thin film transistor which is described in Embodiment 1 can be employed without using a four-tone mask, and the first resist mask 112 having a desired thickness can be formed by adjusting the laser output as described in this embodiment.

Note that, although a positive resist is used in the above description, a negative resist can also be used in a similar manner.

Note that, although light exposure is performed first using a three-tone mask in the above description, an embodiment of the present invention is not limited thereto, and light exposure may be performed using a two-tone photomask to form a resist mask having different thicknesses by adjusting laser output depending on the thickness of regions. Alternatively, a resist mask having different thicknesses may be formed without using a photomask by adjusting laser output depending on regions.

However, in the method described in this embodiment, it is difficult to form a resist having a uniform thickness as compared to the case where light exposure is performed using a photomask; therefore, it is preferable to apply the above-described method to the region with a small area (in FIG. 52, the second region 172) as much as possible.

Note that this embodiment is not limited to a thin film transistor and a manufacturing method thereof which are described in Embodiment 1, and can be applied to a manufacturing method of a variety of thin film transistors.

Embodiment 3

A thin film transistor which is an embodiment of the present invention can also be applied to an EL display device. In this embodiment, an example of a manufacturing method of a thin film transistor and a manufacturing method of an EL display device in which the thin film transistors are arranged in matrix will be described with reference to FIG. 34, FIGS. 35A to 35C, FIGS. 36A to 36C, FIGS. 37A to 37C, FIGS. 38A to 38C, FIG. 39, FIG. 40, FIG. 41, FIG. 42, FIG. 43, FIG. 44, FIG. 45, FIG. 46, and FIG. 47.

Figure 34:
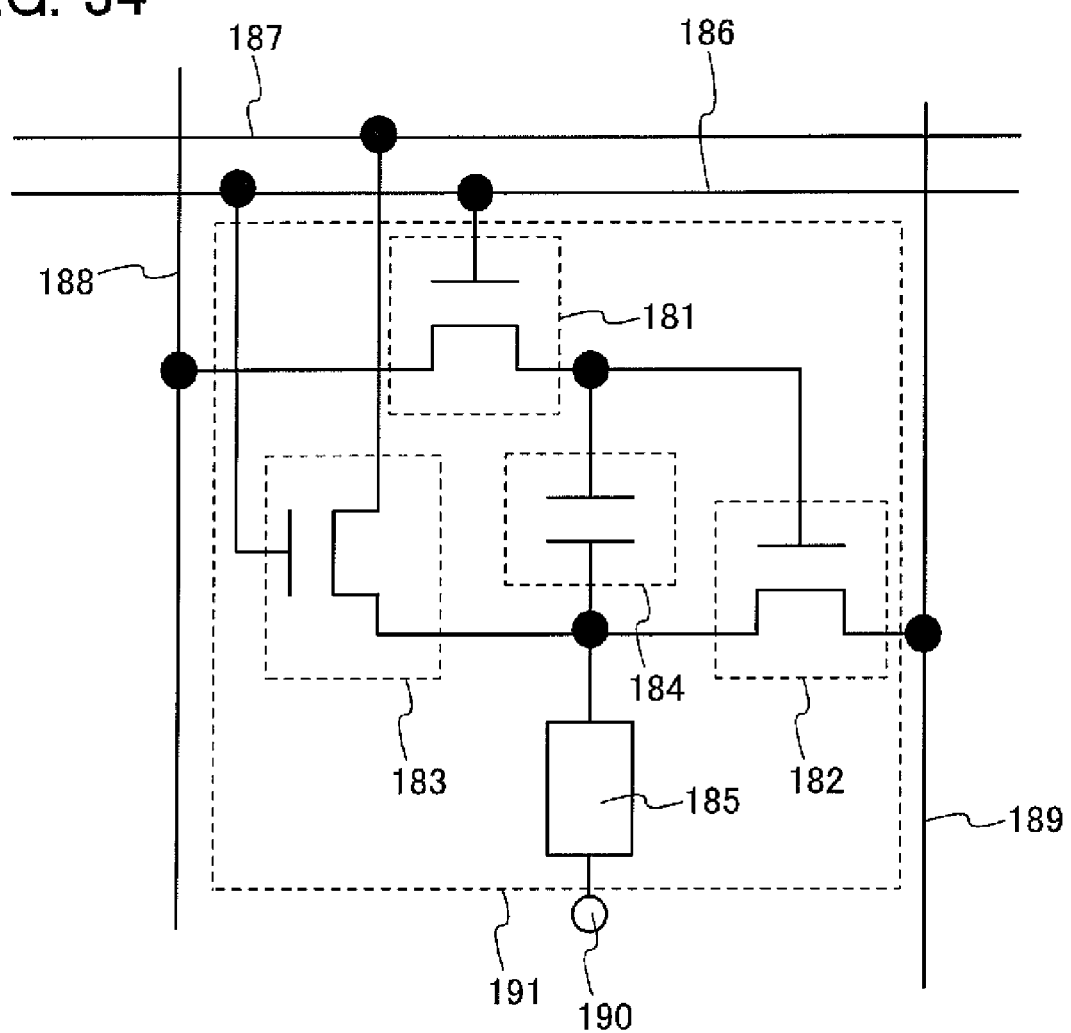
FIG. 34 illustrates an example of a pixel circuit of a display device.

Various pixel circuits for EL display devices (active EL display devices) which use thin film transistors as switching elements are considered. FIG. 34 illustrates an example of a simple pixel circuit, and a manufacturing method of a pixel structure using this pixel circuit will be described in this embodiment. However, the pixel circuit of the EL display device is not limited to the one having the configuration illustrated in FIG. 34.

In the pixel structure of the EL display device illustrated in FIG. 34, a pixel 191 includes a first transistor 181, a second transistor 182, a third transistor 183, a capacitor 184, and a light-emitting element 185. The first, second, and third transistors are n-channel transistors. A gate electrode of the first transistor 181 is connected to a gate wiring 186, one of a source electrode and a drain electrode (referred to as a first electrode) is connected to a source wiring 188, and the other of the source electrode and the drain electrode (referred to as a second electrode) is connected to a gate electrode of the second transistor 182 and one electrode (referred to as a first electrode) of the capacitor 184. The other electrode (referred to as a second electrode) of the capacitor 184 is connected to one of a source electrode and a drain electrode (referred to as a first electrode) of the second transistor 182, one of a source electrode and a drain electrode (referred to as a first electrode) of the third transistor 183, and one electrode (referred to as a first electrode) of the light-emitting element 185. The other of the source electrode and the drain electrode (referred to as a second electrode) of the second transistor 182 is connected to a second power supply line 189. The other of the source electrode and the drain electrode (referred to as a second electrode) of the third transistor 183 is connected to a first power supply line 187, and a gate electrode of the third transistor 183 is connected to the gate wiring 186. The other electrode (referred to as a second electrode) of the light-emitting element 185 is connected to a common electrode 190. Note that the potential of the first power supply line 187 is different from that of the second power supply line 189.

The operation of the pixel 191 will be described. When the third transistor 183 is turned on by a signal input to the gate wiring 186, the first electrode of the second transistor 182, the first electrode of the light-emitting element 185, and the second electrode of the capacitor 184 each have a potential equal to that of the first power supply line 187 ($V_{187}$). Here, since the potential ($V_{187}$) of the first power supply line 187 is constant, the potential of the first electrode of the second transistor 182 and the like is constant ($V_{187}$).

When the first transistor 181 is selected and turned on by the signal input to the gate wiring 186, the potential of the signal from the source wiring 188 ($V_{188}$) is input to the gate electrode of the second transistor 182 through the first transistor 181. At this time, if the potential of the second power supply line 189 ($V_{189}$) is higher than the potential of the first power supply line 187 ($V_{187}$), the relation, $V_{gs}=V_{188}-V_{187}$, is obtained. If $V_{gs}$ is higher than the threshold voltage of the second transistor 182, the second transistor 182 is turned on.

Accordingly, in the case of operating the second transistor 182 in a linear region, the potential of the source wiring 188 ($V_{188}$) is changed (e.g., binary values), so that on and off of the second transistor 182 can be controlled. That is, it can be controlled whether voltage is applied to the EL layer included in the light-emitting element 185.

In the case of operating the second transistor 182 in a saturation region, the potential of the source wiring 188 ($V_{188}$) is changed, so that the amount of current flowing through the light-emitting element 185 can be controlled.

Figure 51A:
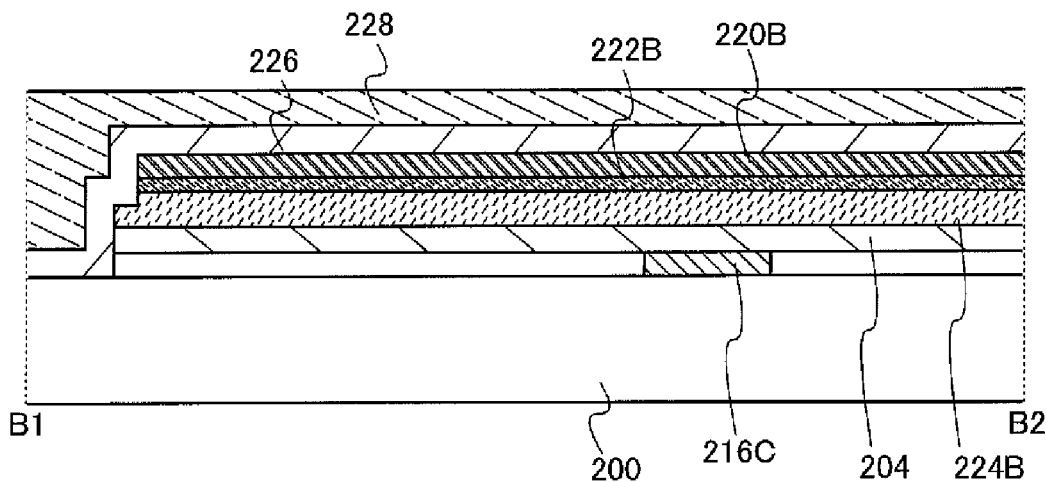
FIGS. 51A to 51C illustrate an example of a manufacturing method of an EL display device.
Figure 51B:
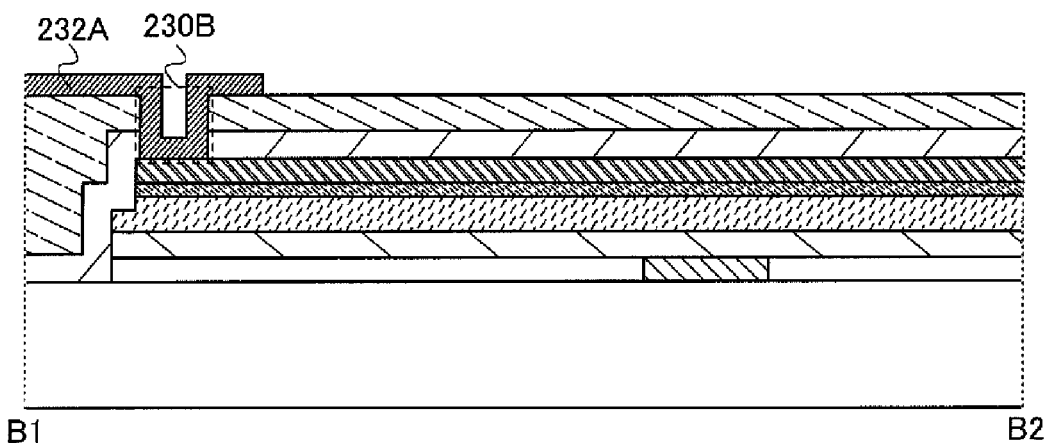
Figure 51C:
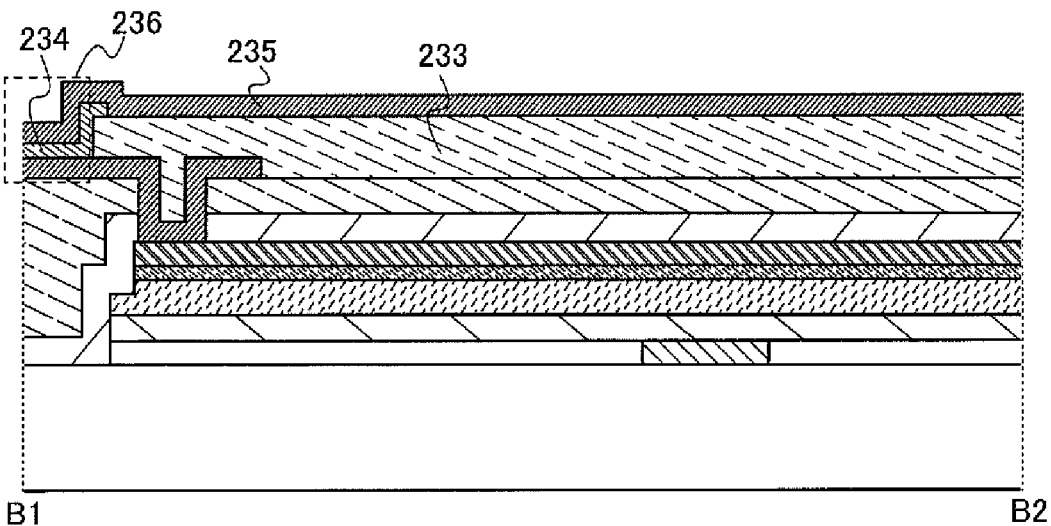

In the above-described manner, in the case of operating the second transistor 182 in a linear region, it can be controlled whether voltage is applied to the light-emitting element 185. Thus, the light-emitting state and the non-light emitting state of the light-emitting element 185 can be controlled. The driving method like this can be used for digital time grayscale driving, for example. The digital time grayscale driving is a driving method in which one frame is divided into a plurality of subframes and the light-emitting state and the non-light emitting state of the light-emitting element 185 are controlled in each subframe. In addition, in the case of operating the second transistor 182 in a saturation region, the amount of current flowing through the light-emitting element 185 can be controlled and luminance of the light-emitting element 185 can be adjusted. FIGS. 51A to 51C are cross-sectional views taken along the line B1-B2 in FIG. 47.

Next, a pixel structure to which the pixel circuit illustrated in FIG. 34 is applied and a manufacturing method thereof will be described below.

Figure 45:
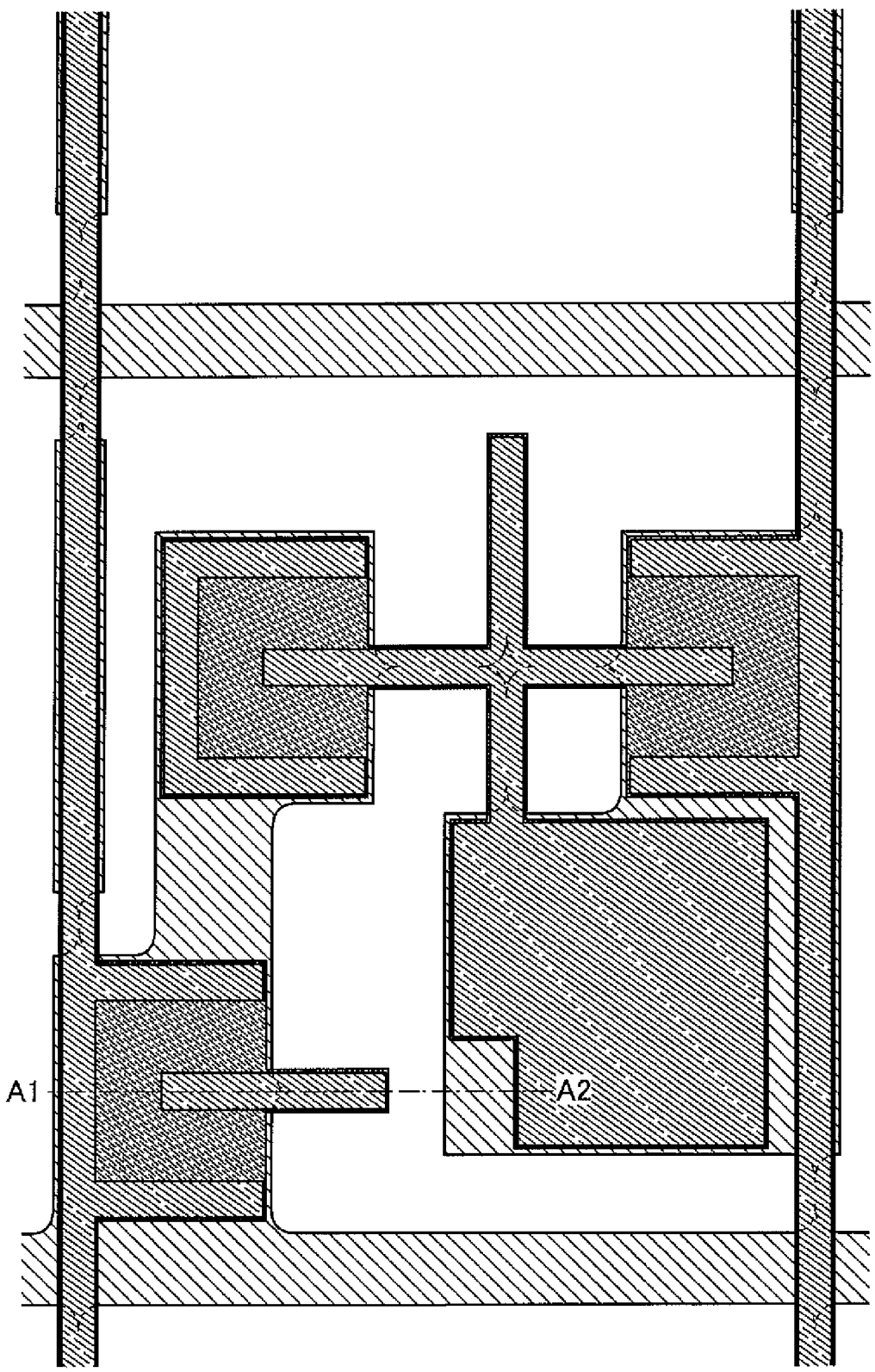
FIG. 45 illustrates an example of a manufacturing method of a thin film transistor and a display device.
Figure 46:
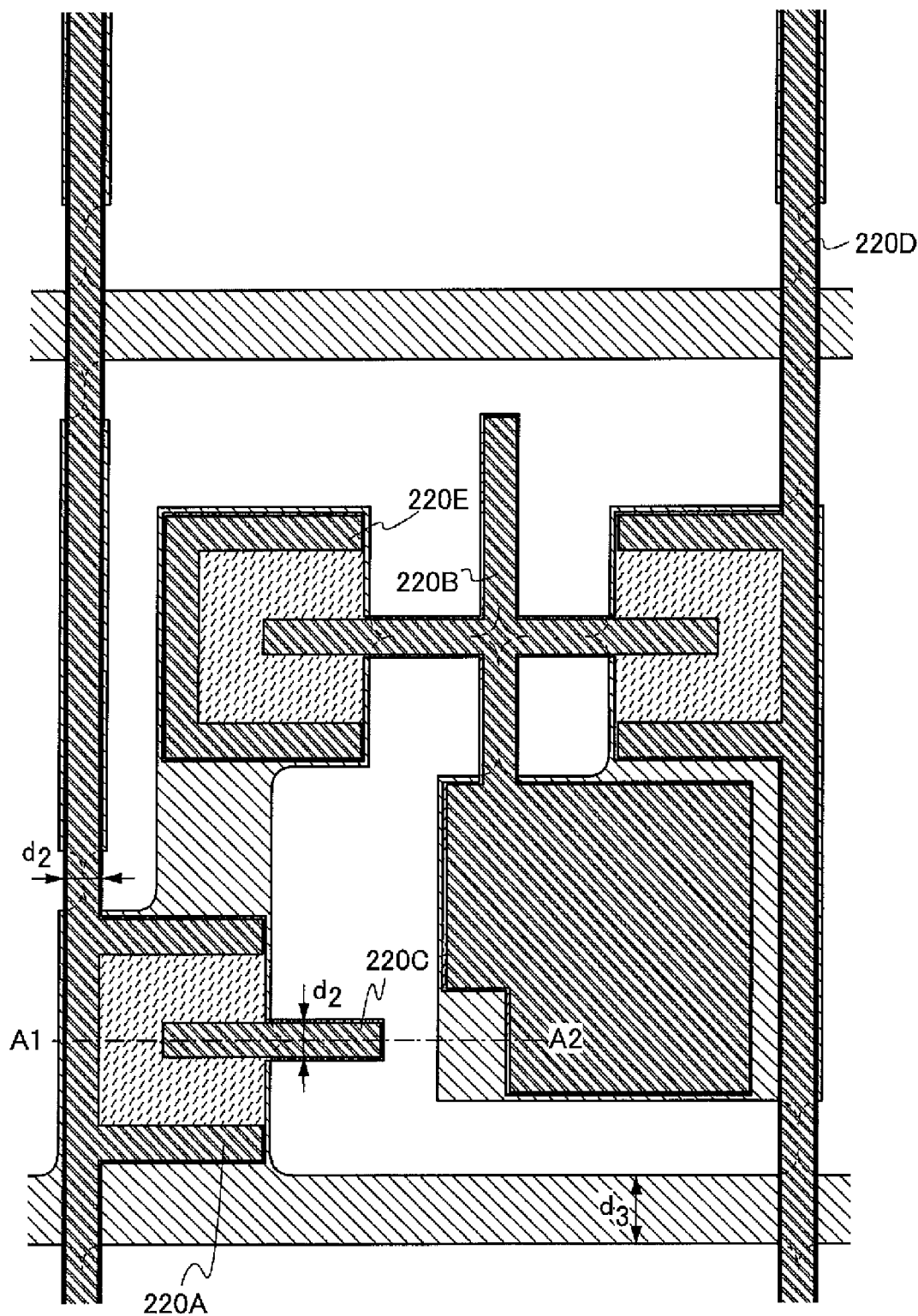
FIG. 46 illustrates an example of a manufacturing method of a thin film transistor and a display device.
Figure 47:
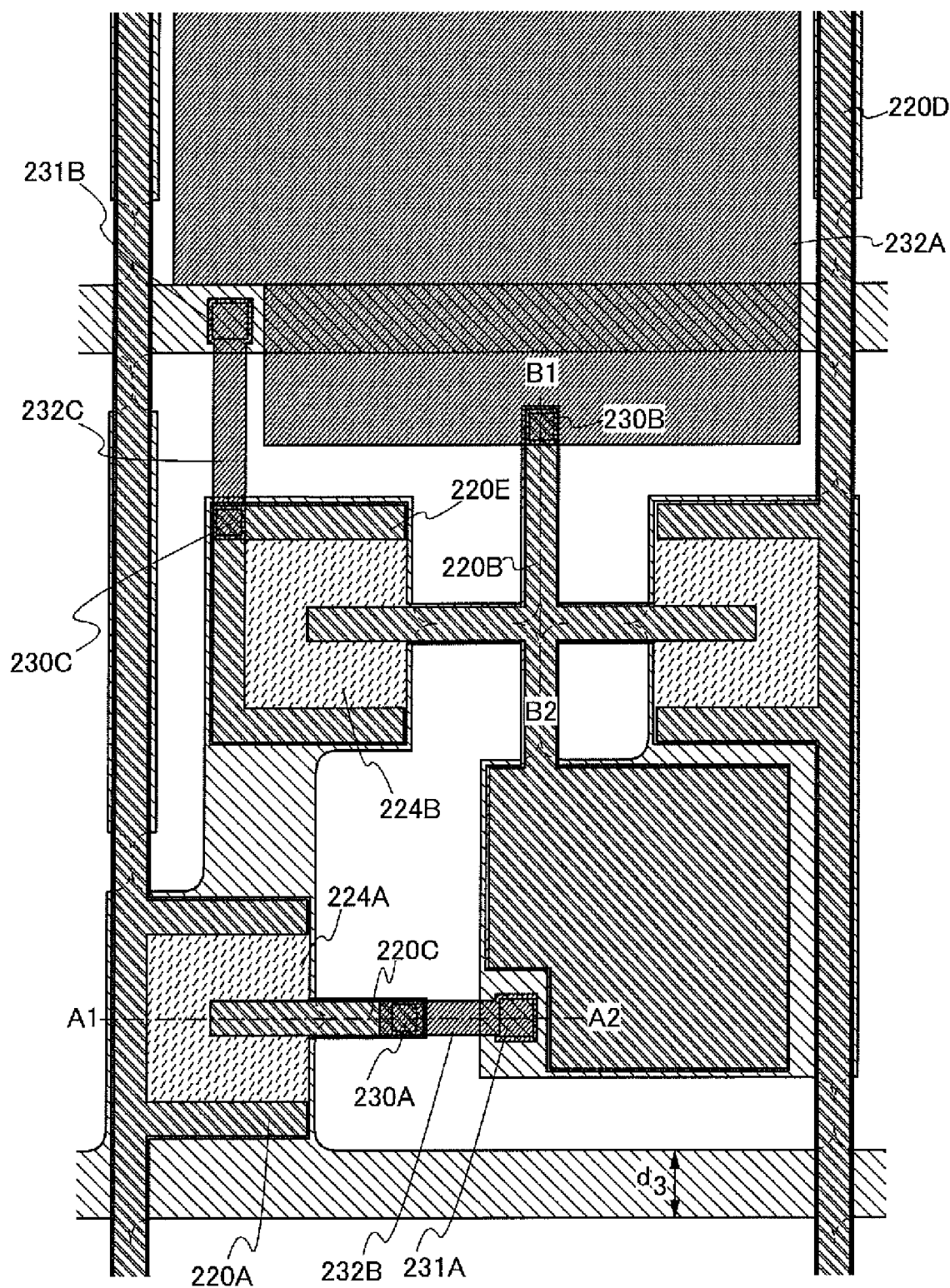
FIG. 47 illustrates an example of a manufacturing method of a thin film transistor and a display device.

FIG. 39, FIG. 40, FIG. 41, FIG. 42, FIG. 43, FIG. 44, FIG. 45, FIG. 46, and FIG. 47 are top views of thin film transistors according to this embodiment. FIG. 47 is a completion view in the situation that formation of a pixel electrode is finished. FIGS. 35A to 35C, FIGS. 36A to 36C, FIGS. 37A to 37C, and FIGS. 38A to 38C are cross-sectional views taken along the line A1-A2 in FIG. 39, FIG. 40, FIG. 41, FIG. 42, FIG. 43, FIG. 44, FIG. 45, FIG. 46, and FIG. 47.

Figure 35A:
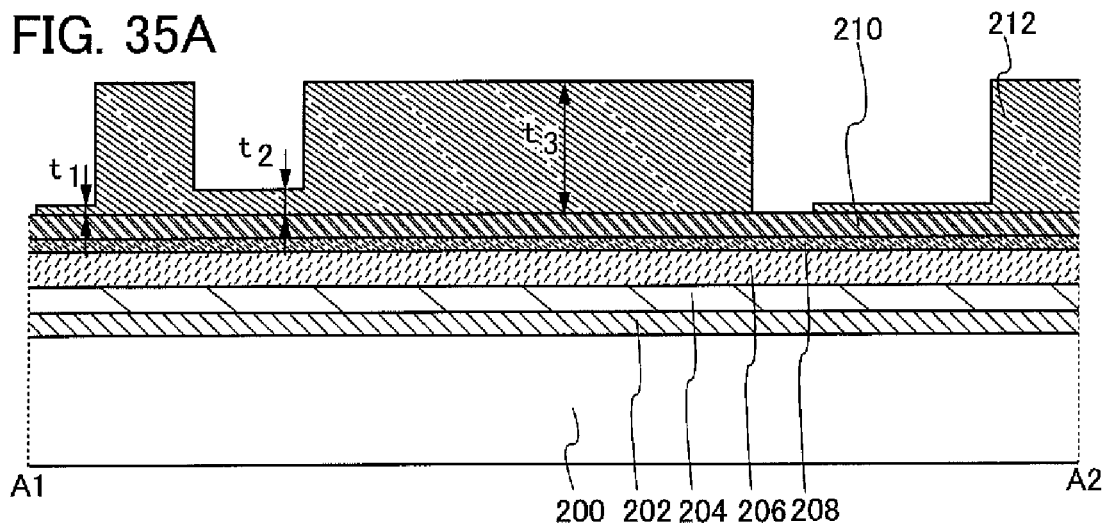
FIGS. 35A to 35C illustrate an example of a manufacturing method of a thin film transistor and a display device.
Figure 35B:
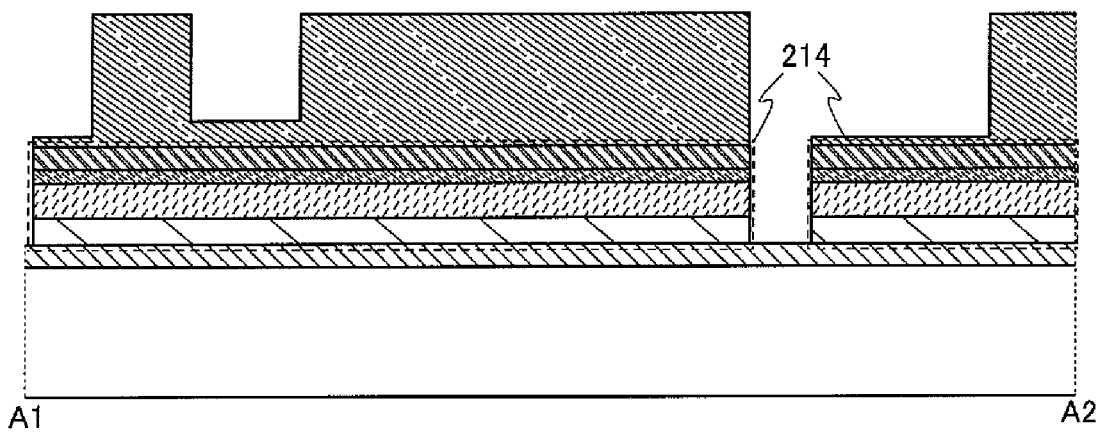

First, a first conductive film 202, a first insulating film 204, a semiconductor film 206, an impurity semiconductor film 208, and a second conductive film 210 are formed over a substrate 200 (see FIG. 35A).

Note that a similar substrate to the substrate 100 in Embodiment 1 can be used as the substrate 200. A material and a formation method of the first conductive film 202 can be similar to those of the first conductive film 102 in Embodiment 1. A material and a formation method of the first insulating film 204 can be similar to those of the first insulating film 104 in Embodiment 1.

As the semiconductor film 206, a stacked film of a crystalline semiconductor film and an amorphous semiconductor film is preferably used. As the crystalline semiconductor film, a polycrystalline semiconductor film, a microcrystalline semiconductor film, and the like can be given.

The polycrystalline semiconductor film means a semiconductor film which includes crystal grains and many grain boundaries between the crystal grains. The polycrystalline semiconductor film is formed by, for example, a thermal crystallization method or a laser crystallization method. Here, the thermal crystallization method is a crystallization method in which an amorphous semiconductor film is formed over a substrate and the amorphous semiconductor is crystallized by heating the substrate. The laser crystallization method is a crystallization method in which an amorphous semiconductor film is formed over a substrate and the amorphous semiconductor film is irradiated with a laser beam to crystallize the amorphous semiconductor. Alternatively, a crystallization method in which an element which promotes crystallization such as nickel is added to cause crystallization may be used. In the case where crystallization is performed by adding the element which promotes crystallization, the semiconductor film is preferably subjected to laser irradiation.

The polycrystalline semiconductor is classified into low temperature poly silicon (LTPS), which is obtained by crystallization at such a temperature and for such time as not to cause distortion in a glass substrate, and high temperature poly silicon (HTPS), which is obtained by crystallization at higher temperature.

The microcrystalline semiconductor film is a semiconductor film including crystal grains each having a diameter of approximately 2 nm to 100 nm, and includes in its category a semiconductor film whose entire surface is formed of only crystal grains and a semiconductor film in which amorphous semiconductor exists between crystal grains. As a formation method of the microcrystalline semiconductor film, a method in which a crystal nucleus is formed and made to grow; a method in which an amorphous semiconductor film, an insulating film in contact with the amorphous semiconductor film, and a metal film are formed and the metal film is irradiated with a laser beam so that the amorphous semiconductor is crystallized by heat generated in the metal film; or the like may be employed. Note that a crystalline semiconductor film formed by performing a thermal crystallization method or a laser crystallization method on an amorphous semiconductor film is not included in the category of the microcrystalline semiconductor film.

For example, when a stacked film formed by stacking an amorphous semiconductor film over a crystalline semiconductor film is used as the semiconductor film 206, a transistor included in a pixel circuit of an EL display device can operate at high speed. Here, as the crystalline semiconductor film, a polycrystalline semiconductor film such as a polycrystalline silicon (including LTPS and HTPS) film or a microcrystalline semiconductor film may be used.

When an amorphous semiconductor film is placed over a crystalline semiconductor film, a surface of the microcrystalline semiconductor film can be prevented from being oxidized. In addition, withstand voltage can be increased and off current can be reduced.

Note that the crystallinity of the semiconductor film 206 is not particularly limited as long as the pixel circuit of the EL display device operates normally.

The impurity semiconductor film 208 is a semiconductor film containing an impurity element imparting one conductivity type and is formed using a gas such as a gas for the preparation of semiconductor gas to which the impurity element imparting one conductivity type is added. Since an n-channel thin film transistor is provided in this embodiment, a silicon film containing phosphorus may be provided as the impurity semiconductor film 208 by using a silane gas containing phosphine (chemical formula: $PH_3$), for example. Note that as in the case of the first conductive film 202, the material of the impurity semiconductor film 208 should have such heat resistance and be not unintentionally etched or eroded in a later step. As long as these conditions are satisfied, the material of the impurity semiconductor film 208 is not limited to a particular material. Note that the crystallinity of the impurity semiconductor film 208 is not particularly limited as well. In the case where a region capable of an ohmic contact with a source and drain electrode layer is provided in a part of the semiconductor layer formed using the semiconductor film 206 by doping or the like, the impurity semiconductor film 208 does not have to be provided.

Since an n-channel thin film transistor is manufactured in this embodiment, arsenic or the like may be used as the impurity element imparting one conductivity type to be added, and arsine (chemical formula: $AsH_3$) may be included at a desired concentration in a silane gas used for formation of the impurity semiconductor film 208.

Note that the impurity semiconductor film 208 can be formed by, for example, a CVD method (including a thermal CVD method, a plasma CVD method, and the like) or the like; however, the formation method of the impurity semiconductor film 208 is not limited to a particular method.

The second conductive film 210 can be formed using a material which is similar to the material of the second conductive film 110 in Embodiment 1 but is different from the material of the first conductive film 202. The second conductive film 210 can be formed by a similar method to the method for forming the second conductive film 110 in Embodiment 1.

Figure 39:
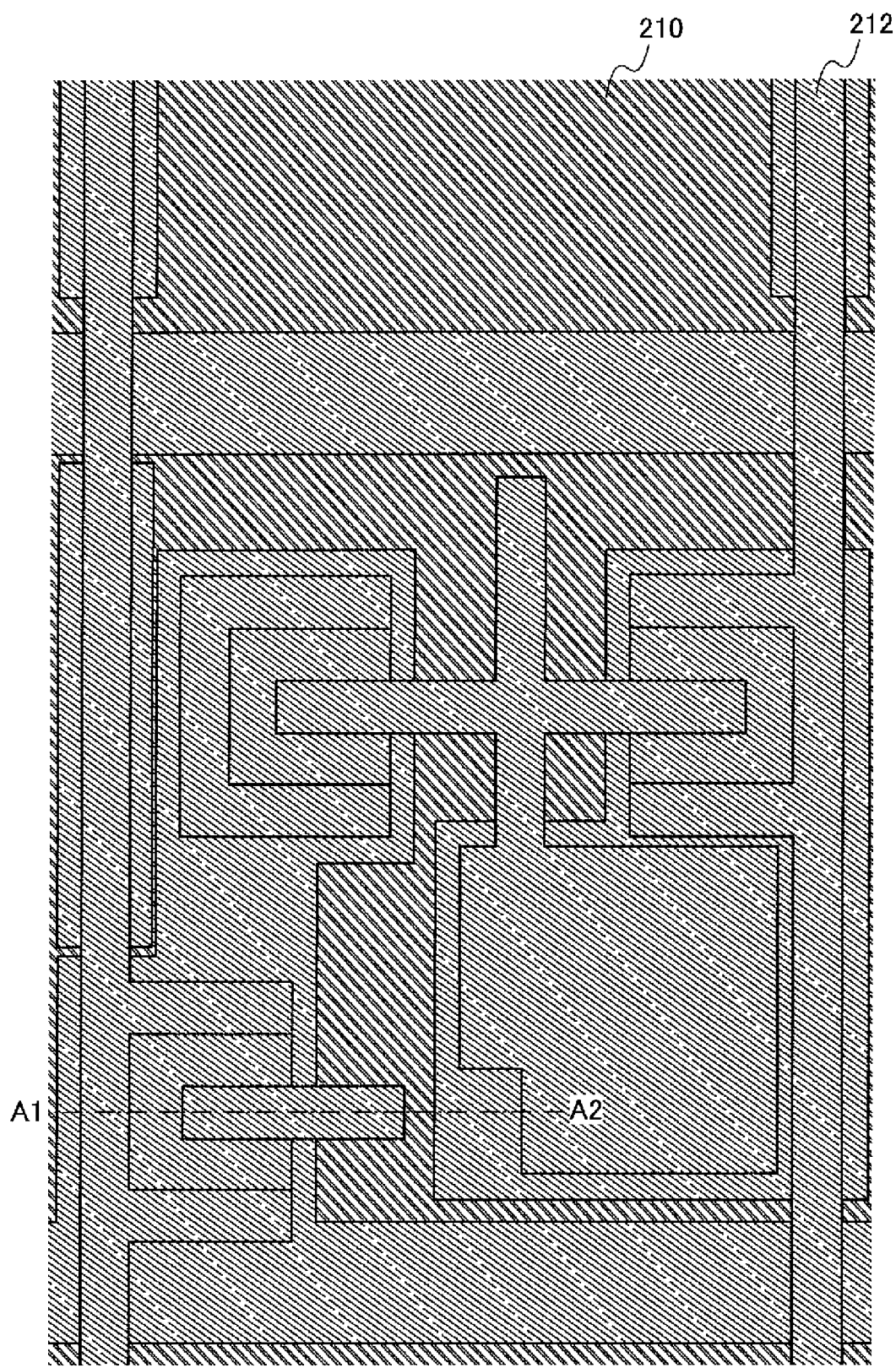
FIG. 39 illustrates an example of a manufacturing method of a thin film transistor and a display device.
Figure 40:
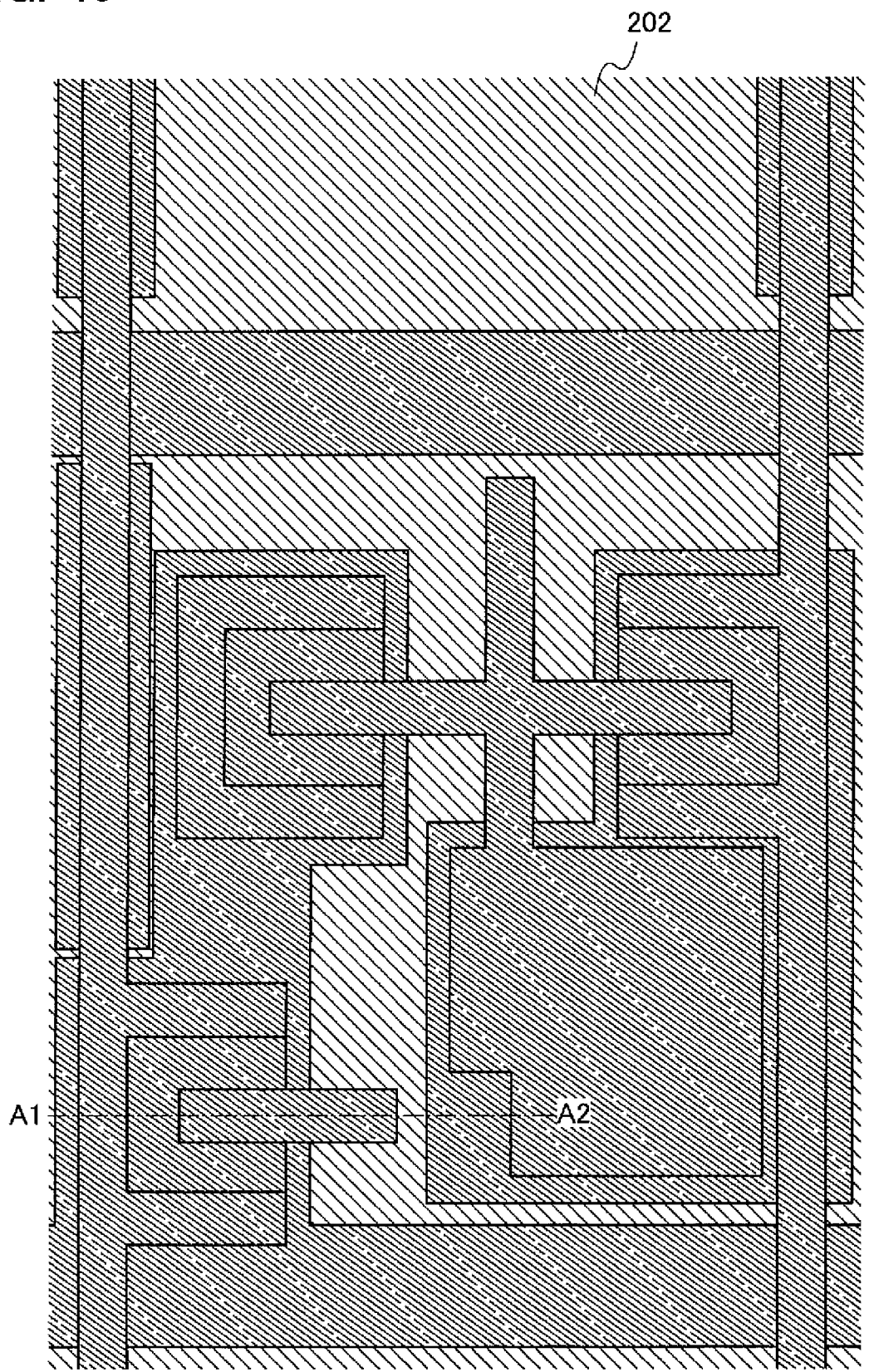
FIG. 40 illustrates an example of a manufacturing method of a thin film transistor and a display device.

Next, a first resist mask 212 is formed over the second conductive film 210 (see FIG. 35A and FIG. 39). The first resist mask 212 includes three regions with different thicknesses in a similar manner to the first resist mask 112 in Embodiment 1. In the first resist mask 212, a region with the smallest thickness is referred to as a first region, a region with the largest thickness is referred to as a third region, and a region whose thickness is larger than that of the first region and smaller than that of the third region is referred to as a second region. Note that, in FIG. 35A, the thickness of the first region is referred to as a $t_1$, the thickness of the second region is referred to as a $t_2$, and the thickness of the third region is referred to as a $t_3$.

In the first resist mask 212, the third region is formed in a region where a source and drain electrode layer 220 is formed, and the second region is formed in a region where a semiconductor layer 224 is exposed without existence of the source and drain electrode layer 220. The first region is provided to pattern a gate electrode layer.

The first resist mask 212 can be formed using a four-tone mask as described in Embodiment 1. However, an embodiment of the present invention is not limited thereto, and another method by which a resist mask including three regions with different thicknesses can be formed may be used. For example, a resist mask including three regions with different thicknesses may be formed by the method described in Embodiment 2.

Next, first etching is performed using the first resist mask 212 in a similar manner to Embodiment 1. That is, the first insulating film 204, the semiconductor film 206, the impurity semiconductor film 208, and the second conductive film 210 are etched to be patterned, whereby a first thin-film stack body 214 is formed (see FIG. 35B and FIG. 40).

Next, second etching is performed using the first resist mask 212. That is, the first conductive film 202 is etched to be patterned, whereby a gate electrode layer 216 is formed (see FIG. 35C and FIG. 41).

Note that the gate electrode layer 216 forms the gate electrode of the thin film transistor, the gate wiring, one electrode of the capacitor, the first power supply line, and the supporting portion. When a gate electrode layer is referred to as a gate electrode layer 216A, the gate electrode layer forms the gate wiring, the gate electrode of the first transistor 181, and the gate electrode of the third transistor 183. When a gate electrode layer is referred to as a gate electrode layer 216B, the gate electrode layer forms the gate electrode of the second transistor 182 and one electrode of the capacitor 184. When a gate electrode layer is referred to as a gate electrode layer 216C, the gate electrode layer forms the supporting portion. When a gate electrode layer is referred to as a gate electrode layer 216D, the gate electrode layer forms the first power supply line 187. When a gate electrode layer is referred to as a gate electrode layer 216E, a gate electrode layer 216F, or a gate electrode layer 216G, the gate electrode layer forms the supporting portion provided below the source wiring. Then, these gate electrode layers are collectively referred to as the gate electrode layer 216.

The second etching is performed under such etching conditions that a side surface of the gate electrode layer 216 formed using the first conductive film 202 is provided more on the inside than a side surface of the first thin-film stack body 214. In other words, the second etching is performed so that the side surface of the gate electrode layer 216 is in contact with a bottom surface of the first thin-film stack body 214 (so that the width of the gate electrode layer 216 is narrower than that of the first thin-film stack body 214 in the cross section along the line A1-A2 in FIG. 35). Further, the second etching is performed under such conditions that the etching rate with respect to the second conductive film 210 is low and the etching rate with respect to the first conductive film 202 is high. In other words, the second etching is performed under the conditions that the etching selectivity of the first conductive film 202 with respect to the second conductive film 210 is high. By performing the second etching under such conditions, the gate electrode layer 216 can be formed.

Note that the shape of the side surface of the gate electrode layer 216 is not particularly limited. For example, the shape may be a tapered shape. The shape of the side surface of the gate electrode layer 216 is determined depending on the conditions such as a chemical solution used in the second etching.

Here, the phrase "the conditions that the etching rate with respect to the second conductive film 210 is low and the etching rate with respect to the first conductive film 202 is high" or "the conditions that the etching selectivity of the first conductive film 202 with respect to the second conductive film 210 is high" means conditions satisfying the following first requirement and second requirement.

Figure 35C:
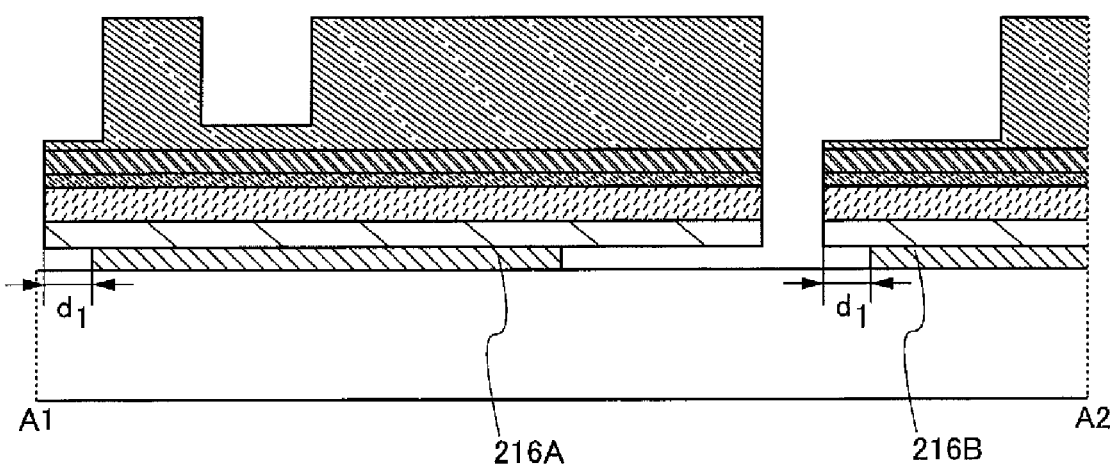
Figure 41:
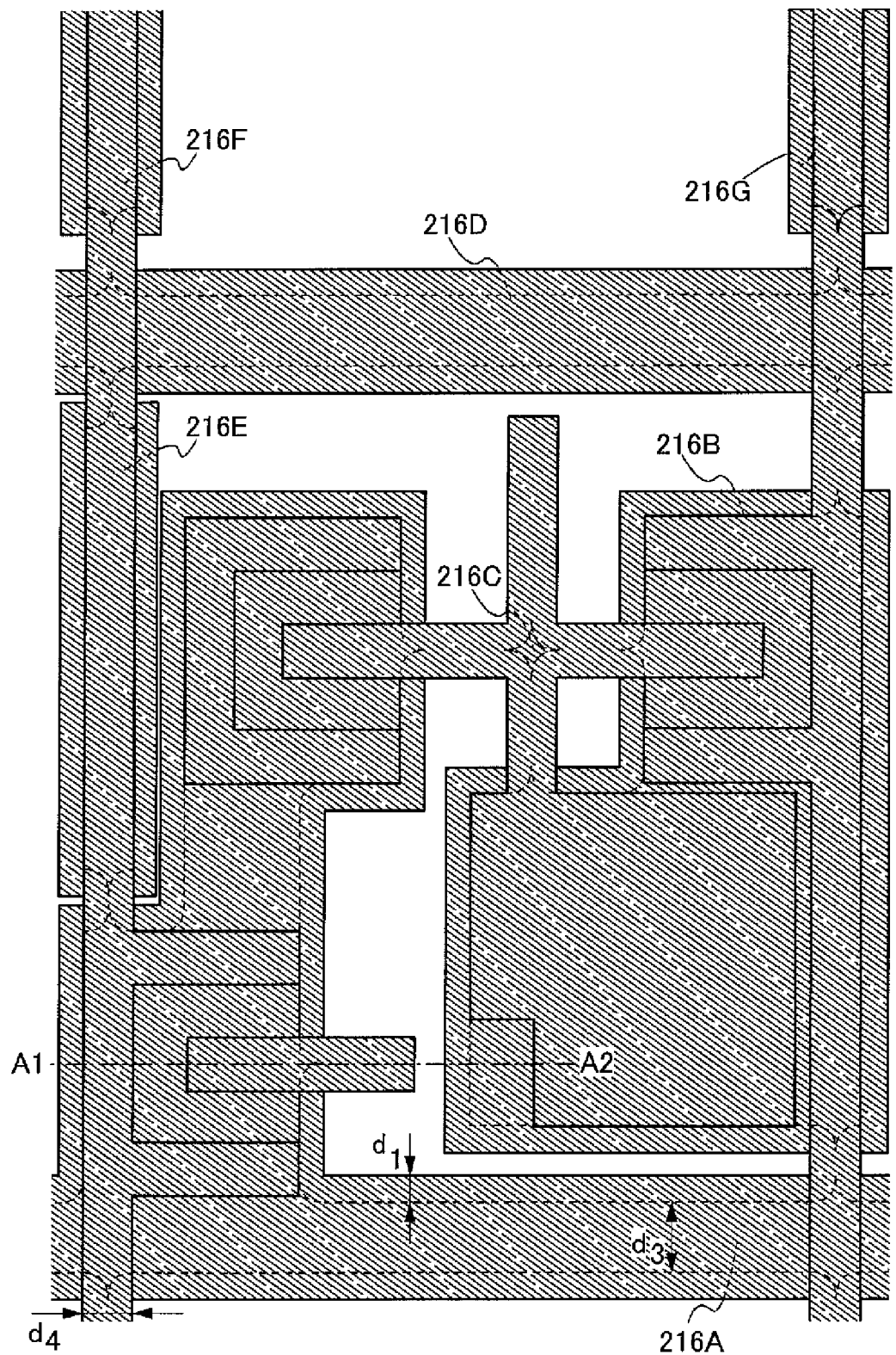
FIG. 41 illustrates an example of a manufacturing method of a thin film transistor and a display device.

The first requirement is that the gate electrode layer 216 is left at places necessarily provided with the gate electrode layer 216. The places necessarily provided with the gate electrode layer 216 are regions indicated by dotted lines in FIG. 41, FIG. 42, and the like. That is, it is necessary that the gate electrode layer 216 is left so as to form a gate wiring, a gate electrode in a transistor, and one electrode in a capacitor after the second etching. In order that the gate electrode layer forms the gate wiring and the capacitor wiring, the second etching should be performed so as not to disconnect these wirings. As illustrated in FIG. 35C and FIG. 41, the side surface of the gate electrode layer 216 is preferably more on the inside than the side surface of the first thin-film stack body 214 by a distance $d_1$, and the distance $d_1$ may be set as appropriate by a practitioner according to the layout.

The second requirement is that a minimum width $d_3$ of the gate wiring or the capacitor wiring formed by the gate electrode layer 216 and a minimum width $d_2$ of a source wiring formed by the source and drain electrode layer 220 have appropriate values (see FIG. 46). This is because as the source and drain electrode layer 220 is etched more by the second etching, the minimum width $d_2$ of the source wiring is reduced; accordingly, the current density of the source wiring becomes excessive and electric characteristics are degraded. Therefore, the second etching is performed under the conditions that the etching rate of the first conductive film 202 is not too high and the etching rate of the second conductive film 210 is as low as possible.

Note that a portion where the width of the semiconductor layer overlapping with the source wiring is a minimum width $d_4$ may be provided at an appropriate place for dividing the gate electrode layer in accordance with elements. Note that the minimum width $d_4$ of the semiconductor layer is set smaller than about twice the distance $d_1$. In other words, the distance $d_1$ is set larger than about half the minimum width $d_4$ of the semiconductor layer.

In addition, the width of the electrode in a portion connected to a pixel electrode layer, which is formed of the source and drain electrode layer, be equal to the minimum width $d_2$ of the source wiring.

As described above, the second etching under the condition in which side-etching is performed is very important. This is because by the second etching in which the first conductive film 202 is side-etched, a pattern which enables desired connection between not only the gate wirings, which are adjacent to each other and are formed of the gate electrode layer 216, but also elements in the pixel circuit can be formed. Since the second etching is etching in which side-etching is performed, the second etching proceeds in a substantially isotropic manner.

Here, "side-etching" means etching in which a film is etched in not only a thickness direction of the film to be etched (a direction perpendicular to a substrate surface or a direction perpendicular to a base surface the film to be etched) but also in a direction perpendicular to the thickness direction (a direction parallel to the substrate surface or a direction parallel to the base surface of the film to be etched). An end portion of the film subjected to side-etching can have various shapes depending on the etching rate of an etching gas or a chemical solution used for the etching with respect to the film to be etched. The end portion of the film is, in many cases, formed with a curved surface.

The gate electrode layer 216C, the gate electrode layer 216F, and the gate electrode layer 216G illustrated in FIG. 41 each serve as a supporting portion which supports the first thin-film stack body 214. By providing the supporting portion, peeling of a film such as a gate insulating film formed over the gate electrode layer can be prevented. In addition, by providing the supporting portion, a cavity region formed adjacent to the gate electrode layer 216 by the second etching can be prevented form being larger than necessary. Furthermore, it is preferable to provide the supporting portion because the first thin-film stack body 214 can be prevented from being broken or damaged due to its own weight in the middle of the manufacturing and accordingly, yield is increased. Further, it is preferable to provide the supporting portion because an area to be light-shielded of the semiconductor layer is increased. However, an embodiment of the present invention is not limited thereto, and the supporting portion is not necessarily provided.

As described above, the second etching is preferably performed by wet etching.

In the case where the second etching is performed by wet etching, the first conductive film 202 may be formed with aluminum or molybdenum, the second conductive film 210 may be formed with titanium or tungsten, and a chemical solution containing nitric acid, acetic acid, and phosphoric acid may be used for an etching solution (an etchant). Alternatively, the first conductive film 202 may be formed with molybdenum, the second conductive film 210 may be formed with titanium, aluminum, or tungsten, and a chemical solution containing hydrogen peroxide water may be used for an etching solution (an etchant).

In the case where the second etching is performed by wet etching, it is most preferable that a stacked film in which molybdenum is deposited over aluminum to which neodymium is added be formed as the first conductive film 202, tungsten be deposited as the second conductive film 210, and a chemical solution containing nitric acid at 2%, acetic acid at 10%, and phosphoric acid at 72% be used for an etchant. By usage of a chemical solution having such a composition ratio, the first conductive film 202 can be etched without the second conductive film 210 being etched. Note that neodymium is added to the first conductive film 202 for the purpose of reducing resistance of aluminum and preventing hillocks.

Figure 36A:
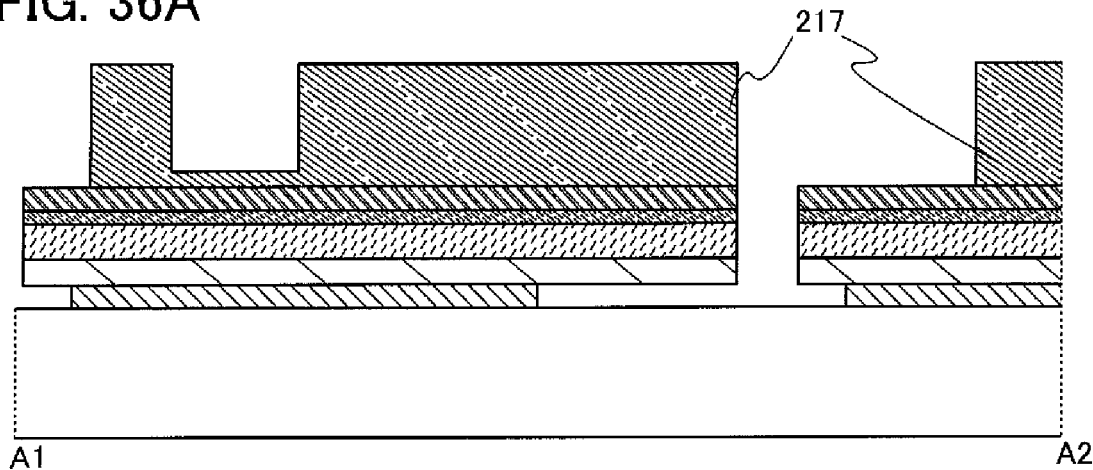
FIGS. 36A to 36C illustrate an example of a manufacturing method of a thin film transistor and a display device.
Figure 36B:
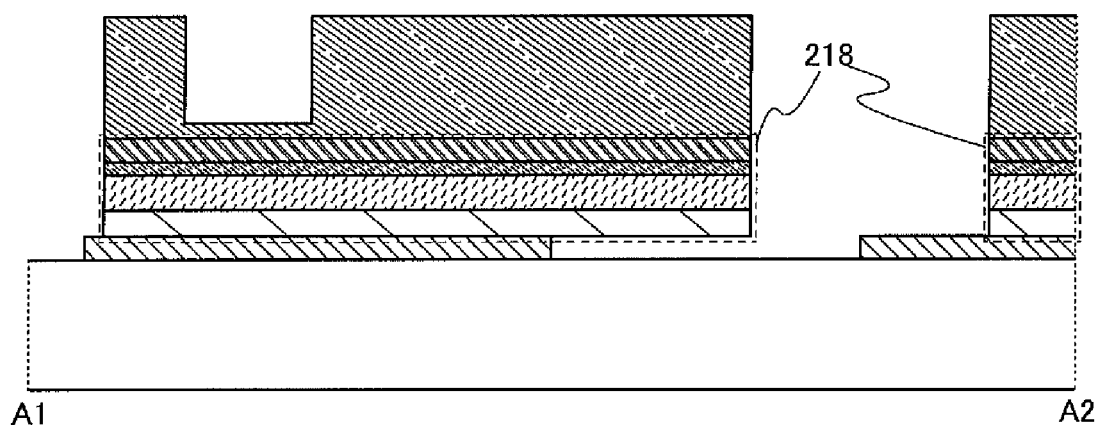
Figure 42:
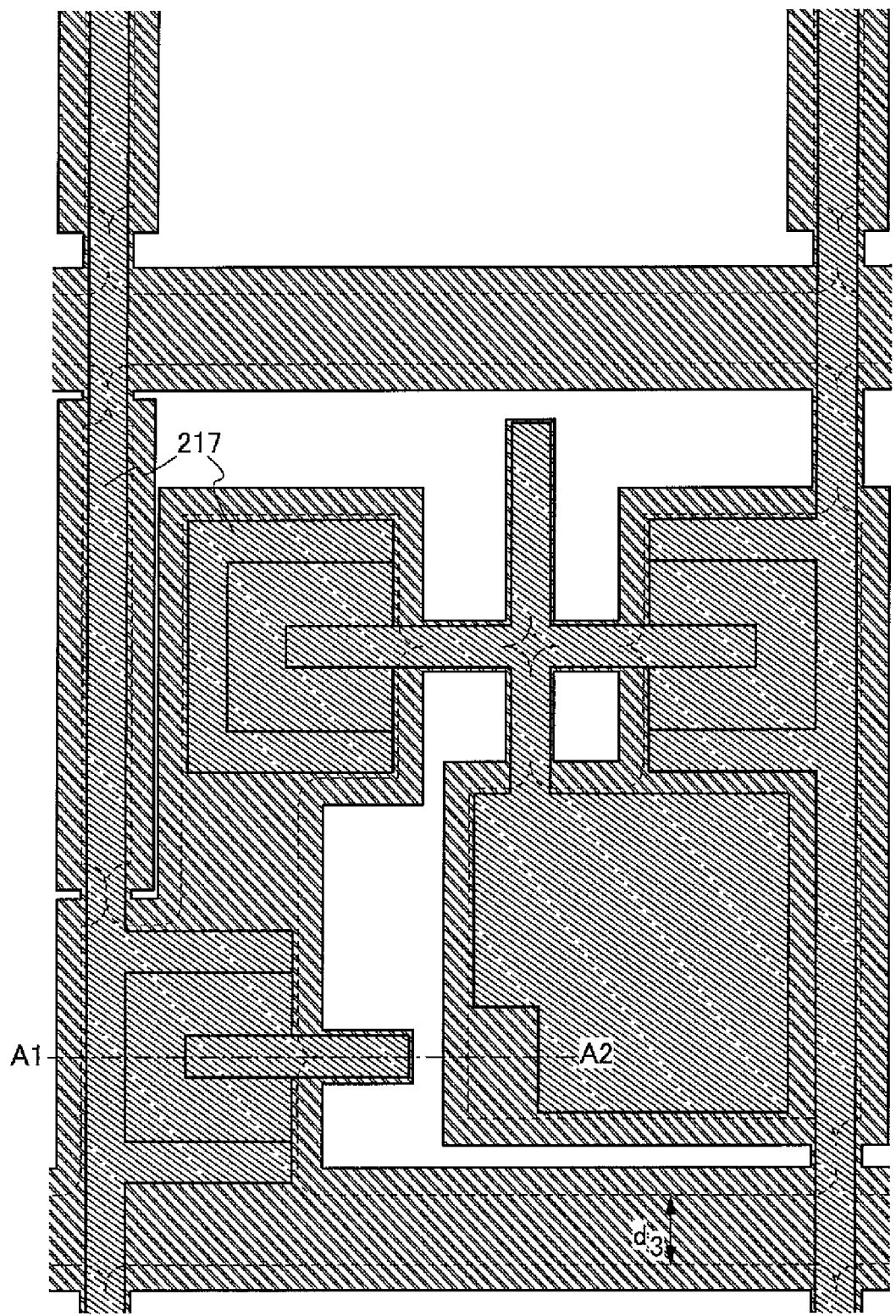
FIG. 42 illustrates an example of a manufacturing method of a thin film transistor and a display device.
Figure 43:
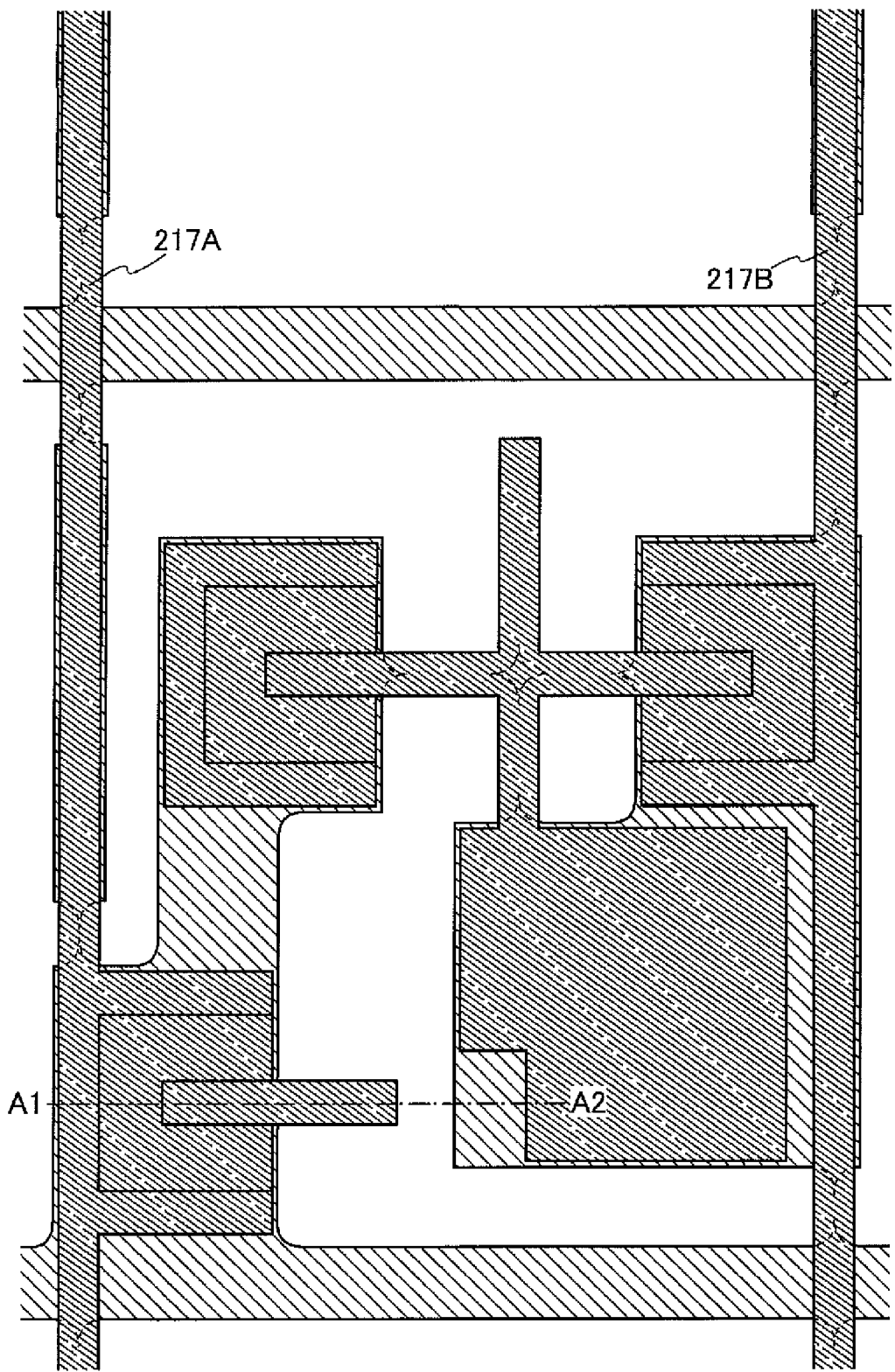
FIG. 43 illustrates an example of a manufacturing method of a thin film transistor and a display device.

Next, the first resist mask 212 is made to recede (reduce); accordingly, the second conductive film 210 in a region overlapping with the first region of the first resist mask 212 is exposed and a second resist mask 217 is formed (see FIG. 36A and FIG. 42). As means for forming the second resist mask 217 by recession (reduction) of the first resist mask 212, for example, ashing using oxygen plasma can be given. However, the means for forming the second resist mask 217 by recession (reduction) of the first resist mask 212 is not limited to this. Note that the case where the second resist mask 217 is formed after the second etching has been described here; however, an embodiment of the present invention is not limited to this and the second etching may be performed after formation of the second resist mask 217.

In the case where a multi-tone mask is not used to form the first resist mask 212, the second resist mask 217 may be newly formed using a different photomask.

Next, the first insulating film 204, the semiconductor film 206, the impurity semiconductor film 208, and the second conductive film 210, in a region overlapping with the first region of the first resist mask 112, are etched to be removed using the second resist mask 217. This etching step is called third etching. The third etching may be performed in a similar manner to the first etching. A second thin-film stack body 218 can be formed by the third etching (see FIG. 36B and FIG. 43). Here, as the etching conditions, the conditions by which films other than the first insulating film 204, the semiconductor film 206, the impurity semiconductor film 208, and the second conductive film 210 are not unintentionally etched or eroded or are not easily unintentionally etched or eroded are selected. In particular, it is important that etching is performed under the conditions that the gate electrode layer 216 is not unintentionally etched or eroded or is not easily unintentionally etched or eroded.

Figure 36C:
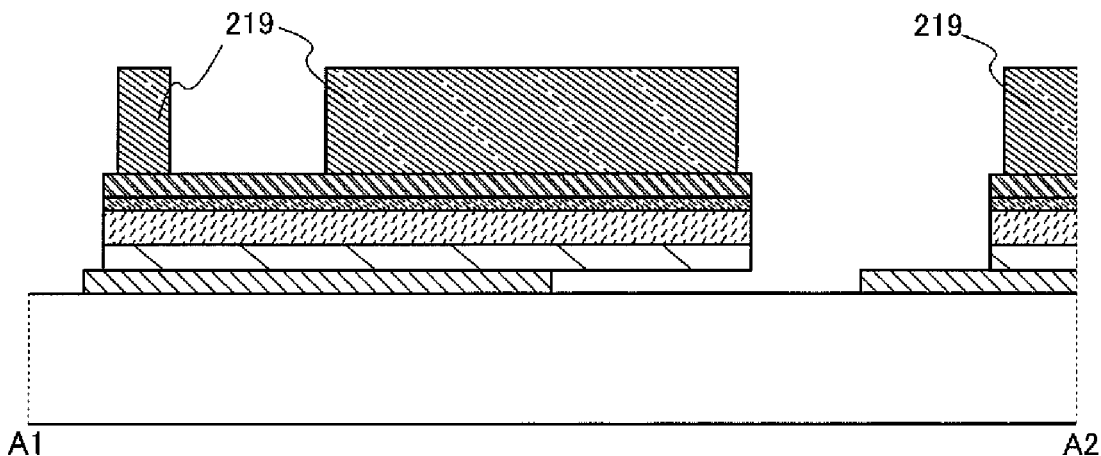
Figure 44:
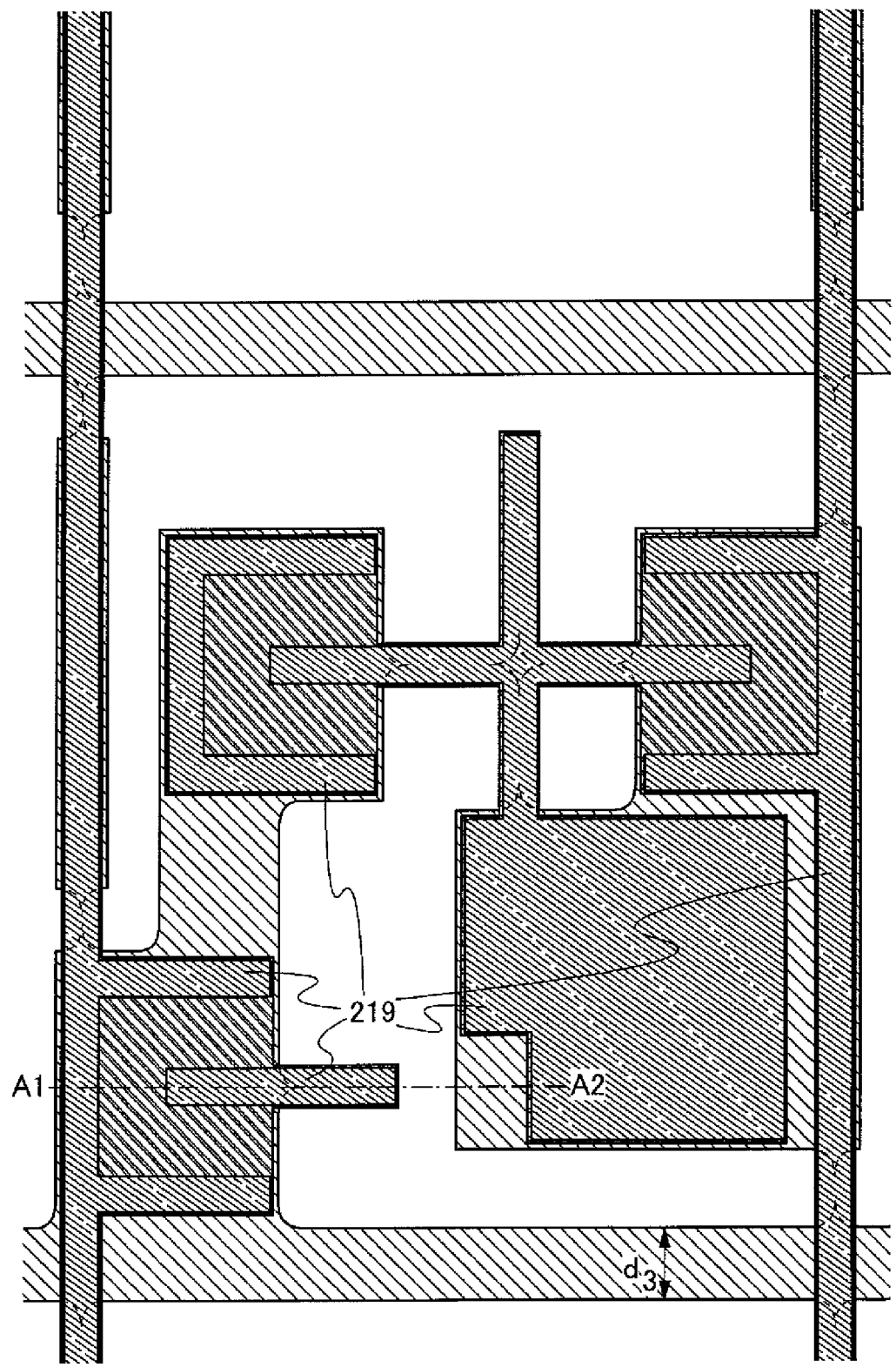
FIG. 44 illustrates an example of a manufacturing method of a thin film transistor and a display device.

Next, the second resist mask 217 is made to recede (reduce); accordingly, the second conductive film 210 in a region overlapping with the second region is exposed and a third resist mask 219 is formed (see FIG. 36C and FIG. 44).

Figure 37A:
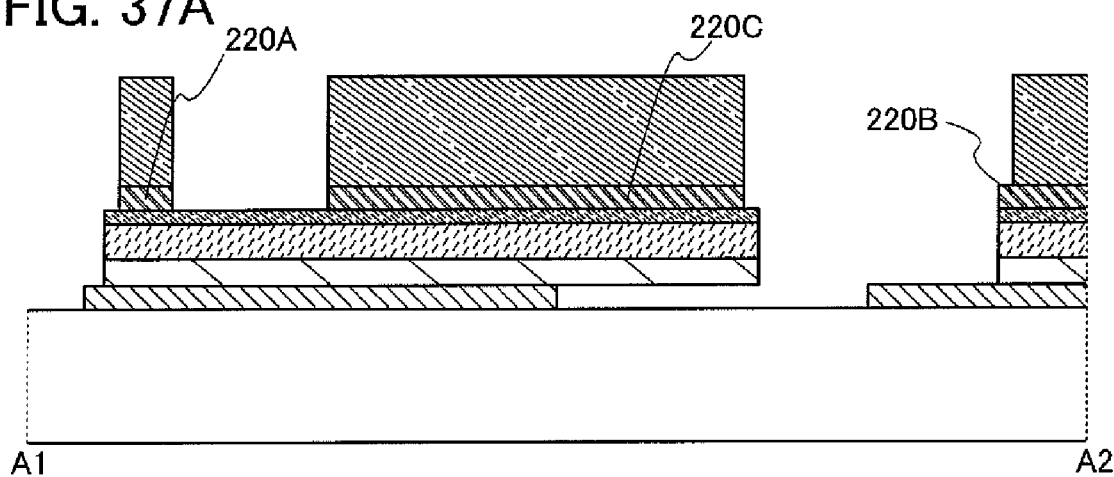
FIGS. 37A to 37C illustrate an example of a manufacturing method of a thin film transistor and a display device.

Next, the second conductive film 210 in the second thin-film stack body 218 is etched using the third resist mask 219, so that the source and drain electrode layer 220 is formed (see FIG. 37A, FIG. 45, and FIG. 46). Here, as the etching conditions, the conditions by which films other than the second conductive film 210 are not unintentionally etched or eroded or are not easily unintentionally etched or eroded are selected. In particular, it is important that etching is performed under the conditions that the gate electrode layer 216 is not unintentionally etched or eroded or is not easily unintentionally etched or eroded.

Note that the source and drain electrode layer 220 forms the source electrode and the drain electrode of a thin film transistor, the source wiring, the second power supply line, the other electrode of the capacitor, and an electrode which connects the thin film transistor and one electrode of a light-emitting element to each other. When a source and drain electrode layer is referred to as a source and drain electrode layer 220A, the source and drain electrode layer forms the source wiring 188 and one of a source electrode and a drain electrode of the first transistor 181. When a source and drain electrode layer is referred to as a source and drain electrode layer 220B, the source and drain electrode layer forms the other electrode of the capacitor 184, one of a source electrode and a drain electrode of the second transistor 182, one of a source electrode and a drain electrode of the third transistor 183, and an electrode which connects any of these electrodes to one electrode of the light-emitting element. When a source and drain electrode layer is referred to as a source and drain electrode layer 220C, the source and drain electrode layer forms the other of the source electrode and the drain electrode of the first transistor 181 and an electrode which connects the other electrode of the light-emitting element and the first transistor 181 to each other. When a source and drain electrode layer is referred to as a source and drain electrode layer 220D, the source and drain electrode layer forms the second power supply line 189 and the other of the source electrode and the drain electrode of the second transistor 182. When a source and drain electrode layer is referred to as a source and drain electrode layer 220E, the source and drain electrode layer forms the other of the source electrode and the drain electrode of the third transistor 183.

Note that for etching the second conductive film 210 in the second thin-film stack body 218, either wet etching or dry etching may be performed.

Figure 37B:
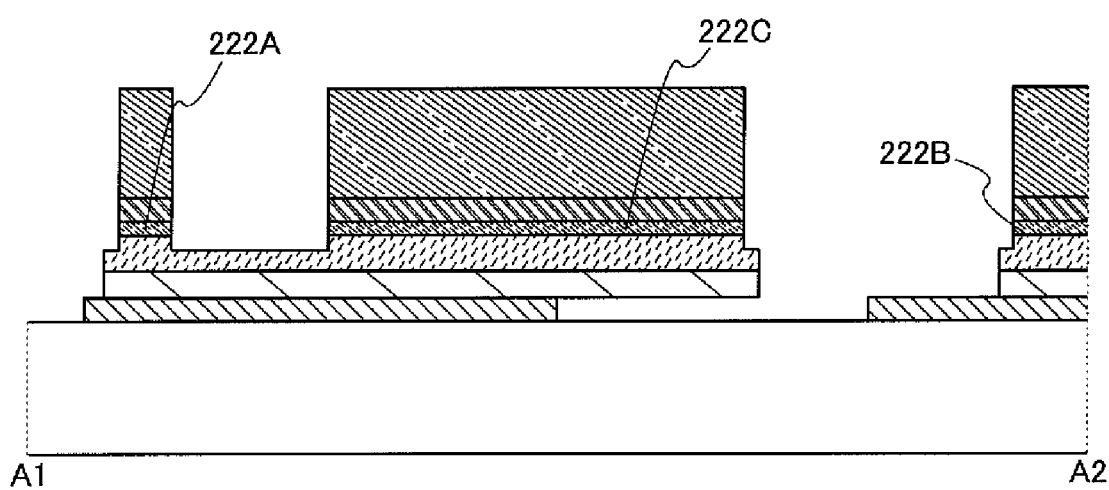

Then, the impurity semiconductor film 208 and an upper portion (back channel portion) of the semiconductor film 206 in the second thin-film stack body 218 are etched to form a source and drain region 222 using the third resist mask 219 (see FIG. 37B). At the same time, the semiconductor layer 224 is formed. The semiconductor layer 224 is provided with a semiconductor layer 224A and a semiconductor layer 224B, and the semiconductor layer 224A and the semiconductor layer 224B are separated from each other (see FIG. 37C).

The etching step in which the source and drain electrode layer 220 and the source and drain region 222 are formed is called fourth etching. The fourth etching may also be performed in a similar manner to the first etching. This is because a layer to be etched in the fourth etching corresponds to a part of the layer to be etched in the first etching. Here, as the etching conditions, the conditions by which films other than the impurity semiconductor film 208 and the semiconductor film 206 are not unintentionally etched or eroded or are not easily unintentionally etched or eroded are selected. In particular, it is important that etching is performed under the conditions that the gate electrode layer 216 is not unintentionally etched or eroded or is not easily unintentionally etched or eroded.

Note that the etching of the impurity semiconductor film 208 and the upper portion (back channel portion) of the semiconductor film 206 in the second thin-film stack body 218 can be performed by dry etching or wet etching.

Figure 37C:
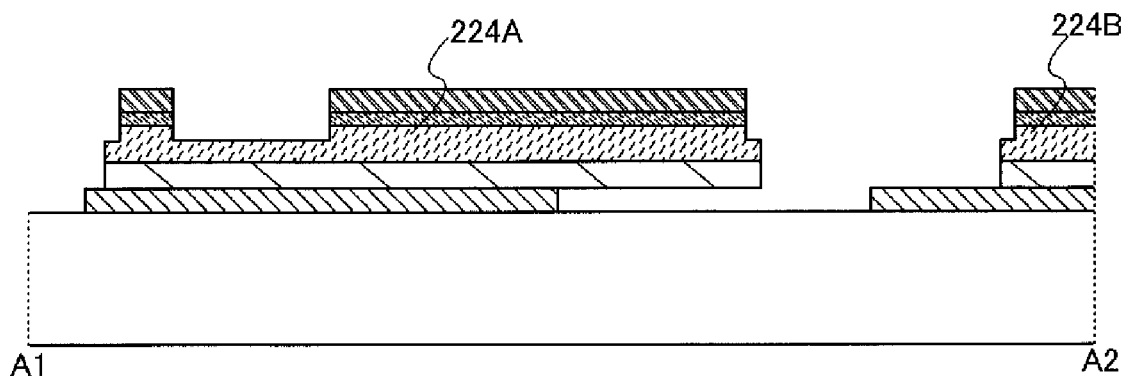

Then, the third resist mask 219 is removed to complete a thin film transistor (see FIG. 37C and FIG. 46). As described above, the thin film transistor that can be applied to an EL display device can be manufactured using one photomask (multi-tone mask).

A second insulating film is formed to cover the thin film transistor which is formed in the above-described manner. Although the second insulating film may be formed of only a first protective film 226, the second insulating film is formed of the first protective film 226 and a second protective film 228 here (see FIG. 38A and FIG. 51A). The first protective film 226 may be formed in a similar manner to the first insulating film 204, and preferably, the first protective film 226 is formed with silicon nitride containing hydrogen or silicon oxynitride containing hydrogen; thus, an impurity such as metal can be prevented from entering the first protective film 226 so that the first protective film 226 can be prevented from being contaminated.

The second protective film 228 is formed by a method by which the surface thereof becomes almost planar. This is because when the surface of the second protective film 228 is almost planar, disconnection or the like of a first pixel electrode layer 232 formed over the second protective film 228 can be prevented. Accordingly, the phrase "almost planar" means planar in such an extent that the aforementioned aim can be achieved, and does not mean that high planarity is required.

The second protective film 228 can be formed, for example, by a spin coating method or the like using photosensitive polyimide, acrylic, epoxy resin, or the like. Note that an embodiment of the present invention is not limited to these materials and the formation method.

The second protective film 228 is preferably formed by stacking the above-described protective film formed by a method by which the surface thereof becomes almost planar and a protective film which covers the protective film and prevents entry and release of moisture. Specifically, the protective film which prevents entry and release of moisture is preferably formed using silicon nitride, silicon oxynitride, aluminum oxynitride, aluminum nitride, or the like. As a formation method of the second protective film 228, a sputtering method is preferably used.

Figure 38A:
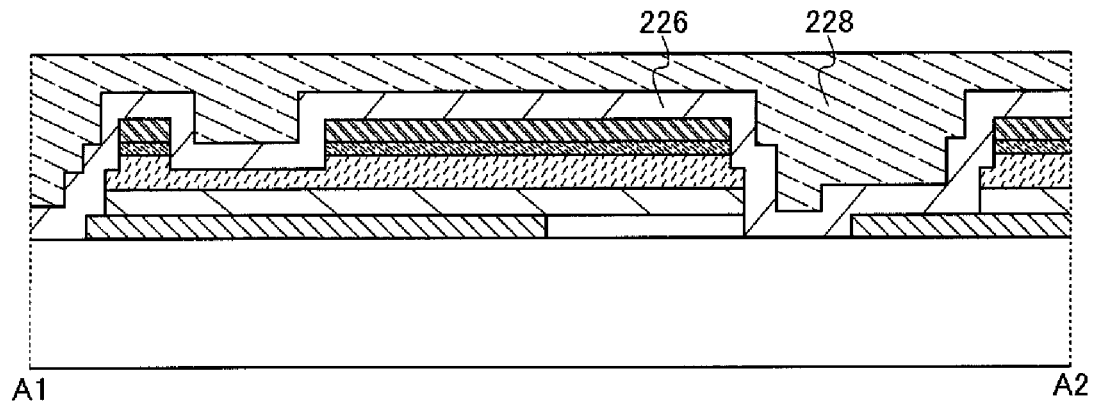
FIGS. 38A to 38C illustrate an example of a manufacturing method of a thin film transistor and a display device.
Figure 38B:
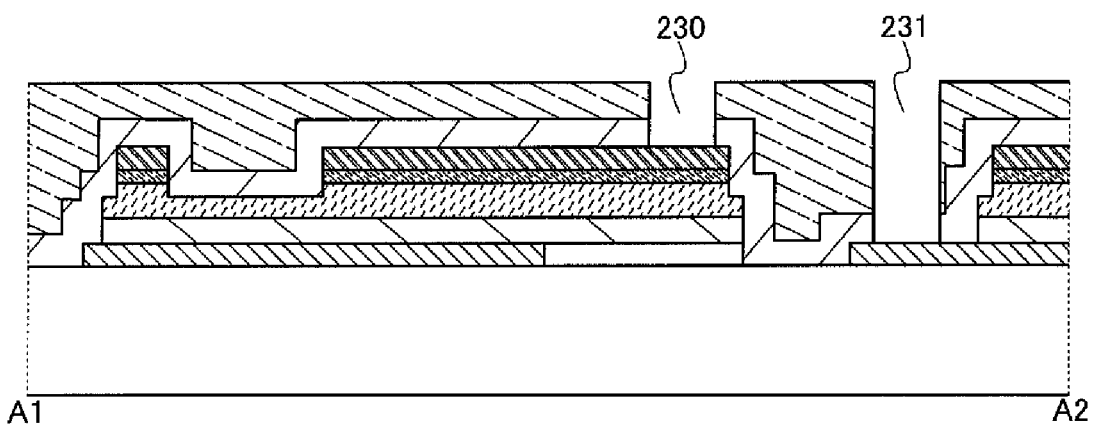

Next, a first opening portion 230 and a second opening portion 231 are formed in the second insulating film (see FIG. 38B and FIG. 51B). The first opening portion 230 is formed so as to reach at least a surface of the source and drain electrode layer. The second opening portion 231 is formed so as to reach at least a surface of the gate electrode layer. The formation method of the first opening portion 230 and the second opening portion 231 is not limited to a particular method and may be determined as appropriate by a practitioner in accordance with the diameter of the first opening portion. 230 or the like. For example, the first opening portion 230 and the second opening portion 231 can be formed by dry etching using photolithography.

The first opening portion 230 is provided so as to reach the source and drain electrode layer 220, and a plurality of first opening portions 230 are provided at places necessarily provided with the first opening portion 230 as illustrated in FIG. 47. A first opening portion 230A is provided on the source and drain electrode layer 220C, a first opening portion 230B is provided on the source and drain electrode layer 220B, and a first opening portion 230C is provided on the source and drain electrode layer 220E.

The second opening portion 231 is provided so as to reach the gate electrode layer 216, and a plurality of second opening portions 231 are provided at places necessarily provided with the second opening portion 231 as illustrated in FIG. 47. In other words, not only the second insulating film but also desired regions of the first insulating film 204 and the semiconductor layer 224 are removed to provide the second opening portion 231. A second opening portion 231A is provided on the gate electrode layer 216B, and a second opening portion 231B is provided on the gate electrode layer 216D.

Note that in the case of forming the opening portions by photolithography, one photomask is used.

Figure 38C:
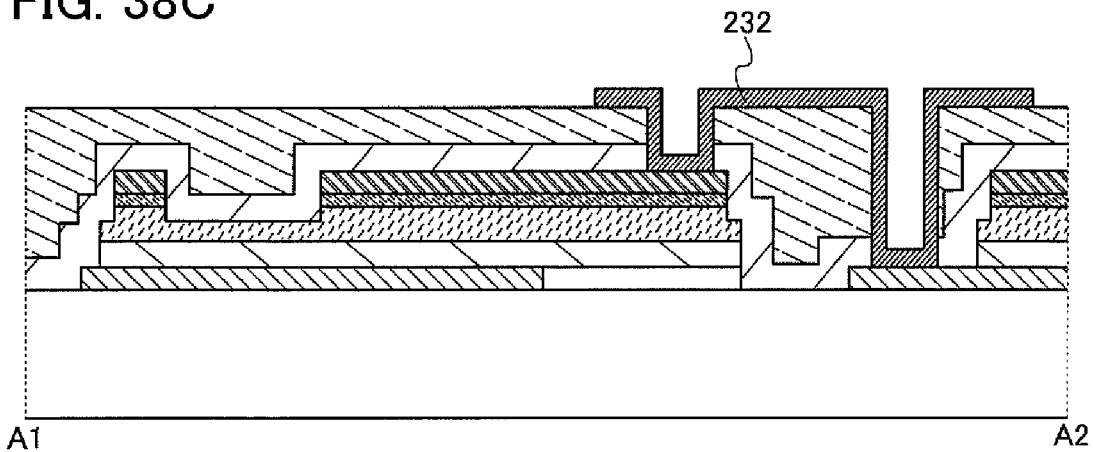

Next, the first pixel electrode layer 232 is formed over the second insulating film (see FIG. 38C, FIG. 51B, and FIG. 47). The first pixel electrode layer 232 is formed so as to be connected to the source and drain electrode layer 220 or the gate electrode layer 216 through the first opening portion 230 or the second opening portion 231, respectively. Specifically, the first pixel electrode layer 232 is formed so as to be connected to the source and drain electrode layer 220C through the first opening portion 230A, the source and drain electrode layer 220B through the first opening portion 230B, the source and drain electrode layer 220E through the first opening portion 230C, the gate electrode layer 216B through the second opening portion 231A, and the gate electrode layer 216D through the second opening portion 231B.

Note that in the case of forming the first pixel electrode layer 232 by photolithography, one photomask is used.

As described above, a transistor that can be applied to a pixel of an EL display device and one of pixel electrodes which is connected to the transistor can be formed. An EL layer is further formed over this pixel electrode to form the other of the pixel electrodes over the EL layer; thus, an EL display device can be manufactured. The steps following this are briefly described below.

Since the thin film transistor included in the pixel is an n-channel transistor, it is preferable to form the first pixel electrode layer 232 using a material which functions as a cathode. As the material which functions as a cathode, a material having a low work function such as Ca, Al, MgAg, AlLi, or the like can be given. Note that an embodiment of the present invention is not limited to these materials. In addition, the first pixel electrode layer 232 may be a single-layer film or a stacked-layer film including a plurality of films.

Next, a partition wall 233 is formed on the side surface (end portion) of the first pixel electrode layer 232 and over the second insulating film (see FIG. 51C). The partition wall 233 has an opening portion, and the first pixel electrode layer 232 is exposed through the opening portion. The partition wall 233 is formed using an organic resin film, an inorganic insulating film, or organic polysiloxane. Specifically, the partition wall 233 may be formed using polyimide, polyamide, polyimide amide, acrylic, or benzocyclobutene-based resin. It is particularly preferable that the partition wall 233 be formed using a photosensitive material to have an opening portion over the first pixel electrode layer 232 and a sidewall of the opening portion have a tilted surface with continuous curvature.

Next, an EL layer 234 is formed to be in contact with the first pixel electrode layer 232 at the opening portion of the partition wall 233 (see FIG. 51C). The EL layer 234 may be a single-layer film or a stacked-layer film including a plurality of layers. The EL layer 234 includes at least a light-emitting layer. It is preferable that the light-emitting layer be connected to a second pixel electrode layer 235 through a hole-transporting layer.

Then, the second pixel electrode layer 235 is formed using a material which functions as an anode, to cover the EL layer (see FIG. 51C). The second pixel electrode layer 235 corresponds to the common electrode 190 in FIG. 34. The second pixel electrode layer 235 can be formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like can be given. The film of the conductive material having a light-transmitting property may be formed by a sputtering method, a CVD method, or the like; however, the formation method is not limited to a particular method. In addition, the second pixel electrode layer 235 may be a single-layer film or a stacked-layer film including a plurality of films.

Here, ITO is used for the second pixel electrode layer 235. In the opening portion of the partition wall 233, the first pixel electrode layer 232, the EL layer 234, and the second pixel electrode layer 235 overlap with one another; accordingly, a light-emitting element 236 is formed. The light-emitting element 236 corresponds to the light-emitting element 185 in FIG. 34. Then, a third protective film (not shown) is preferably formed over the second pixel electrode layer 235 and the partition wall 233 so that oxygen, hydrogen, moisture, carbon dioxide, or the like does not enter the light-emitting element 236. As a material of the third protective film, a material having a function of preventing entry and release of moisture is selected from materials which are similar to those of the first protective film 226. The third protective film is preferably formed using silicon nitride, silicon oxynitride, aluminum oxynitride, aluminum nitride, or the like. Further, a silicon nitride film, a DLC film, or the like is preferably provided to cover the third protective film.

Then, it is preferable to further perform packaging (sealing) with a protective film (e.g., a bonding film or an ultraviolet curing resin film) or a covering material in order to prevent exposure to air. The protective film or the covering material is preferably formed using a material which has low gas-permeability and causes less degassing.

In the above-described manner, a light-emitting element of a top emission EL display device can be formed (see FIG. 51C). However, an EL display device which is an embodiment of the present invention is not limited by the above description and can be a bottom emission EL display device or a dual emission EL display device. In the bottom emission structure or the dual emission structure, the first pixel electrode layer 232 is formed using a conductive material having a light-transmitting property. Note that, in the case where the first pixel electrode layer 232 is formed using a material functioning as an anode, the first pixel electrode layer 232 may be formed using ITO, for example. The use of such a structure for the first pixel electrode layer 232 allows the manufacture of a bottom emission EL display device. In this case, the second pixel electrode layer 235 can be formed using a material functioning as a cathode so as to cover the EL layer 234. The material functioning as the cathode is exemplified by a material with low work function such as Ca, Al, MgAg, and AlLi. Note that the EL layer 234 and the second pixel electrode layer 235 are preferably formed by vapor deposition using a mask. Thus, it is preferable to form the second pixel electrode layer 235 using a material that is capable of forming a film by the vapor deposition.

Note that the materials and the formation methods of the protective film and the like described above are not limited to those described above as long as light emission of the EL layer is not interfered and deterioration and the like can be prevented.

Further, in the top emission structure, a first pixel electrode layer 232A may be formed so as to cover the region where the pixel circuit is formed. In this case, first, only the conductive layers corresponding to a first pixel electrode layer 232B and a first pixel electrode layer 232C are formed, insulating films each having a first opening portion 230B are formed over the conductive layers, and then, the first pixel electrode layer 232A is formed so as to be connected to a source and drain electrode layer 220B through the first opening portions 230B.

By forming the first pixel electrode layer 232A so as to cover the region where the pixel circuit is formed, the light-emitting region can be enlarged and higher definition display can be performed.

Note that although an organic EL element is described here as a light-emitting element, an inorganic EL element can also be used as a light-emitting element.

Note that a terminal connection portion is similar to any of the terminal connection portions described in Embodiment 1.

In the above-described manner, an EL display device can be manufactured.

As described above, an additional photomask is not necessary for patterning a gate electrode layer, so that the number of steps for manufacturing a thin film transistor can be significantly reduced. Since the thin film transistor can be applied to an EL display device, the steps for manufacturing an EL display device can be significantly reduced as well. It is also possible to manufacture a thin film transistor using one photomask (multi-tone mask). Accordingly, the number of steps for manufacturing a thin film transistor or an EL display device can be significantly reduced. Further, since a thin film transistor can be manufactured using one photomask, misalignment can be prevented in aligning a photomask.

In addition, a complicated step using backside light exposure, resist reflow, a lift-off method, or the like is not needed unlike the conventional technique which is aimed at reducing the number of photomasks. Therefore, the number of steps for manufacturing an EL display device can be significantly reduced without reducing yield.

Moreover, the number of steps for manufacturing a thin film transistor can be significantly reduced while electric characteristics of the thin film transistor are maintained. Therefore, the number of steps for manufacturing an EL display device can be significantly reduced without sacrificing display quality of the EL display device or the like.

Further, by the above-described effects, manufacturing cost of a thin film transistor and an EL display device can be significantly reduced.

Further, in a thin film transistor which is an embodiment of the present invention, a large part of a semiconductor layer is light-shielded by a gate electrode layer. In particular, a semiconductor layer included in the thin film transistor is light-shielded by the gate electrode layer. Therefore, a thin film transistor with a small amount of light leakage current can be used, and an EL display device with favorable display quality can be manufactured.

Note that the pixel structure of this embodiment is not limited to the pixel structure described above and can be applied to a variety of EL display devices.

Embodiment 4

Figure 48A:
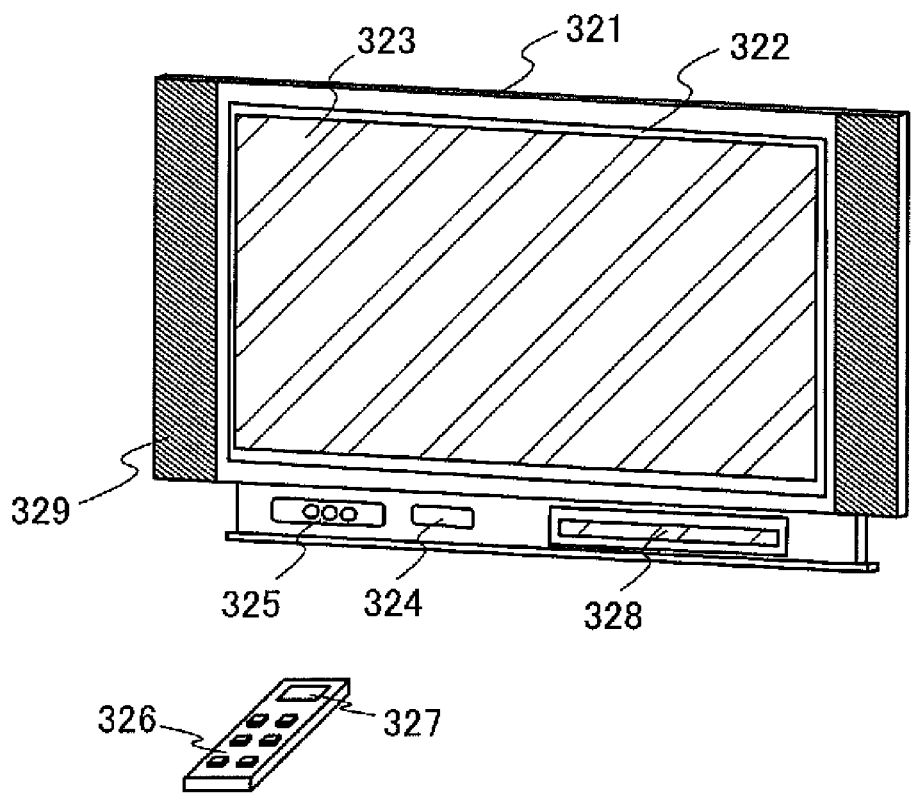
FIGS. 48A and 48B each illustrate an electronic device.
Figure 48B:
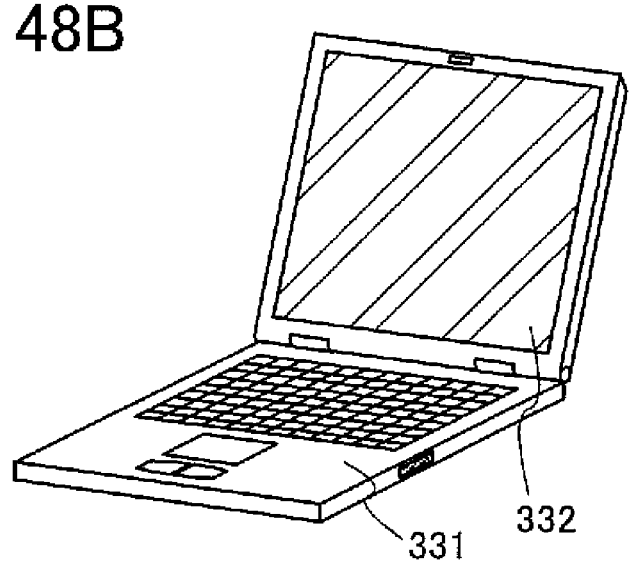

In this embodiment, electronic devices in which a display panel or a display device manufactured by any of the methods described in Embodiments 1 to 3 is incorporated as a display portion will be described with reference to FIGS. 48A and 48B, FIG. 49, and FIGS. 50A to 50C. As such electronic devices, for example, cameras such as video cameras or digital cameras; head mounted displays (goggle type displays); car navigation systems; projectors; car stereos; personal computers; and portable information terminals (such as mobile computers, mobile phones, and e-book readers) can be given. FIGS. 48A and 48B illustrate examples of such electronic devices.

FIG. 48A illustrates a television device. A television device illustrated in FIG. 48A can be completed by incorporating a display panel into a housing. A main screen 323 is formed using the display panel manufactured by any of the manufacturing methods described in Embodiments 1 to 3, and a speaker portion 329, operation switches, and the like are provided as its accessory equipment.

As illustrated in FIG. 48A, a display panel 322 manufactured by any of the manufacturing methods described in Embodiments 1 to 3 is incorporated into a housing 321, and general TV broadcast can be received by a receiver 325. When the television device is connected to a communication network by wired or wireless connections via a modem 324, one-way (from a sender to a receiver) or two-way (between a sender and a receiver or between receivers) information communication can be performed. The television device can be operated using switches incorporated into the housing or by a remote control device 326 provided separately. A display portion 327 which displays output information may be provided for the remote control device 326.

Further, the television device may include a sub screen 328 formed using a second display panel to display channels, volume, or the like, in addition to the main screen 323.

Figure 49:
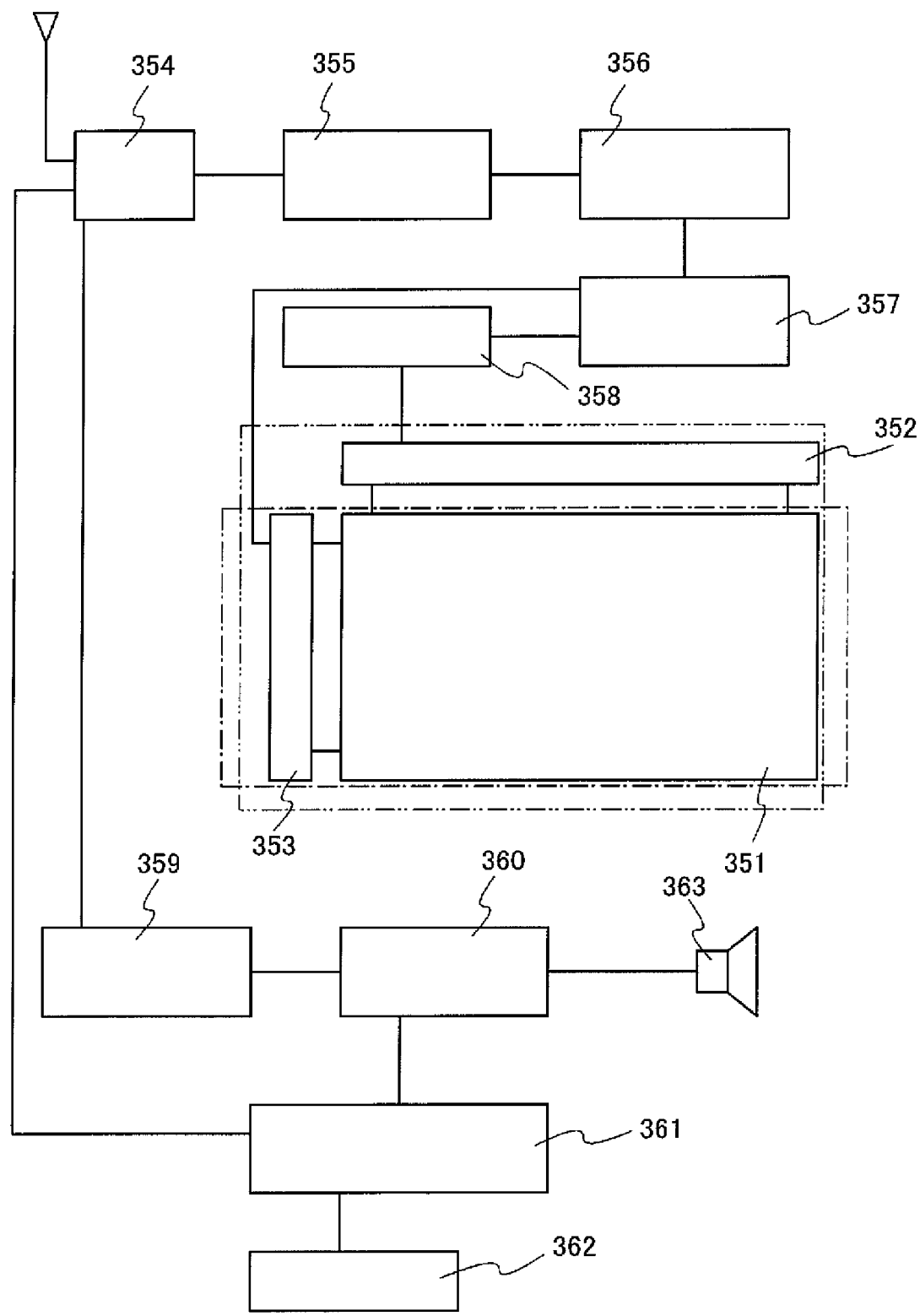
FIG. 49 illustrates an electronic device.

FIG. 49 is a block diagram of a main structure of a television device. A display panel is provided with a pixel portion 351. A signal line driver circuit 352 and a scanning line driver circuit 353 may be mounted on the display panel by a COG method.

As structures of other external circuits, a video signal amplifier circuit 355 amplifying a video signal among signals received by a tuner 354, a video signal processing circuit 356 converting signals output from the video signal amplifier circuit 355 into chrominance signals corresponding to respective colors of red, green, and blue, a control circuit 357 for converting the video signal into a signal which meets input specifications of a driver IC, and the like are provided on an input side of the video signal. The control circuit 357 outputs signals to a scanning line side and a signal line side. In the case of digital drive, a signal dividing circuit 358 may be provided on the signal line side and an input digital signal may be divided into m (m is an integer) pieces and supplied.

Among the signals received by the tuner 354, audio signals are transmitted to an audio signal amplifier circuit 359, and an output thereof is supplied to a speaker 363 through an audio signal processing circuit 360. A control circuit 361 receives control information on receiving station (receiving frequency) and volume from an input portion 362 and transmits signals to the tuner 354 and the audio signal processing circuit 360.

Naturally, the display device which is an embodiment of the present invention is not limited to the television device and can also be applied to a large-size display medium such as an information display board at a train station, an airport, and the like, or an advertisement display board on the street, as well as a monitor of a personal computer. By using the manufacturing method of a display device which is an embodiment of any of the above embodiments, these display mediums can be manufactured with improved productivity.

When the display panel or display device manufactured by any of the manufacturing methods of a display device described in Embodiments 1 to 3 is applied to the main screen 323 and the sub screen 328, television devices can be manufactured with improved productivity.

A mobile computer illustrated in FIG. 48B includes a main body 331, a display portion 332, and the like. When the display panel or display device manufactured by any of the manufacturing methods of a display device described in Embodiments 1 to 3 is applied to the display portion 332, computers can be manufactured with improved productivity.

Figure 50A:
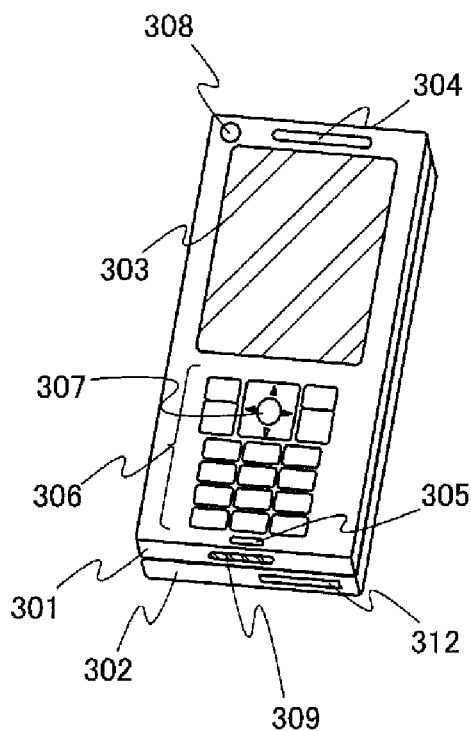
FIGS. 50A to 50C illustrate an electronic device.
Figure 50B:
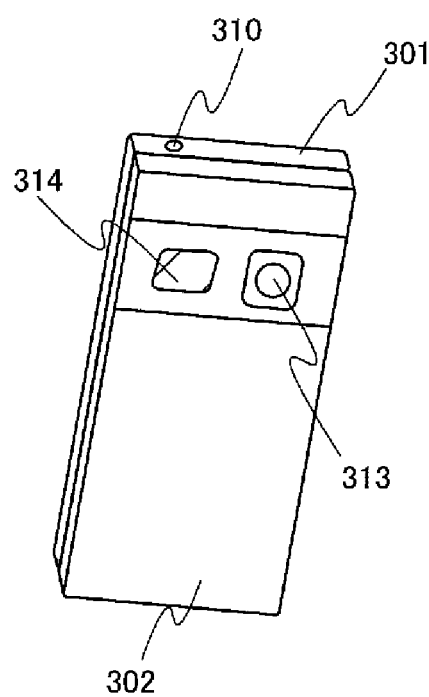
Figure 50C:
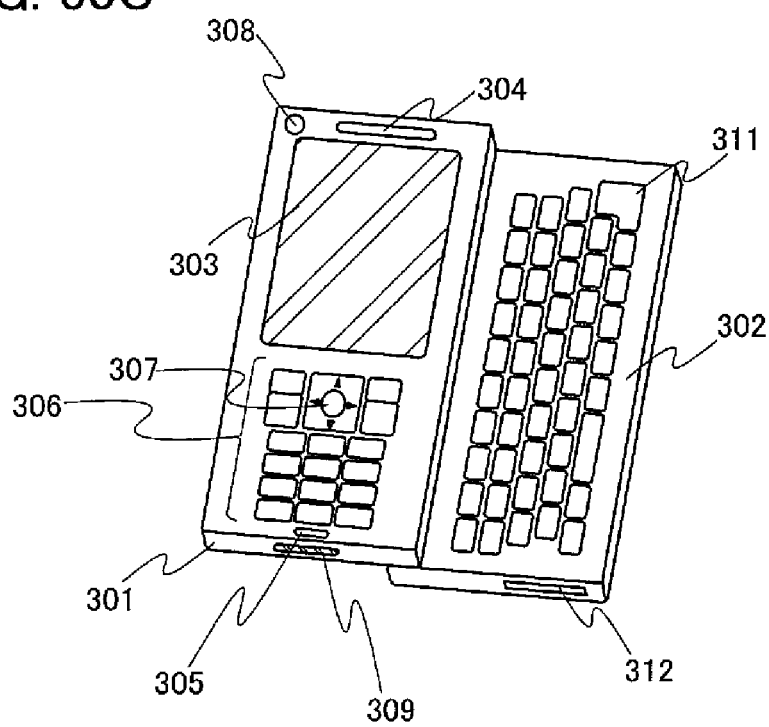

FIGS. 50A to 50C illustrate an example of a mobile phone. FIG. 50A is a front view, FIG. 50B is a rear view, and FIG. 50C is a development view when two housings slide. A mobile phone includes two housings 301 and 302. The mobile phone is a so-called smartphone which has both functions of a mobile phone and a portable information terminal, and incorporates a computer and can process a variety of data processing in addition to voice calls.

The housing 301 includes a display portion 303, a speaker 304, a microphone 305, operation keys 306, a pointing device 307, a front camera lens 308, a jack 309 for an external connection terminal, an earphone terminal 310, and the like, while the housing 302 includes a keyboard 311, an external memory slot 312, a rear camera 313, a light 314, and the like. In addition, an antenna is incorporated in the housing 301.

In addition to the above-described structure, a wireless IC chip, a small size memory device, or the like may be incorporated in the mobile phone.

The housings 301 and 302 which overlap with each other (see FIG. 50A) can be slid, and are developed by being slid as illustrated in FIG. 50C. The display panel or display device manufactured by any of the manufacturing methods of a display device described in Embodiments 1 to 3 can be incorporated in the display portion 303. Since the display portion 303 and the front camera lens 308 are provided in the same plane, the mobile phone can be used as a videophone. Further, a still image and a moving image can be taken with the rear camera 313 and the light 314, using the display portion 303 as a viewfinder.

By using the speaker 304 and the microphone 305, the mobile phone can be used as an audio recording device (sound recorder) or an audio reproducing device. With the use of the operation keys 306, further, operations of incoming and outgoing of calls, simple information input such as electronic mail, scrolling of a screen displayed on the display portion, cursor movement, e.g., for selecting information to be displayed on the display portion, and the like are possible.

If much information is needed to be treated, such as documentation, use as a portable information terminal, and the like, the use of the keyboard 311 is convenient. By sliding the housings 301 and 302 which overlap with each other (FIG. 50A), the housings 301 and 302 can be developed as shown in FIG. 50C. In the case where the mobile phone is used as a portable information terminal, smooth operation can be performed with the keyboard 311 and the pointing device 307. The jack 309 for an external connection terminal can be connected to various cables such as an AC adapter or a USB cable, whereby the mobile phone can be charged or can perform data communication with a personal computer or the like. Moreover, by inserting a recording medium into the external memory slot 312, the mobile phone can deal with storing and moving a large amount of data.

The rear surface of the housing 302 (FIG. 50B) is provided with the rear camera 313 and the light 314, and a still image and a moving image can be taken using the display portion 303 as a viewfinder.

Further, the mobile phone may have an infrared communication function, a USB port, a function of receiving one segment television broadcast, a non-contact IC chip, an earphone jack, or the like, in addition to the above-described functions and structures.

Since various electronic devices described in this embodiment can be manufactured by any of the manufacturing methods of a thin film transistor and a display device described in Embodiments 1 to 3, these electronic devices can be manufactured with improved productivity.

Accordingly, manufacturing cost of these electronic devices can be significantly reduced.

Furthermore, as described in Embodiments 1 to 3, a display device having high display quality can be manufactured.

This application is based on Japanese Patent Application serial No. 2008-157765 filed with Japan Patent Office on Jun. 17, 2008, the entire contents of which are hereby incorporated by reference.

What is claimed is:

1. A manufacturing method of a thin film transistor comprising the steps of:
    forming a first conductive film;
    forming an insulating film over the first conductive film;
    forming a semiconductor film over the insulating film;
    forming an impurity semiconductor film over the semiconductor film;
    forming a second conductive film over the impurity semiconductor film;
    forming a first resist mask over the second conductive film, the first resist mask including a first region, a second region whose thickness is larger than the thickness of the first region, and a third region whose thickness is larger than the thickness of the second region;
    performing first etching on the insulating film, the semiconductor film, the impurity semiconductor film, and the second conductive film using the first resist mask to expose at least a surface of the first conductive film;
    performing second etching in which side-etching is performed on a part of the first conductive film to form a gate electrode layer;
    forming a second resist mask by recessing the first resist mask to expose the second conductive film;
    performing third etching on the insulating film, the semiconductor film, the impurity semiconductor film, and the second conductive film using the second resist mask to remove the insulating film, the semiconductor film, the impurity semiconductor film, and the second conductive film;
    forming a third resist mask by recessing the second resist mask to expose the second conductive film; and
    performing fourth etching on a part of the semiconductor film, the impurity semiconductor film, and the second conductive film using the third resist mask to remove the part of the semiconductor film, the impurity semiconductor film, and the second conductive film, and to form a source electrode layer, a drain electrode layer, a source region and a drain region.

2. The manufacturing method of a thin film transistor according to claim 1, wherein the first resist mask is formed using a four-tone photomask.

3. The manufacturing method of a thin film transistor according to claim 1, wherein the first resist mask is formed using a three-tone photomask and a laser.

4. The manufacturing method of a thin film transistor according to claim 1, wherein dry etching is employed for the first etching, the third etching, and the fourth etching, and wet etching is employed for the second etching.

5. The manufacturing method of a thin film transistor according to claim 1,
    wherein an element region is formed by the first etching, and
    wherein a side surface of the gate electrode layer is formed to be more on the inside than a side surface of the element region by an almost uniform distance by the second etching.

6. A manufacturing method of a display device, wherein a pixel electrode is selectively formed connecting to the source electrode layer and the drain electrode layer of a thin film transistor manufactured by the method according to claim 1.

7. A manufacturing method of a display device comprising the steps of:
    forming a first conductive film;
    forming a first insulating film over the first conductive film;
    forming a semiconductor film over the first insulating film;
    forming an impurity semiconductor film over the semiconductor film;
    forming a second conductive film over the impurity semiconductor film;
    forming a first resist mask over the second conductive film, the first resist mask including a first region, a second region whose thickness is larger than the thickness of the first region, and a third region whose thickness is larger than the thickness of the second region;
    performing first etching on the first insulating film, the semiconductor film, the impurity semiconductor film, and the second conductive film using the first resist mask to expose at least a surface of the first conductive film;
    performing second etching in which side-etching is performed on a part of the first conductive film to form a gate electrode layer;
    forming a second resist mask by recessing the first resist mask to expose the second conductive film;
    performing third etching on the first insulating film, the semiconductor film, the impurity semiconductor film, and the second conductive film using the second resist mask to remove the first insulating film, the semiconductor film, the impurity semiconductor film, and the second conductive film;
    forming a third resist mask by recessing the second resist mask to expose the second conductive film;
    performing fourth etching on a part of the semiconductor film, the impurity semiconductor film, and the second conductive film using the third resist mask to remove the part of the semiconductor film, the impurity semiconductor film, and the second conductive film, and to form a source electrode layer, a drain electrode layer, a source region and a drain region, and to form a thin film transistor;
    removing the third resist mask;
    forming a second insulating film covering the thin film transistor;
    forming an opening portion in the second insulating film to expose a part of the source electrode layer and a part of the drain electrode layer; and
    selectively forming a pixel electrode over the opening portion and the second insulating film.

8. The manufacturing method of a display device according to claim 7, wherein the first resist mask is formed using a four-tone photomask.

9. The manufacturing method of a display device according to claim 7, wherein the first resist mask is formed using a three-tone photomask and a laser.

10. The manufacturing method of a display device according to claim 7, wherein dry etching is employed for the first etching, the third etching, and the fourth etching, and wet etching is employed for the second etching.

11. The manufacturing method of a display device according to claim 7,
    wherein an element region is formed by the first etching, and
    wherein a side surface of the gate electrode layer is formed to be more on the inside than a side surface of the element region by an almost uniform distance by the second etching.

12. The manufacturing method of a display device according to claim 7, wherein the second insulating film is formed by stacking an insulating film formed by a CVD method or a sputtering method and an insulating film formed by a spin coating method.

13. The manufacturing method of a display device according to claim 7, wherein the pixel electrode is formed by photolithography.

14. A manufacturing method of an electronic device comprising the steps of:

forming a first conductive film;

forming a first insulating film over the first conductive film;

forming a semiconductor film over the first insulating film;

forming a second conductive film;

forming a first resist mask over the second conductive film, the first resist mask including a first region, a second region whose thickness is larger than the thickness of the first region, and a third region whose thickness is larger than the thickness of the second region;

performing first etching on the first insulating film, the semiconductor film, and the second conductive film using the first resist mask to expose at least a surface of the first conductive film;

performing second etching in which side-etching is performed on a part of the first conductive film to form a gate electrode layer;

forming a second resist mask by recessing the first resist mask to expose the second conductive film;

performing third etching on the first insulating film, the semiconductor film, and the second conductive film using the second resist mask to remove the first insulating film, the semiconductor film, and the second conductive film;

forming a third resist mask by recessing the second resist mask to expose the second conductive film; and performing fourth etching on a part of the semiconductor film, and the second conductive film using the third resist mask to form a source electrode layer and a drain electrode layer.

15. The manufacturing method of an electronic device according to claim 14, wherein the first resist mask is formed using a four-tone photomask.

16. The manufacturing method of an electronic device according to claim 14, wherein the first resist mask is formed using a three-tone photomask and a laser.

17. The manufacturing method of an electronic device according to claim 14, wherein dry etching is employed for the first etching, the third etching, and the fourth etching, and wet etching is employed for the second etching.

18. The manufacturing method of an electronic device according to claim 14, wherein an element region is formed by the first etching, and wherein a side surface of the gate electrode layer is formed to be more on the inside than a side surface of the element region by an almost uniform distance by the second etching.

19. A manufacturing method of an electronic device according to claim 14, wherein a pixel electrode is selectively formed connecting to the source electrode layer and the drain electrode layer.

* * * * *